(12) United States Patent
Yamada et al.

(10) Patent No.: US 10,193,566 B2
(45) Date of Patent: Jan. 29, 2019

(54) ENCODING/DECODING SYSTEM FOR PARALLEL DATA

(71) Applicant: NIPPON TELEGRAPH AND TELEPHONE CORPORATION, Tokyo (JP)

(72) Inventors: Yoshiaki Yamada, Yokosuka (JP); Mitsuhiro Teshima, Yokosuka (JP); Kei Kitamura, Yokosuka (JP); Kenji Hisadome, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 14/428,084

(22) PCT Filed: Sep. 6, 2013

(86) PCT No.: PCT/JP2013/074097
§ 371 (c)(1),
(2) Date: Mar. 13, 2015

(87) PCT Pub. No.: WO2014/045906
PCT Pub. Date: Mar. 27, 2014

(65) Prior Publication Data
US 2015/0229329 A1 Aug. 13, 2015

(30) Foreign Application Priority Data

Sep. 21, 2012 (JP) ................................ 2012-208001
Feb. 5, 2013 (JP) ................................ 2013-020662

(51) Int. Cl.
*H03M 13/00* (2006.01)
*H03M 13/11* (2006.01)
(Continued)

(52) U.S. Cl.
CPC ..... *H03M 13/1105* (2013.01); *H03M 7/3082* (2013.01); *H03M 7/6023* (2013.01);
(Continued)

(58) Field of Classification Search
CPC .................................................. H03M 13/154
See application file for complete search history.

(56) References Cited

U.S. PATENT DOCUMENTS 6,088,404 A * 7/2000 Jekal .................... H03M 13/25
 375/262
6,161,209 A * 12/2000 Moher .............. H03M 13/2957
 375/262
(Continued)

FOREIGN PATENT DOCUMENTS

JP 2008-167128 A 7/2008
JP 2011-004207 A 1/2011
(Continued)

OTHER PUBLICATIONS

Notice of Allowance, Japanese Patent Application No. 2014-536750, dated Apr. 5, 2016.
(Continued)

*Primary Examiner* — Mujtaba M Chaudry
(74) *Attorney, Agent, or Firm* — Harness, Dickey & Pierce, P.L.C.

(57) ABSTRACT

An object is to enable erasure correction even at the time of a degeneration operation and reduce the number of necessary parallel media through dynamic setting of degree of redundancy. A parallel data encoding/decoding system performs parallel data transmissions using a plurality of lanes from an encoder to a decoder. The encoder encodes products of elements of an encoding vector M of symbols of each lane and a state vector U indicating validity of the symbols, and transmits the state vector U along with a transmission vector
(Continued)

Y obtained through the encoding. The decoder decodes a subset $M_{sub}$ constituted of valid elements of the encoding vector M using a received reception vector Y', the received state vector U, and an erasure vector E indicating whether each element of the transmission vector has been erased in a transmission/reception section.

20 Claims, 26 Drawing Sheets

(51) Int. Cl.
    *H03M 13/15*     (2006.01)
    *H03M 13/35*     (2006.01)
    *H03M 13/37*     (2006.01)
    *H03M 7/30*     (2006.01)

(52) U.S. Cl.
    CPC ..... *H03M 13/1515* (2013.01); *H03M 13/353* (2013.01); *H03M 13/373* (2013.01); *H03M 13/611* (2013.01); *H03M 13/618* (2013.01); *H03M 13/6561* (2013.01)

(56) References Cited

U.S. PATENT DOCUMENTS

| | | | | |
|---|---|---|---|---|
| 6,731,670 | B1* | 5/2004 | Kido | H03K 3/84 375/140 |
| 8,161,429 | B1 | 4/2012 | Chan et al. | |
| 2003/0101401 | A1* | 5/2003 | Salvi | H03M 13/23 714/755 |
| 2003/0140304 | A1* | 7/2003 | Hurt | H03M 13/235 714/786 |
| 2004/0136448 | A1* | 7/2004 | Miller | H04K 1/02 375/222 |
| 2004/0139383 | A1* | 7/2004 | Salvi | H03M 13/23 714/759 |
| 2005/0141603 | A1* | 6/2005 | Miller | H04K 1/02 375/222 |
| 2005/0210363 | A1* | 9/2005 | Cadic | H03M 13/033 714/781 |
| 2010/0322630 | A1 | 12/2010 | Takeuchi et al. | |
| 2011/0173511 | A1 | 7/2011 | Miyata et al. | |
| 2012/0257014 | A1* | 10/2012 | Tsukagoshi | H04N 13/007 348/43 |

FOREIGN PATENT DOCUMENTS

| | | |
|---|---|---|
| JP | 2011-146932 A | 7/2011 |
| JP | 2011-211532 A | 10/2011 |
| JP | 2012-247575 A | 12/2012 |
| WO | WO-2013/093993 A1 | 6/2013 |

OTHER PUBLICATIONS

"Reed-Solomon codes", [online], Wikipedia, Internet<http://ja.wikipedia.org/wiki/%E3%83%AA%E3%83%BC%E3%83%89%E3%83%BB%E3%82%BD%E3%83%AD%E3%83%A2%E3%83%B3%E7%AC%A6%E5%8F%B7> with partial translation.
Shortened Reed-Solomon codes: Ryuichi Ono and one other person, "On Decoding of Binary Expanded Shortened Reed-Solomon Codes", Institute of Electronics, Information and Communication Engineers (IEICE), Technical report of IEICE, IT94-31, pp. 49 to 54, Jul. 1994 ([online], Internet <http://ci.nii.ac.jp/naid/110003197448>) with partial translation.
Cauchy Reed-Solomon codes: J. Blomer, M. Kalfane, R. Karp, M. Karpinski, M. Luby, and D. Zuckerman:"An XOR-based erasure-resilient coding scheme", Technical Report TR-95-048, International Computer Science Institute, Aug. 1995.
MDS codes: Masazumi Kurihara, "MDS codes and their decoding algorithm", Institute of Electronics, Information and Communication Engineers (IEICE), Technical report of IEICE, IT2003-92, ISEC 2003-132, WBS 2003-210, Mar. 2004 ([online], Internet <http://ci.nii.ac.jp/naid/110003174169>) with partial translation.
Vandermonde_matrix, [online], Wikipedia, Internet <http://en.wikipedia.org/wiki/Vandermonde_matrix>.
"HDTV MPEG-2 high-multiplex transmission technology", [online], 2005, Takayuki Ohnishi et al., Nippon Telegraph and Telephone Corporation, Internet <http://www.ntt.co.jp/journal/0507/files/jn200507043.pdf> with partial translation.
"Construction Method and Theoretical Analysis of Packet-Level Low-Density Generator Matrix Codes to Allow Backward Compatibility for Video Streaming", Yoshihide Tonomura and five other persons, Institute of Electronics, Information and Communication Engineers (IEICE) Journal 2010/3, vol. J93-A, No. 3, pp. 212 to 215, 2010 with partial translation.
V. Cerf et al., "Specification of Internet Transmission Control Program",[online], 1974, Internet <http://tools.ietf.org/pdf/rfc675.pdf>.
Albers, S. and Mitzenmacher, M. "Average-Case Analyses of First Fit and Random Fit Bin Packing", Random Structures Alg. 16, 240 to 259, 2000.
V. Paxson et al. "Computing TCP's Retransmission Timer", Nov. 2000 ("http://tools.ietf.org/html/rfc2988").
"Secret sharing system", Nippon Telegraph and Telephone Corporation, 2012 (http://event.ecl.ntt.co.jp/forum2012/info/exhibition/pdf/C-44.pdf) with partial translation.
Yoshiaki Yamada, Kei Kitamura, Kenji Hisadome, Mitsuhiro Teshima, Akira Hirano, "Novel variable coding rate FEC for elastic optical networks and its implementations and evaluations on GPU", Technical Report of IEICE, Mar. 7, 2013 (Mar. 7, 2013), vol. 112, No. 486, pp. 193 to 198, with English abstract.
International Search Report for PCT/JP2013/074097, ISA/JP, dated Nov. 12, 2013 with translation thereof.

* cited by examiner

ENCODING/DECODING SYSTEM FOR PARALLEL DATA

CROSS-REFERENCE TO RELATED APPLICATIONS

This application is a 371 U.S. National Stage of International Application No. PCT/JP2013/074097, filed on Sep. 6, 2013, which claims priority to Japanese Patent Applications No. 2012-208001, filed on Sep. 21, 2012 and No. 2013-020662, filed on Feb. 5, 2013. The entire disclosures of the above applications are incorporated herein by reference.

TECHNICAL FIELD

The present invention relates to data encoding and decoding schemes for improving robustness against erasure of data due to damage of a medium and/or an uncorrected error when parallel connections are established between a data encoding end and a data decoding end using a plurality of physical or logical media.

In addition, the present invention relates to a redundant packet transmission system and a redundant packet transmission method for correcting packet erasure in packet transmission.

BACKGROUND ART

There are two major courses of actions in relation to improvement of robustness against data erasure in a plurality of media. One is a method for maintaining an information transmission band at 100% without instantaneous interruption by forming redundant media, transmitting information, and performing switching to a redundant medium if a failure occurs in a specific medium as shown in Patent Document 1. The other is a method for enabling a degeneration operation using the remaining media if a failure occurs in part of media as shown in Patent Document 2.

When a moving picture is transmitted in packets as in Moving Picture Experts Group Phase 2 (MPEG 2) over Internet protocol (IP), redundant transmission using forward error correction (FEC) is used because of the requirement of a real-time property (e.g., see Non-Patent Documents 6 and 7).

In addition, a transmission control protocol (TCP) achieves high reliability by retransmitting a loss packet (e.g., see Non-Patent Document 8).

PRIOR ART DOCUMENTS

Patent Documents

Patent Document 1: Japanese Unexamined Patent Application, First Publication No. 2008-167128
Patent Document 2: Japanese Unexamined Patent Application, First Publication No. 2011-211532

Non-Patent Documents

Non-Patent Document 1: "Reed-Solomon codes", [online], Wikipedia, Internet <http://ja.wikipedia.org/wiki/%E3%83%AA%E3%83%BC%E3%83%89%E3%83%BB%E3%82%BD%E3%83%AD%E3%83%A2%E3%83%B3%E7%AC%A6%E5%8F%B7>
Non-Patent Document 2: Shortened Reed-Solomon codes: Ryuichi Ono and one other person, "On Decoding of Binary Expanded Shortened Reed-Solomon Codes", Institute of Electronics, Information and Communication Engineers (IEICE), Technical report of IEICE, IT94-31, pp. 49 to 54, July 1994 ([online], Internet <http://ci.nii.ac.jp/naid/110003197448>)
Non-Patent Document 3: Cauchy Reed-Solomon codes: J. Blomer, M. Kalfane, R. Karp, M. Karpinski, M. Luby, and D. Zuckerman: "An XOR-based erasure-resilient coding scheme", Technical Report TR-95-048, International Computer Science Institute, August 1995.
Non-Patent Document 4: MDS codes: Masazumi Kurihara, "MDS codes and their decoding algorithm", Institute of Electronics, Information and Communication Engineers (IEICE), Technical report of IEICE, IT2003-92, ISEC 2003-132, WBS 2003-210, March 2004 ([online], Internet <http://ci.nii.ac.jp/naid/110003174169>)
Non-Patent Document 5: Vandermonde_matrix, [online], Wikipedia, Internet <http://en.wikipedia.org/wiki/Vandermonde_matrix>
Non-Patent Document 6: "HDTV MPEG-2 high-multiplex transmission technology", [online], 2005, Nippon Telegraph and Telephone Corporation, Internet <http://www.ntt.co.jp/journal/0507/files/jn200507043.pdf>
Non-Patent Document 7: "Construction Method and Theoretical Analysis of Packet-Level Low-Density Generator Matrix Codes to Allow Backward Compatibility for Video Streaming", Yoshihide Tonomura and five other persons, Institute of Electronics, Information and Communication Engineers (IEICE) Journal 20103, Vol. J93-A, No. 3, pp. 212 to 215, 2010
Non-Patent Document 8: "SPECIFICATION OF INTERNET TRANSMISSION CONTROL PROGRAM", [online], 1974, Internet <http://tools.ietf.org/pdf/rfc675.pdf>

SUMMARY OF INVENTION

Problems to be Solved by the Invention

In FEC used for packet transmission in Non-Patent Document 6, Non-Patent Document 7, or the like, when a block of a fixed length is filled with input data, parity of the FEC is calculated and a redundant packet is sent. Accordingly, although a packet is output at a given interval for an input of a fixed rate such as a moving picture, an excessive delay is likely to occur for an input of a variable rate or a burst arrival. For example, in the case of an FEC having a block size of 100, even when data having a size of 99 is input, a redundant packet is not sent until remaining data having a size of 1 is input. Accordingly, a maximum delay time is inversely proportional to a transfer rate in the case of the variable rate, and a maximum delay time is not ensured in relation to a burst input when a separate timeout mechanism is not used.

In addition, a reliability improvement method by retransmission of a loss packet achieved by TCP as disclosed in Non-Patent Document 8 is not appropriate for applications in which a real-time property is required due to a reason such as a retransmission delay in long distance communication of an international circuit or the like or degradation of a transfer rate due to congestion control.

An object of the present invention is to enable erasure correction even at the time of a degeneration operation through dynamic setting of the degree of redundancy and reduce the number of necessary parallel media by using a band (physical band information band) which is not subjected to information transmission in redundancy.

In addition, in order to solve the above-described problems, the present invention provides a redundant packet transmission system and a redundant packet transmission method capable of performing packet erasure correction by packet redundancy without causing an excessive delay even for a packet input of a variable rate or a burst arrival.

Means for Solving the Problems

The present invention is a parallel data encoding/decoding system which performs parallel data transmission from an encoder to a decoder using a plurality of lanes, wherein the encoder encodes products of elements of an encoding vector M of symbols of each lane and a state vector U indicating validity of the symbols and transmits the state vector U along with a transmission vector Y obtained by encoding, and the decoder decodes a subset $M_{sub}$ constituted of a valid element of the encoding vector M using a received reception vector Y', the received state vector U, and an erasure vector E indicating whether each element of the transmission vector Y has been erased in a transmission/reception section.

In the Description of the present application, a binary operator symbol represented by Expression 1 of a vector X and a vector Y is defined as a product of elements of the vectors.

[Expression 1]

Binary Operator Symbol ◯

For example, in the case of Expression 2, a vector Z of a product of elements of the vector X and the vector Y is represented by Expression 3.

$$X=\{x_0,x_1,x_2,\ldots,x_{n-1}\}, Y=\{y_0,y_1,y_2,\ldots,y_{n-1}\}$$ [Expression 2]

$$Z=X \bigcirc Y=\{x_0 y_0, x_1 y_1, x_2 y_2, \ldots, x_{n-1} y_{n-1}\}$$ [Expression 3]

In the parallel data encoding/decoding system of the present invention, the encoder and the decoder may be connected by R lanes, the encoder may calculate parity S for the products of the elements of the encoding vector M of R symbols and the state vector U of R bits in which validity and invalidity of each element are indicated by codes "1" and "0", respectively, and transmit the state vector U along with the transmission vector Y defined by the parity S using a generator matrix G of a maximum-distance-separable (MDS) code of a coding rate of 0.5 having erasure correction capability of R symbols, and the decoder may decode the subset $M_{sub}$ constituted of the valid element of the encoding vector M by solving Formula (M1) using the received reception vector Y', the received state vector U, and the erasure vector E indicating erasure and reception of each element of the transmission vector Y in the transmission/reception section by codes "1" and "0", respectively, and perform erasure correction.

[Expression 4]

$$(M \bigcirc U) A_R + (S \bigcirc E) I = Y'$$ Formula (M1)

where $$M=\{m_0,m_1,m_2,\ldots,m_{R-1}|m_i \in GF(2^n)\}$$

$$U=\{u_0,u_1,u_2,\ldots,u_{R-1}|u_i \in \{0,1\}\}$$

$$M \bigcirc U=\{m_0 u_0, m_1 u_1, m_2 u_2, \ldots, m_{R-1} u_{R-1}|m_i \in M, u_i \in U\}$$

$$G=\{I_R|A_R\}$$

$$S=(M \bigcirc U) A_R$$

$$Y=S$$

$$E=\{e_0,e_1,e_2,\ldots,e_{R-1}|e_i \in \{0,1\}\}$$

$$M_{sub}=\{m_i \in M|u_i=1, u_i \in U\}$$ [Expression 5]

In the parallel data encoding/decoding system of the present invention, the encoder and the decoder may be connected by R lanes, the encoder may calculate parity S for the products of the elements of the encoding vector M of R symbols and the state vector U of R bits in which validity and invalidity of each element are indicated by codes "1" and "0", respectively, using a generator matrix G of an MDS code of a coding rate of 0.5 having erasure correction capability of R symbols and transmit the state vector U along with the transmission vector Y defined by the encoding vector M, the state vector U, and the parity S, and the decoder may decode the subset $M_{sub}$ constituted of the valid element of the encoding vector M by solving Formula (M2) using the received reception vector Y', the received state vector U, the erasure vector E indicating erasure and reception of each element of the transmission vector Y in the transmission/reception section by codes "1" and "0", respectively, and a matrix $B_R(U)$ constituted of a row corresponding to $u_j=1$, where $u_j \in U$, of a matrix $A_R$ and a row corresponding to $u_j=0$, where $u_j \in U$, of a unit matrix I, and perform erasure correction.

[Expression 6]

$$(Y \bigcirc E) B_R + (S \bigcirc U) I = Y' B_R$$ Formula (M2)

where $$M=\{m_0,m_1,m_2,\ldots,m_{R-1}|m_i \in GF(2^n)\}$$

$$U=\{u_0,u_1,u_2,\ldots,u_{R-1}|u_i \in \{0,1\}\}$$

$$M \bigcirc U=\{m_0 u_0, m_1 u_1, m_2 u_2, \ldots, m_{R-1} u_{R-1}|m_i \in M, u_i \in U\}$$

$$G=\{I_R|A_R\}$$

$$S=(M \bigcirc U) A_R$$

$$Y=M \bigcirc U + S \bigcirc \overline{U}$$

$$E=\{e_0,e_1,e_2,\ldots,e_{R-1}|e_i \in \{0,1\}\}$$

$$M_{sub}=\{m_i \in M|u_i=1, u_i \in U\}$$ [Expression 7]

In the parallel data encoding/decoding system of the present invention, the encoder and the decoder may be connected by R lanes, the encoder may calculate parity S using the encoding vector M of R symbols, the state vector U of R bits in which validity and invalidity of each element are indicated by codes "1" and "0", respectively, and a Cauchy matrix $C_{R \times R}$ of R rows and R columns constituted of elements of $GF(2^n)$ and transmit the state vector U along with the transmission vector Y defined by the parity S, and the decoder may decode the subset $M_{sub}$ constituted of the valid element of the encoding vector M by solving Formula (M3) using the received reception vector Y', the received state vector U, and the erasure vector E indicating erasure and reception of each element of the transmission vector Y in the transmission/reception section by codes "1" and "0", respectively, and perform erasure correction.

[Expression 8]

$$(M \odot U)C_{R \times R} + (S \odot E)I = Y \quad \text{Formula (M3)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$S = (M \odot U)C_{R \times R}$$

$$Y = S$$

$$E = \{e_0, e_1, e_2, \ldots, e_{R-1} | e_i \in \{0,1\}\}$$

$$M_{sub} = \{m_i \in M | u_i = 1, u_i \in U\} \quad \text{[Expression 9]}$$

In the parallel data encoding/decoding system of the present invention, the encoder and the decoder may be connected by R lanes, the encoder may calculate parity S using the encoding vector M of R symbols, the state vector U of R bits in which validity and invalidity of each element are indicated by codes "1" and "0", respectively, and a Cauchy matrix $C_{R \times R}$ of R rows and R columns constituted of elements of $GF(2^n)$ and transmit the state vector U along with a transmission vector Y defined by the encoding vector M, the state vector U, and the parity S, and the decoder may decode the subset $M_{sub}$ constituted of the valid element of the encoding vector M by solving Formula (M4) using the received reception vector Y', the received state vector U, the erasure vector E indicating erasure and reception of the elements of the transmission vector Y in the transmission/reception section by codes "1" and "0", respectively, and a matrix $D_R(U)$ constituted of a row corresponding to $u_j=1$, where $u_j \in U$, of $C_{R \times R}$ and a row corresponding to $u_j=0$, where $u_j \in U$, of a unit matrix I, and perform erasure correction.

[Expression 10]

$$(Y \odot E)D_R + S \odot U)I = Y'D_R \quad \text{Formula (M4)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$S = (M \odot U)C_{R \times R}$$

$$Y = M \odot U + S \odot \overline{U}$$

$$E = \{e_0, e_1, e_2, \ldots, e_{R-1} | e_i \in \{0,1\}\}$$

$$M_{sub} = \{m_i \in M | u_i = 1, u_i \in U\} \quad \text{[Expression 11]}$$

In the parallel data encoding/decoding system of the present invention, the encoder and the decoder may be connected by R lanes, the encoder may calculate a coefficient vector P of a remainder polynomial of R symbols in a shortened code$_{shortened}$ RS(2R, R) of a Reed-Solomon code RS(N, K); R in a generating polynomial g(X) for the products of the elements of the encoding vector M of R symbols and the state vector U of R bits in which validity and invalidity of each element are indicated by codes "1" and "0", respectively, and transmit the state vector U along with the transmission vector Y defined by P, and the decoder may decode the subset $M_{sub}$ constituted of the valid element of the encoding vector M by solving Formula (M5) using the received reception vector Y', the received state vector U, the erasure vector E indicating erasure and reception of each element of the transmission vector Y in the transmission/reception section by codes "1" and "0", respectively, a Vandermonde matrix $V_R(k)$, and a Vandermonde matrix $W_R(k)$, and perform erasure correction.

[Expression 12]

$$(M \odot U)W_R(k) + (P \odot E)V_R(k) = Y'V_R(k) \quad \text{Formula (M5)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$g(X) = \Pi_{i=\{k,k+1,k+2,\ldots k+R-1\}}(X - \alpha_i)$$

$$RS(N,K); R = N-K, N = 2^n - 1$$

$$P = \{p_0, p_1, p_2, \ldots, p_{R-1}\}$$

$$Y = P$$

$$E = \{e_0, e_1, e_2, \ldots, e_{R-1} | e_i \in \{0,1\}\}$$

$$V_R(k) = \{v_{j,i} = \alpha_{i+k}{}^j | i,j = \{0,1,\ldots,R-1\}\}$$

$$W_R(k) = \{w_{j,i} = \alpha_{i+k}{}^{j+R} | i,j = \{0,1,\ldots,R-1\}\}$$

$$M_{sub} = \{m_i \in M | u_i = 1, u_i \in U\} \quad \text{[Expression 13]}$$

In the parallel data encoding/decoding system of the present invention, the encoder and the decoder may be connected by R lanes, the encoder may calculate a coefficient vector P of a remainder polynomial of R symbols in a shortened code$_{shortened}$ RS(2R, R) of a Reed-Solomon code RS(N, K); R in a generating polynomial g(X) for the products of the elements of the encoding vector M of R symbols and the state vector U of R bits in which validity and invalidity of each element are indicated by codes "1" and "0", respectively, and transmit the state vector U along with the transmission vector Y defined by the encoding vector M, the state vector U, and the coefficient vector P, and the decoder may decode the subset $M_{sub}$ constituted of the valid element of the encoding vector M by solving Formula (M6) using the received reception vector Y', the received state vector U, the erasure vector E indicating erasure and reception of each element of the transmission vector Y in the transmission/reception section by codes "1" and "0", respectively, and a matrix $Z_R(U)$ constituted of a matrix corresponding to $u_j=1$, where $u_j \in U$, of a Vandermonde matrix $W_R(k)$ and a row corresponding to $u_j=0$, where $u_j \in U$, of a Vandermonde matrix $V_R(k)$, and perform erasure correction.

[Expression 14]

$$(Y \odot E)Z_R + (P \odot U)V_R = Y'Z_R \quad \text{Formula (M6)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$g(X) = \Pi_{i=\{k,k+1,k+2,\ldots k+R-1\}}(X - \alpha_i)$$

$$RS(N,K); R = N-K, N = 2^n - 1$$

$P=\{p_0,p_1,p_2,\ldots,p_{R-1}\}$ $Y=M\bigcirc U+P\bigcirc \overline{U}$ $E=\{e_0,e_1,e_2,\ldots,e_{R-1}|e_i\in\{0,1\}\}$ $W_R(k)=\{w_{j,i}=\alpha_{i+k}^{j+R}|i,j=\{0,1,\ldots,R-1\}\}$ $V_R(k)=\{v_{j,i}=\alpha_{i+k}^{j}|i,j=\{0,1,\ldots,R-1\}\}$ $M_{sub}=\{m_i\in M|u_i=1, u_i\in U\}$ [Expression 15]

In the parallel data encoding/decoding system of the present invention, the encoder and the decoder may be connected by R lanes, the encoder may calculate a coefficient vector P of a remainder polynomial of R symbols in a shortened code$_{shortened}$ RS(2R, R) of a Reed-Solomon code RS(N, K); R in a generating polynomial g(X), a Vandermonde matrix $V_R$(k), a Vandermonde matrix $W_R$(k), and parity S for the products of the elements of the encoding vector M of R symbols and the state vector U of R bits in which validity and invalidity of each element are indicated by codes "1" and "0", respectively, and transmit the state vector U along with the transmission vector Y defined by the parity S, and the decoder may decode the subset $M_{sub}$ constituted of the valid element of the encoding vector M by solving Formula (M7) using the received reception vector Y', the received state vector U, and the erasure vector E indicating erasure and reception of each element of the transmission vector Y in the transmission/reception section by codes "1" and "0", respectively, and perform erasure correction.

[Expression 16]

$(M\bigcirc U)W_R(k)+(S\bigcirc E)I=Y'$ Formula (M7)

where $M=\{m_0,m_1,m_2,\ldots,m_{R-1}|m_i\in GF(2^n)\}$ $U=\{u_0,u_1,u_2,\ldots,u_{R-1}|u_i\in\{0,1\}\}$ $M\bigcirc U=\{m_0u_0,m_1u_1,m_2u_2,\ldots,m_{R-1}u_{R-1}|m_i\in M, u_i\in U\}$ $g(X)=\Pi_{i=\{k,k+1,k+2,\ldots k+R-1\}}(X-\alpha_i)$ $RS(N,K); R=N-K, N=2^n-1$ $P=\{p_0,p_1,p_2,\ldots,p_{R-1}\}$ $V_R(k)=\{v_{j,i}=\alpha_{i+k}^{j}|i,j=\{0,1,\ldots,R-1\}\}$ $W_R(k)=\{w_{j,i}=\alpha_{i+k}^{j+R}|i,j=\{0,1,\ldots,R-1\}\}$ $S=PV_R(k)$ $Y=S$ $E=\{e_0,e_1,e_2,\ldots,e_{R-1}|e_i\in\{0,1\}\}$ $M_{sub}=\{m_i\in M|u_i=1, u_i\in U\}$ [Expression 17]

In the parallel data encoding/decoding system of the present invention, the encoder and the decoder may be connected by R lanes, the encoder may calculate a coefficient vector P of a remainder polynomial of R symbols in a shortened code$_{shortened}$ RS(2R, R) of a Reed-Solomon code RS(N, K); R in a generating polynomial g(X) for the products of the elements of the encoding vector M of R symbols and the state vector U of R bits in which validity and invalidity of each element are indicated by codes "1" and "0", respectively, a Vandermonde matrix $V_R$(k), a Vandermonde matrix $W_R$(k), and parity S, and transmit the state vector U along with the transmission vector Y defined by the encoding vector M, the state vector U, and the parity S, and the decoder may decode the subset $M_{sub}$ constituted of the valid element of the encoding vector M by solving Formula (M8) using the received reception vector Y', the received state vector U, the erasure vector E indicating erasure and reception of each element of the transmission vector Y in the transmission/reception section by codes "1" and "0", respectively, and a matrix $Z_R'$(U) constituted of a matrix corresponding to $u_j=1$, where $u_j\in U$, of the Vandermonde matrix $W_R$(k) and a row corresponding to $u_j=0$, where $u_j\in U$, of a unit matrix I, and perform erasure correction.

[Expression 18]

$(Y\bigcirc E)Z_R'(U)+(S\bigcirc U)I=Y'Z_R'(U)$ Formula (M8)

where $M=\{m_0,m_1,m_2,\ldots,m_{R-1}|m_i\in GF(2^n)\}$ $U=\{u_0,u_1,u_2,\ldots,u_{R-1}|u_i\in\{0,1\}\}$ $M\bigcirc U=\{m_0u_0,m_1u_1,m_2u_2,\ldots,m_{R-1}u_{R-1}|m_i\in M, u_i\in U\}$ $g(X)=\Pi_{i=\{k,k+1,k+2,\ldots k+R-1\}}(X-\alpha_i)$ $RS(N,K); R=N-K, N=2^n-1$ $P=\{p_0,p_1,p_2,\ldots,p_{R-1}\}$ $V_R(k)=\{v_{j,i}=\alpha_{i+k}^{j}|i,j=\{0,1,\ldots,R-1\}\}$ $W_R(k)=\{w_{j,i}=\alpha_{i+k}^{j+R}|i,j=\{0,1,\ldots,R-1\}\}$ $S=PV_R(k)$ $Y=M\bigcirc U+S\bigcirc \overline{U}$ $E=\{e_0,e_1,e_2,\ldots,e_{R-1}|e_i\in\{0,1\}\}$ $M_{sub}=\{m_i\in M|u_i=1, u_i\in U\}$ [Expression 19]

In the parallel data encoding/decoding system of the present invention, the plurality of lanes may form a parallel bus constituted of R logical lanes, the encoder may write an input Din for the parallel bus to input FIFOs independently provided for elements, the encoder may generate a read signal F of R-bits in which each element indicates reading and reading stop of one symbol by "1" and "0", respectively, designate outputs of the input FIFOs as the encoding vector M, designate the read signal F as the state vector U, and transmit the state vector U along with the transmission vector Y, and the decoder may write the subset $M_{sub}$ obtained by calculation to output FIFOs independently provided for elements and read an output Dout for the parallel bus from the output FIFOs.

In the parallel data encoding/decoding system of the present invention, the encoder and the decoder may perform parallel packet transmission using R logical lanes, the encoder may perform writing to input FIFOs independently provided for the logical lanes, the encoder may generate a read signal F of R-bits in which each element indicates reading and reading stop of one symbol by "1" and "0", respectively, designate outputs of the input FIFOs as the encoding vector M, designate the read signal F as the state vector U, and transmit the state vector U along with the transmission vector Y, and the decoder may write the subset $M_{sub}$ obtained by calculation to output FIFOs independently provided for the logical lanes and read packets for the logical lanes from the output FIFOs.

In the parallel data encoding/decoding system of the present invention, the encoder may set a minimum value $r_{min}$ and a maximum value $r_{max}$ of degree of redundancy which satisfies $0 \leq r_{min} \leq r_{max} \leq R$, the encoder may generate the read signal F in accordance with Formula (M111), select a symbol, the number of which is indicated by Formula (M112), from the transmission vector Y, transmit only the selected symbol to a corresponding logical transmission lane, and determine a non-selected symbol as erasure, and the decoder may perform erasure correction in relation to the non-selected symbol and an erasure symbol in transmission.

[Expression 20]

$$F = \{f_0, f_1, f_2, \ldots, f_{R-1} | \Sigma_{i=0}^{R-1} f_i \leq R - r_{min}, f_i \in \{0,1\}\} \quad \text{Formula (M111)}$$

$$\min(R, r_{max} + \Sigma_{i=0}^{R-1} f_i) \quad \text{Formula (M112)}$$

In the parallel data encoding/decoding system of the present invention, the encoder and the decoder may cause a physical transmission lane corresponding to a logical transmission lane of the non-selected symbol to transition to a low power consumption mode, the encoder and the decoder may stop supply power for the physical transmission lane, or the encoder and the decoder may physically exclude the physical transmission lane.

In the parallel data encoding/decoding system of the present invention, the encoder may add an error correction code or an error detection code to a time series block of elements of the transmission vector Y for each logical transmission lane and transmit the time series block to the logical transmission lanes, and for each logical transmission lane, the decoder may designate a reception block as an element of the reception vector Y' without change if an error is not detected from the time series block, designate a reception block after correction as the element of the reception vector Y' if a correctable error is detected from the time series block, and determine the reception block as loss and perform erasure correction if an uncorrected error is detected from the time series block.

In the present invention, the parallel data encoding/decoding system may be a parallel transmission system which generate OTU frames for the lanes, transmit externally input data to be transmitted to parallel transmission media, extract the data to be transmitted from the OTU frames transmitted through the plurality of lanes, and externally output the extracted data to be transmitted, the plurality of lanes may be classified into a symbol lane and a parity lane, for the symbol lane, the encoder may store divided data to be transmitted in an OPU/ODU payload and transmit an OTU frame conforming to ITU-T G.709, and, for the parity lane, the encoder designate symbols of the same row and the same column of each symbol lane as valid elements, store a corresponding element of the transmission vector obtained through the encoding in a region other than FAS and FEC, store values conforming to ITU-T G.709 in regions of the FAS and FEC, and perform transmission, and for an OTU frame included in a symbol lane in which reception has been performed normally among the OTU frames transmitted through the plurality of lanes, the decoder may extract the data to be transmitted included in the OPU/ODU payload and externally output the extracted data to be transmitted, and, for a symbol lane in which abnormality is detected by detection of LOF, detection of an error correction limit by the FEC, or error detection by BIP, the decoder may restore the OPU/ODU payload included in the symbol lane in which the abnormality is detected through erasure correction, extract the data to be transmitted, and externally output the extracted data to be transmitted.

In the parallel data encoding/decoding system of the present invention, the symbol lane may be identified by referring to a value of a PSI defined in ITU-T G.709.

In the parallel data encoding/decoding system of the present invention, in relation to a region A of part of an OH region defined in ITU-T G.709 within each parity lane, the encoder may store a transmission vector corresponding to the region A in an OH region B within the same parity lane and store a value conforming to ITU-T G.709 in the region A, and the decoder may use information of the OH region B in each parity lane for restoration of the region A when restoring the OPU/ODU payload included in the symbol lane in which the abnormality is detected.

In the parallel data encoding/decoding system of the present invention, the region A may include at least an MFAS and a PSI defined in ITU-T G.709, the encoder may transmit information of positions of the region A and the OH region B in a frame through multi-frame transfer using the MFAS, and the decoder may use the information of the positions in the frame when the OPU/ODU payload included in the symbol lane in which the abnormality is detected is restored.

The parallel data encoding/decoding system of the present invention may further include: a packet input unit which divides a packet to be transmitted into portions each having a predetermined length or divides the packet to be transmitted into time slots for every fixed time, further distributes/divides the packet to be transmitted within the same time slot into systems equal in number to parallel inputs of the encoder, and inputs distributed/divided packets to the encoder; an encoded packet output unit which performs encapsulation on an output of the encoder so that a lane and a time slot are identified and separated for each logical lane and outputs an encapsulated packet to one or more transmission media; an encoded packet input unit which separates the encapsulated packet transmitted through the transmission media for each logical lane based on encapsulation information, aligns the separated encapsulated packet for each time slot in each lane, and inputs the separated/aligned encapsulated packet to the decoder; and a packet output unit which reconfigures the packet to be transmitted from an output of the decoder and outputs the packet to be transmitted.

In the parallel data encoding/decoding system of the present invention, the packet input unit may optimize distribution of the packet input to the encoder so as to maximize the number of logical lanes on which there is no packet.

In the parallel data encoding/decoding system of the present invention, if a packet length of the packet to be transmitted is greater than a data length of one time slot, the packet input unit may divide the packet to be transmitted into packets each having a length less than or equal to the data length of the one time slot, and distribute the divided packets to the plurality of lanes.

In the parallel data encoding/decoding system of the present invention, the packet input unit may allocate the packet to another time slot different from a time slot in which the packet is to be allocated so that the number of lanes in which there is no packet is at least minimum redundancy $r_{min}$, and the encoded packet output unit may limit the number of redundant packets among packets output from the encoder to at most maximum redundancy $r_{max}$.

It is to be noted that the above-described aspects of the present invention can be combined where possible.

Advantageous Effects of the Invention

In accordance with the present invention, it is possible to enable erasure correction even at the time of a degeneration operation through dynamic setting of the degree of redundancy. In addition, it is possible to reduce the number of necessary parallel media by using a band (physical band— information band) that is not subjected to information transmission in redundancy.

In addition, a coding scheme of the present invention is configured based on an MDS code. A code length in the present scheme is equal to the number of parallel media, it is practically in the order of several tens at most, and it is a range in which calculation is sufficiently possible using the MDS code. When the same code length (block length) is used, the erasure correction capability of the MDS code is higher than that of a low density parity check (LDPC) code. In addition, with respect to whether correction is possible when the number of losses within a block is found, the MDS code provides a deterministic guarantee but the LDPC provides a stochastic (expected value) guarantee. Therefore, the LDPC is unfit for applications for improving robustness.

In addition, in accordance with the present invention, it is possible to correct packet erasure by packet redundancy without causing an excessive delay even for a packet input of a variable rate or a burst arrival.

MODES FOR CARRYING OUT THE INVENTION

Figure 1:
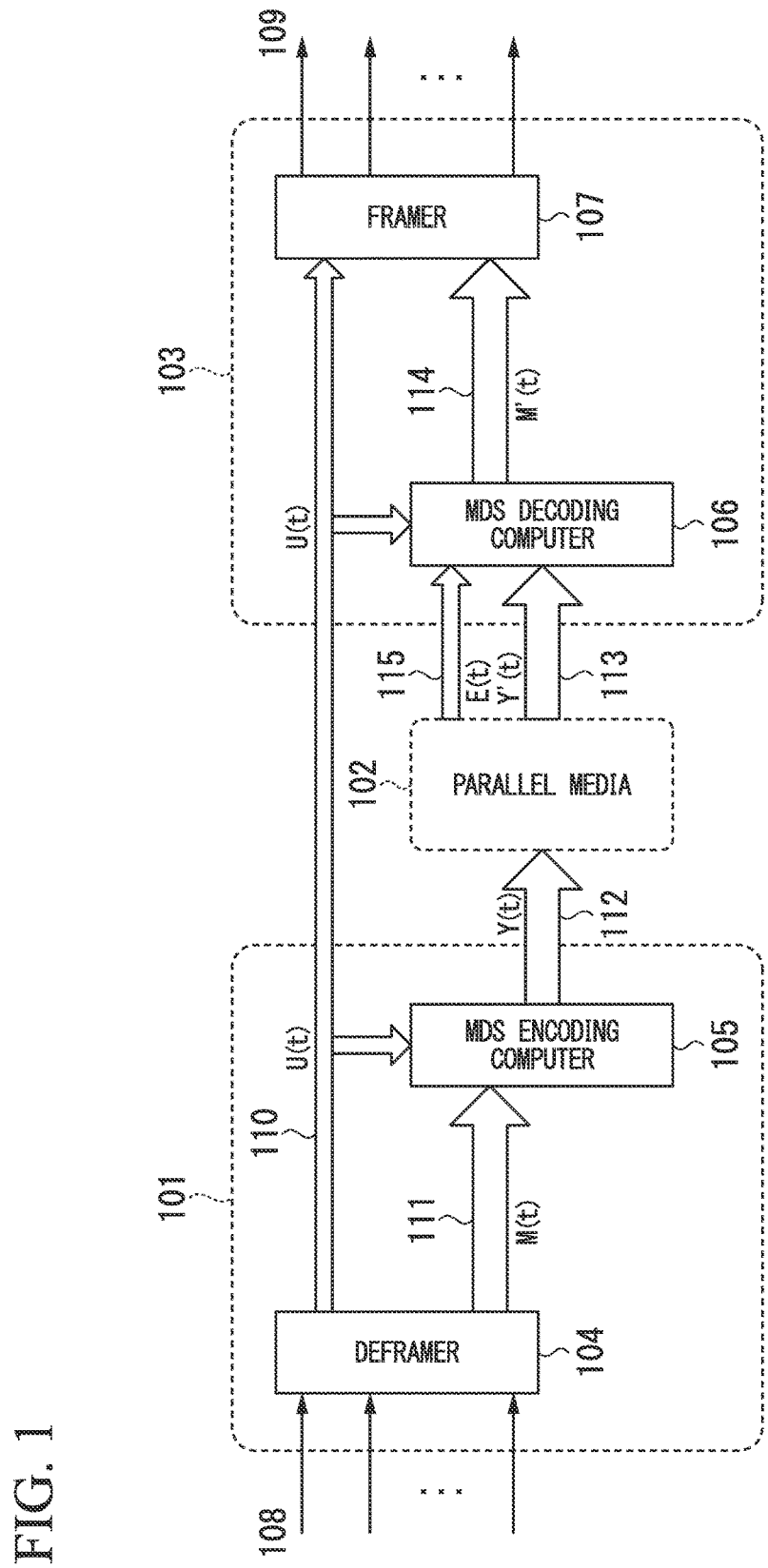
FIG. 1 shows an example of a parallel data encoding/decoding system in accordance with a first embodiment of the present invention.

Embodiments of the present invention will be described with reference to the accompanying drawings. Embodiments to be described below are examples of the present invention, and the present invention is not limited to the following embodiments. It is to be noted that structural components denoted by the same reference signs in the present Description and the drawings denote the same structural components.

(Basic Principles)

Hereinafter, the basic principles of first to eleventh embodiments of the present invention will be described.

Although parallel data transmission is used as an example in the first to eleventh embodiments of the present invention, a similar scheme is applicable even when a hard disk or a memory is used as a physical medium in the present invention.

When the number of parallel lanes in the parallel data transmission is denoted as R, symbols of R lanes are treated as one data block at an arbitrary time. At this time, a state vector U which is information indicating validity/invalidity of the symbol for each lane is also used for encoding. For example, it is assumed that in an optical transport network (OTN), a payload type (PT) is checked, the information is indicated to be invalid if an optical payload unit optical data unit (OPU/ODU) is a Null client, and the information is indicated to be valid if the OPU/ODU is another client signal. In addition, it is assumed that in a physical coding sublayer (PCS) of the Ethernet (registered trademark), an idle signal is indicated to be invalid, and a medium access control (MAC) frame is indicated to be valid.

The present invention uses a (2R, R) block code with which erasure of R symbols can be corrected and which belongs to an MDS code (e.g., see Non-Patent Document 4) such as a shortened Reed-Solomon code (e.g., see Non-Patent Documents 1 and 2) or a Cauchy Reed-Solomon code (e.g., see Non-Patent Document 3). That is, encoding is performed so that the data length is equal to the parity length. In addition, for an invalid symbol, a default value (generally 0) is set at the time of encoding. Here, the invalid symbol is, for example, data of a lane corresponding to an IDLE or NULL client.

Although information of 2R symbols of data and parity is transmitted as a systematic code in general redundancy transmission at a coding rate of 0.5, the present invention is characterized in that information of R symbols and the state vector U are transmitted.

Here, the state vector U may be sent along with encoded data, transmitted through a separate path, or transmitted only if the value thereof is varied.

(1) When Parity S of a Shortened Code$_{shortened}$ RS(2R, R) is Transmitted as Information of R Symbols When an encoding vector of R symbols is denoted as M, an R-bit state vector indicating the validity (=1)/invalidity (=0) of each element of M is denoted as U, and a parity generator matrix in a shortened code$_{shortened}$ RS(2R, R) of a Reed-Solomon code RS(N, K); R for a generating polynomial g(X) is denoted as A, the parity S is represented by Formula (1).

$$M=\{m_0,m_1,m_2,\ldots,m_{R-1}|m_i\in GF(2^n)\}$$

$$U=\{u_0,u_1,u_2,\ldots,u_{R-1}|u_i\in\{0,1\}\}$$

$$g(X)=\Pi_{i=\{k,k+1,k+2,\ldots k+R-1\}}(X-\alpha_i)$$

$$RS(N,K);R=N-K,N=2^n-1$$

$$A=\{a_{j,i}=\alpha_{i+k}{}^{j+R}|i,j=\{0,1,\ldots,R-1\}\} \quad\text{[Expression 21]}$$

[Expression 22]

$$(M\bigcirc U)A=S \quad\text{Formula (1)}$$

It is to be noted that k is an integer greater than or equal to 0, $GF(2^n)$ is an n-order extension field of a Galois field, and $\alpha_i$ is a non-zero element of $GF(2^n)$.

When Formula (1) is rewritten using a reception vector Y' and an erasure vector E indicating erasure (=1)/reception (=0) of each element of a transmission vector Y in a transmission/reception section, Formula (1) is represented by Formulas (2).

[Expression 23]

$$E=\{e_0,e_1,e_2,\ldots,e_{R-1}|e_i\in\{0,1\}\}$$

$$\bar{E}=\{1-e_0,1-e_1,1-e_2,\ldots,1-e_{R-1}|e_i\in\{0,1\}\}$$

$$(M\bigcirc U)A=(S\bigcirc E)+(S\bigcirc\bar{E})=(S\bigcirc E)+Y' \quad\text{Formulas (2)}$$

Because all elements are Galois fields, Formula (3) is established.

[Expression 24]

$$(M\bigcirc U)A+(S\bigcirc E)I=Y' \quad\text{Formula (3)}$$

Here, the reception vector Y' is information itself received in each lane at an arbitrary time. An object is to obtain a subset $M_{sub}$ constituted of valid elements of the encoding vector M from the reception vector Y', the state vector U, the erasure vector E, and the parity generator matrix A, which are known information on the receiving end.

$$M_{sub}=\{m_i\in M|u_i=1;u_i\in U\} \quad\text{[Expression 25]}$$

(i) When $|M_{sub}|+|S_{sub}|=R$

By replacing rows of an encoding matrix A and a unit matrix I using the subset $M_{sub}$ of the encoding vector M and a subset $S_{sub}$ of the parity S erased in transmission, Expression 26 is obtained.

$$(M_{sub}|0)A'+(0|S_{sub})I'=Y' \quad\text{[Expression 26]}$$

Here, A' and I' are matrices obtained by replacing the rows of A and I, respectively. In addition, the subset $S_{sub}$ is as follows.

$$S_{sub}=\{s_i\in S|e_i=1;e_i\in E\} \quad\text{[Expression 27]}$$

The subset $M_{sub}$ is obtained by calculating a matrix B of Expression 28 and solving Expression 29 using its inverse matrix $B^{-1}$.

$$(M_{sub}\mid 0)\left(\frac{A'_{top}}{0}\right)+(0\mid S_{sub})\left(\frac{0}{I'_{bottom}}\right)= \quad\text{[Expression 28]}$$

$$(M_{sub}\mid S_{sub})\left(\frac{A'_{top}}{I'_{bottom}}\right)=(M_{sub}\mid S_{sub})=B=Y'$$

A block matrix $$\left(\frac{A'_{top}}{0}\right)$$

is a matrix obtained by replacing $A'_{bottom}$ in a block matrix $$\left(\frac{A'_{top}}{A'_{bottom}}\right)$$

of A' with a zero matrix.

A block matrix $$\left(\frac{0}{I'_{bottom}}\right)$$

is a matrix obtained by replacing $I'_{top}$ in a block matrix $$\left(\frac{I'_{top}}{I'_{bottom}}\right)$$

of I' with a zero matrix.

$$(M_{sub}|S_{sub})=Y'B^{-1} \quad\text{[Expression 29]}$$

(ii) When $|M_{sub}|+|S_{sub}|<R$

It is possible to obtain the subset $M_{sub}$ in accordance with a procedure similar to that of (i) in relation to an r×r sub-matrix $A_{sub}$, of the encoding matrix A and an r×r unit matrix $I_r$ corresponding to a sub-vector $Y'_{sub}$ of Y' when Expression 30 is given.

$$r=|M_{sub}|+|S_{sub}| \quad\text{[Expression 30]}$$

$$Y'_{sub}=\{y_i\in Y|i=0,1,\ldots,r-1\} \quad\text{[Expression 31]}$$

(iii) When $|M_{sub}|+|S_{sub}|>R$

Expression 32 holds and it is impossible to obtain the subset $M_{sub}$.

$$|M_{sub}|+|S_{sub}|>|Y'|=R \qquad \text{[Expression 32]}$$

Because the number of invalid elements of the encoding vector M is represented by Expression 33 from the above-described (i), (ii), and (iii), it is possible to restore the subset $M_{sub}$ constituted of valid elements of the encoding vector M if Expression 34 holds, that is, if the number of erased elements is less than or equal to the number of the invalid elements of the encoding vector M.

$$|\overline{M_{sub}}| = R - |M_{sub}| \qquad \text{[Expression 33]}$$

$$|S_{sub}| = \sum_{i=\{0,1,\ldots,R-1\}} e_i$$

$$|\overline{M_{sub}}| \geq \sum_{i=\{0,1,\ldots,R-1\}} e_i \qquad \text{[Expression 34]}$$

(2) When a Coefficient Vector P of a Remainder Polynomial of a Shortened Code$_{shortened}$ RS (2R, R) is Transmitted as Information of R Symbols There is a relationship of S=PV between the coefficient vector P and the parity S when a Vandermonde matrix (e.g., see Non-Patent Document 5) V is used. If this is substituted into Formula (1), Expression 35 is given.

$$(M\bigcirc U)A = PV \qquad \text{[Expression 35]}$$

Expression 35 is rewritten as Expression 36 using the reception vector Y' and the erasure vector E.

$$(M\bigcirc U)A = (P\bigcirc E)V + (P\bigcirc \overline{E})V = (P\bigcirc E)V + Y'V \qquad \text{[Expression 36]}$$

Because all elements are Galois fields, Formula (4) is established

[Expression 37]

$$(M\bigcirc U)A + (P\bigcirc E)V = Y'V \qquad \text{Formula (4)}$$

It is possible to calculate the subset $M_{sub}$ of the encoding vector M through a technique similar to that of (1) in relation to Formula (4).

(3) When an R×R Cauchy Reed-Solomon Code is Used

It is possible to calculate the subset $M_{sub}$ of the encoding vector M through a technique similar to that of (1) except for a change of the parity generator matrix A in (1) to a Cauchy matrix $C_{R\times R}$.

It is to be noted that the Cauchy matrix $C_{R\times R}$ is represented as follows.

$$\text{(i)} \{x_1, x_2, \ldots, x_R\}, \{y_1, y_2, \ldots, y_R\} \in GF(2^p) \qquad \text{[Expression 38]}$$

$$\text{(ii)} \forall_{i,j} \in \{1, 2, \ldots, R\}: x_i \neq y_j$$

$$\text{(iii)} \forall_{i,j} \in \{1, 2, \ldots, R\}, i \neq j: x_i \neq x_j$$

and $$y_i \neq y_j$$

$$C_{R\times R} = \begin{pmatrix} \frac{1}{x_1+y_1} & \frac{1}{x_1+y_2} & \cdots & \frac{1}{x_1+y_R} \\ \vdots & \vdots & \ddots & \vdots \\ \frac{1}{x_R+y_1} & \frac{1}{x_R+y_2} & \cdots & \frac{1}{x_R+y_R} \end{pmatrix}$$

(4) When an MDS Code is Used

When a generator matrix of a maximum-distance-separable (MDS) code of a coding rate of 0.5 having erasure correction capability of R symbols is denoted as $G=\{I_R|P_R\}$, it is possible to calculate the subset $M_{sub}$ of the encoding vector M through a technique similar to that of (1) except for a change of the parity generator matrix A in (1) to a generator matrix $P_R$ of the MDS code.

(5) When Valid Elements of the Encoding Vector M and Parity S of a Shortened Code$_{shortened}$ RS (2R, R) Equal in Number to Invalid Elements of the Encoding Vector M are Transmitted The following formulas are established from Formula (1).

$$(M\bigcirc U)A = S = (S\bigcirc U) + (S\bigcirc \overline{U})$$

$$(M\bigcirc U)A + (S\bigcirc \overline{U})I = (S\bigcirc U) \qquad \text{[Expression 39]}$$

Furthermore, when Expression 39 is rewritten using the transmission vector Y, the following formula is given.

$$(M\bigcirc U + S\bigcirc \overline{U})D = YD = (S\bigcirc U) \qquad \text{[Expression 40]}$$

Here, a matrix D is constituted of a row corresponding to $u_j=1$ of the matrix A and a row corresponding to $u_j=0$ of the matrix I. Furthermore, when Expression 40 is rewritten using the reception vector Y' and the erased vector E, the following formula is given.

$$YD = (Y\bigcirc E + Y\bigcirc \overline{E})D = (S\bigcirc U) \qquad \text{[Expression 41]}$$

Because all elements are Galois fields, the following formula is established.

[Expression 42]

$$(Y\bigcirc E)D + (S\bigcirc U)I = Y'D \qquad \text{Formula (5)}.$$

In relation to Formula (5), an erased element of the transmission vector is obtained through a technique similar to that of (1). Because all valid elements of the encoding vector M are included in the transmission vector, the subset $M_{sub}$ is obtained when the valid elements are combined with elements of the encoding vector M included in the reception vector Y'.

It is possible to obtain the subset $M_{sub}$ of the encoding vector M through a similar technique even when the valid elements of the encoding vector M are transmitted in (2) and (3).

The first to eleventh embodiments of the present invention provides the following operation and advantageous effect by "transmitting parity of R symbols" or "transmitting a combination of valid data and the parity." Although data of R symbols and parity of the R symbols are generally transmitted in an MDS code of a coding rate of 0.5 with which erasure of R symbols can be corrected, because correction of R symbols is possible, it is possible to restore original data of R symbols on the receiving end even when only the parity of the R symbols is transmitted (it is possible to consider that the data of the R symbols has been erased) if there is no erasure in transmission. If there are known symbols among the original data of R symbols, it is possible to restore symbols of the remaining unknown data even if a plurality of pieces of transmitted parity equal in number to the known symbols are erased. Data of lanes such as an IDLE, and NULL client is encoded as 0, parity of R symbols is sent, and the position of 0 shown by Expression 43 is transmitted to the receiving end, so that the above-described technique makes it possible to restore valid data, that is, it makes it possible to correct the erasure, even if a plurality of pieces of transmission parity equal in number to the lanes of the IDLE and NULL client are erased.

$$\overline{U} \qquad \text{[Expression 43]}$$

First Embodiment

FIG. 1 shows a basic configuration of a parallel data encoding/decoding scheme in accordance with the present embodiment. An encoder 101 encodes input parallel data 108 of a plurality of lanes to generate transmission information Y(t) 112 for parallel media 102 for inputting and outputting parallel data. A decoder 103 reproduces original parallel data from an R-bit state vector U(t) 110 indicating a use situation of original input lanes as well as a reception information vector Y'(t) 113, and an R-bit erasure vector E(t) 115 indicating erasure or an uncorrected error received from the parallel media 102 to generate output parallel data 109.

Here, the erasure vector E(t) 115 is loss at a physical level or a logical level. At the physical level, for example, it refers to loss by an optical power disconnection or loss by transmission using a relevant link in which clock synchronization cannot be established. At the logical level, for example, for the Ethernet (registered trademark), a frame check sequence (FCS) may be recalculated and a relevant frame may be determined to be lost if the FCS is incorrect, For the OTN, a bit interleaved parity (BIP) may be recalculated and a relevant frame may be determined to be lost if the BIP is incorrect, or a relevant frame may be determined to be lost if an uncorrected error has been detected using a transmitted FEC.

In the encoder 101, a deframer 104 generates a vector M(t) 111 of R symbols constituted of data included in a valid input frame in the input parallel data 108 and the state vector U(t) 110 indicating the use situation of the input lanes. Here, an invalid element of the vector M(t) 111 is set to 0. When the number of parallel lanes is denoted as R, an MDS encoding computer 105 calculates parity $S(t)=M(t)A_R$ using a generator matrix $G=\{I_R|A_R\}$ of an MDS code of a coding rate of 0.5 having erasure correction capability of R symbols such as a Reed-Solomon code or a Cauchy Reed-Solomon code to generate the transmission information Y(t) 112 for the parallel media 102.

The parallel media 102 may be any media, such as a transmission line, a memory, or a hard disk, as long as time-series information can be accumulated therein and the information can be extracted therefrom in chronological order. There is provided a mechanism for obtaining the erasure vector E(t) 115 indicating erasure or an uncorrected error of information for each lane when the information is extracted in the parallel media 102. Here, in the reception information vector Y'(t) 113 from the parallel media 102, an element in which there is erasure or an uncorrected error is set to 0.

Here, Y'(t) 113 is a vector constituted of elements of R symbols received in each lane at an arbitrary time. The symbol of the erased lane is set to 0. A relationship between the transmission vector Y and the reception vector Y' is as follows.

$$Y'=Y\bigcirc \overline{E} \qquad \text{[Expression 44]}$$

In the decoder 103, an MDS decoding computer 106 reproduces a vector $M_{sub}(t)$ 114 by solving simultaneous linear equations of a Galois field shown in the following formula. It is to be noted that in the drawing, $M_{sub}(t)$ is written as M'(t).

$$M(t)A_R+(S(t)\bigcirc E(t))I=Y(t) \qquad \text{[Expression 45]}$$

A framer 107 reconstructs a frame from the vector $M_{sub}(t)$ 114 and the state vector U(t) 110 to generate the output parallel data 109.

Second Embodiment

Figure 2:
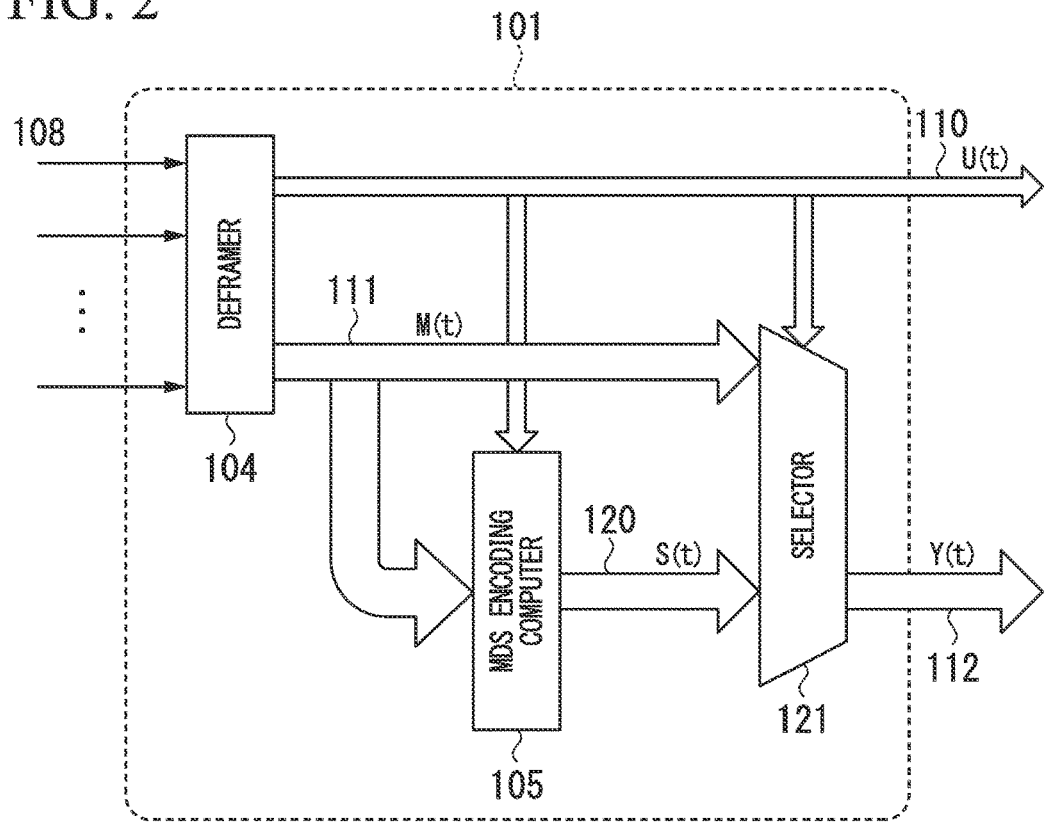
FIG. 2 shows an example of a configuration of a parallel data encoder.
Figure 3:
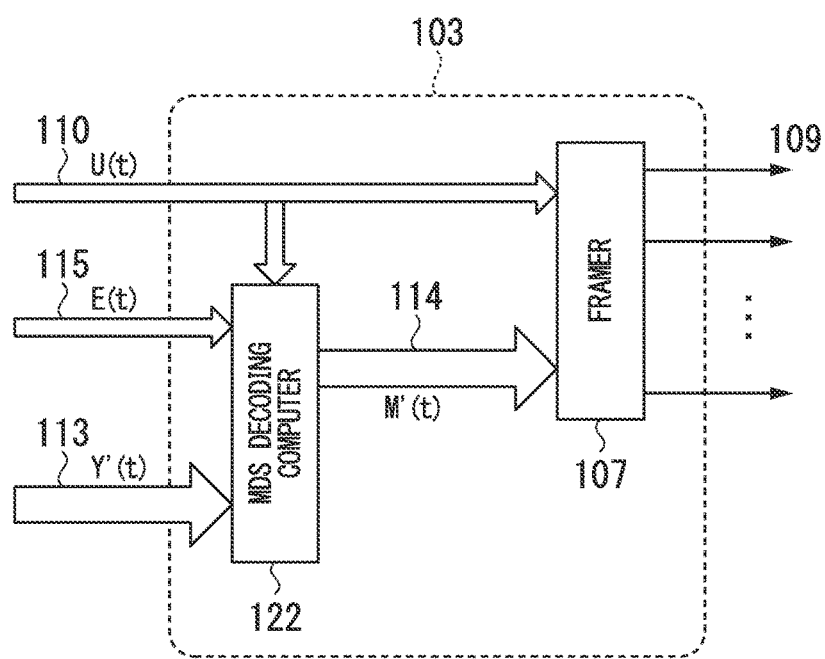
FIG. 3 shows an example of a configuration of a parallel data decoder.

FIGS. 2 and 3 illustrate other forms of the parallel data encoder and decoder, respectively.

In configuration of the parallel data encoder of FIG. 2, a difference from the parallel data encoder of FIG. 1 is that a selector 121 is used to transmit a valid symbol of the input parallel data 108 without change and replace an invalid symbol with a corresponding symbol of a parity S(t) 120 output by the MDS encoding computer 105 and transmit it as the transmission information Y(t) 112.

In the configuration of the parallel data decoder of FIG. 3, a difference from the parallel data decoder of FIG. 1 is that an MDS decoding computer 122 reproduces the vector $M_{sub}(t)$ 114 by solving simultaneous linear equations of a Galois field in the following formula using a matrix $B_R$ constituted of a row corresponding to $u_j=1$, where $u_j \in U$, of the matrix $A_R$ and a row corresponding to $u_j=0$, where $u_j \in U$, of a unit matrix I.

$$(Y(t)\bigcirc E(t))B_R+(S(t)\bigcirc U(t))I=Y(t)B_R \qquad \text{[Expression 46]}$$

The second embodiment is characterized in that because the valid symbol of the input parallel data 108 is accumulated in the parallel media 102 without change it is possible to reproduce the vector $M_{sub}(t)$ 114 without solving the simultaneous linear equations in the MDS decoding computer 122 if there is no erasure or uncorrected error of information.

Third Embodiment

Figure 4:
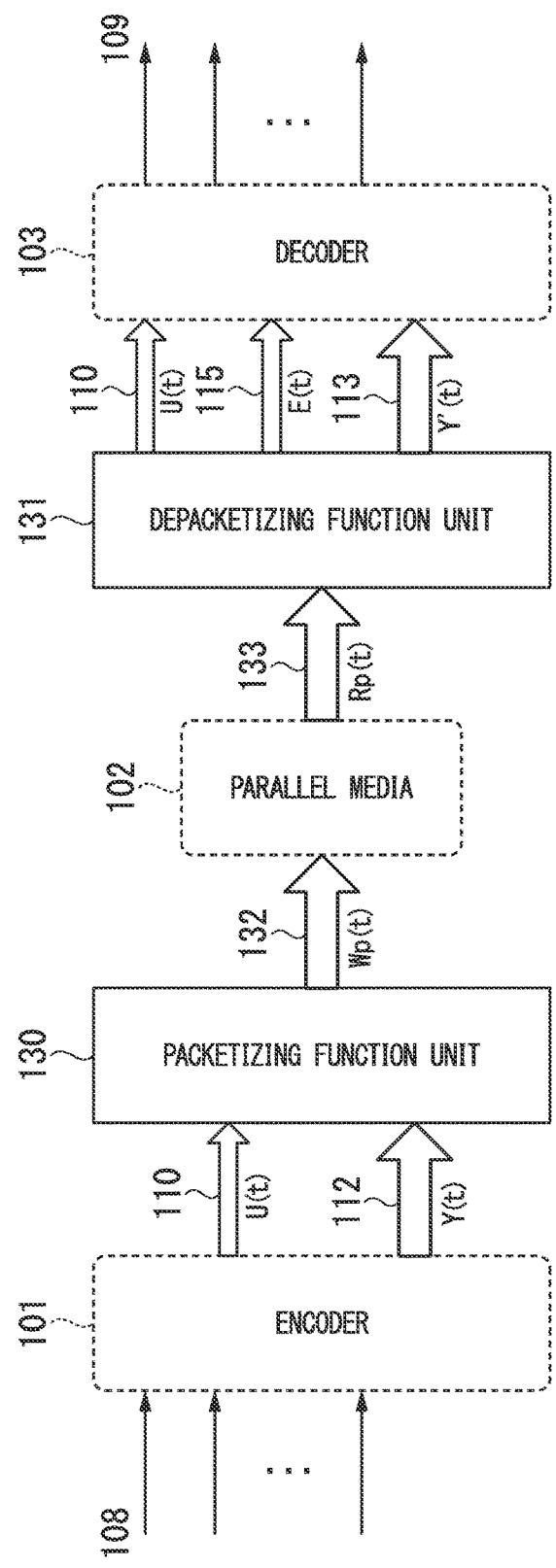
FIG. 4 shows an example of packetization of encoded data.
Figure 5:
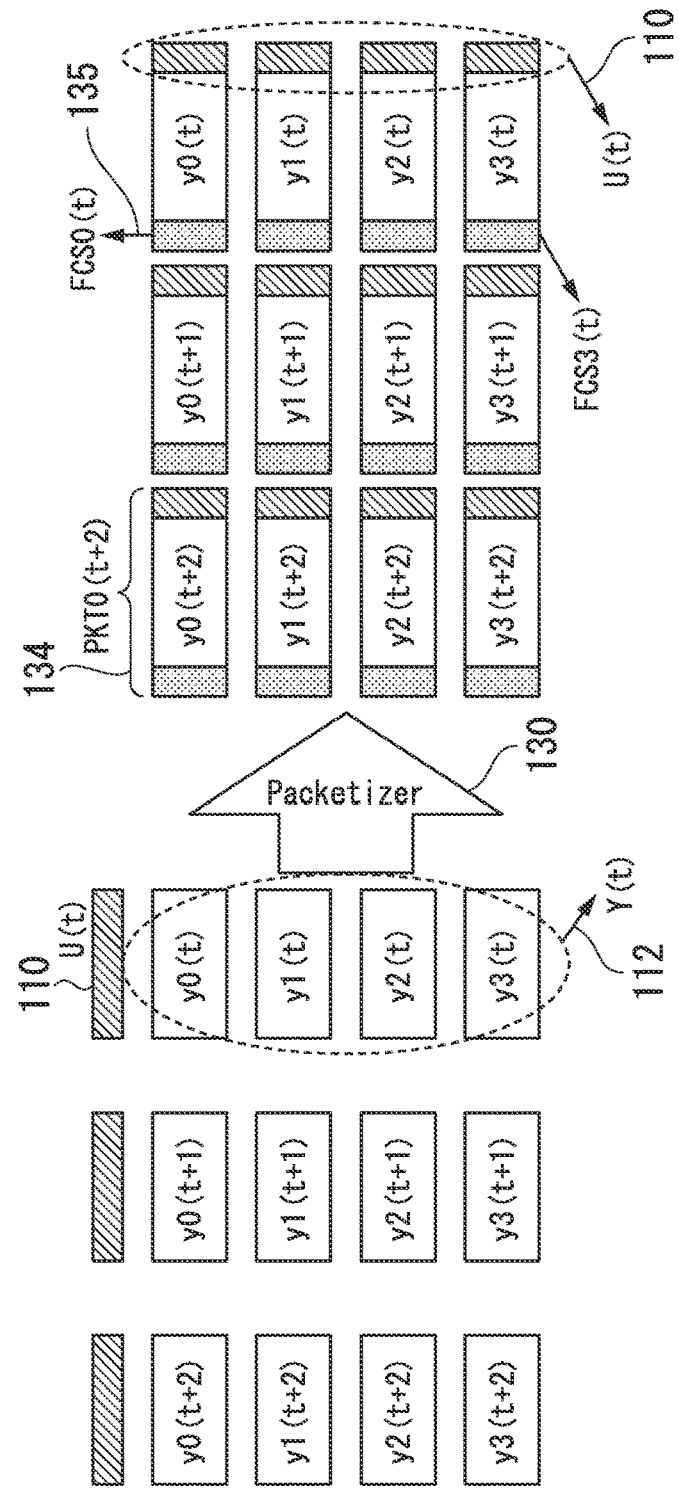
FIG. 5 shows an example of a packet format.

FIG. 4 shows a form in which a packet is used for an input/output to/from the parallel media 102 in the first and second embodiments. FIG. 5 shows an example of a packet format.

When the encoded transmission information Y(t) 112 and the state vector U(t) 110 indicating validity/invalidity of input parallel data are input, a packetizing function unit 130 performs packetization for each lane. A packet of a $k^{th}$ lane is constituted of U(t) 110, a $k^{th}$ element $y_k(t)$ of Y(t) 112, and an error detection/correction code 135. A packet 134 generated in this manner is transmitted as Wp(t) 132 to the parallel media 102.

A depacketizing function unit 131 of the receiving end performs inspection by the error detection/correction code 135 in the packet received as Rp(t) 133 from the parallel media 102 and sets a symbol of the received Rp(t) 133 as an element of Y'(t) 113 without change if there is no error. In addition, the depacketizing function unit 131 sets a corrected symbol as an element of Y'(t) 113 if a correctable error is present, sets a relevant bit of the erasure vector E(t) 115 indicating an uncorrected error to 1 and sets a relevant symbol of Y'(t) 113 to 0 if the uncorrected error is present. The decoder 103 can reproduce the valid symbol $M_{sub}(t)$ 114 of the input parallel data 108 by solving the simultaneous linear equations of the Galois field using Y'(t) 113, U(t) 110, and E(t) 115.

The third embodiment is characterized in that an application to the parallel media 102 having the affinity for a packet is easy and all the transmission and generation of Y(t) 112, U(t) 110, and E(t) 115 between the MDS encoding computer 105 and the MDS decoding computer 122 can be performed via the parallel media 102.

Fourth Embodiment

Figure 6:
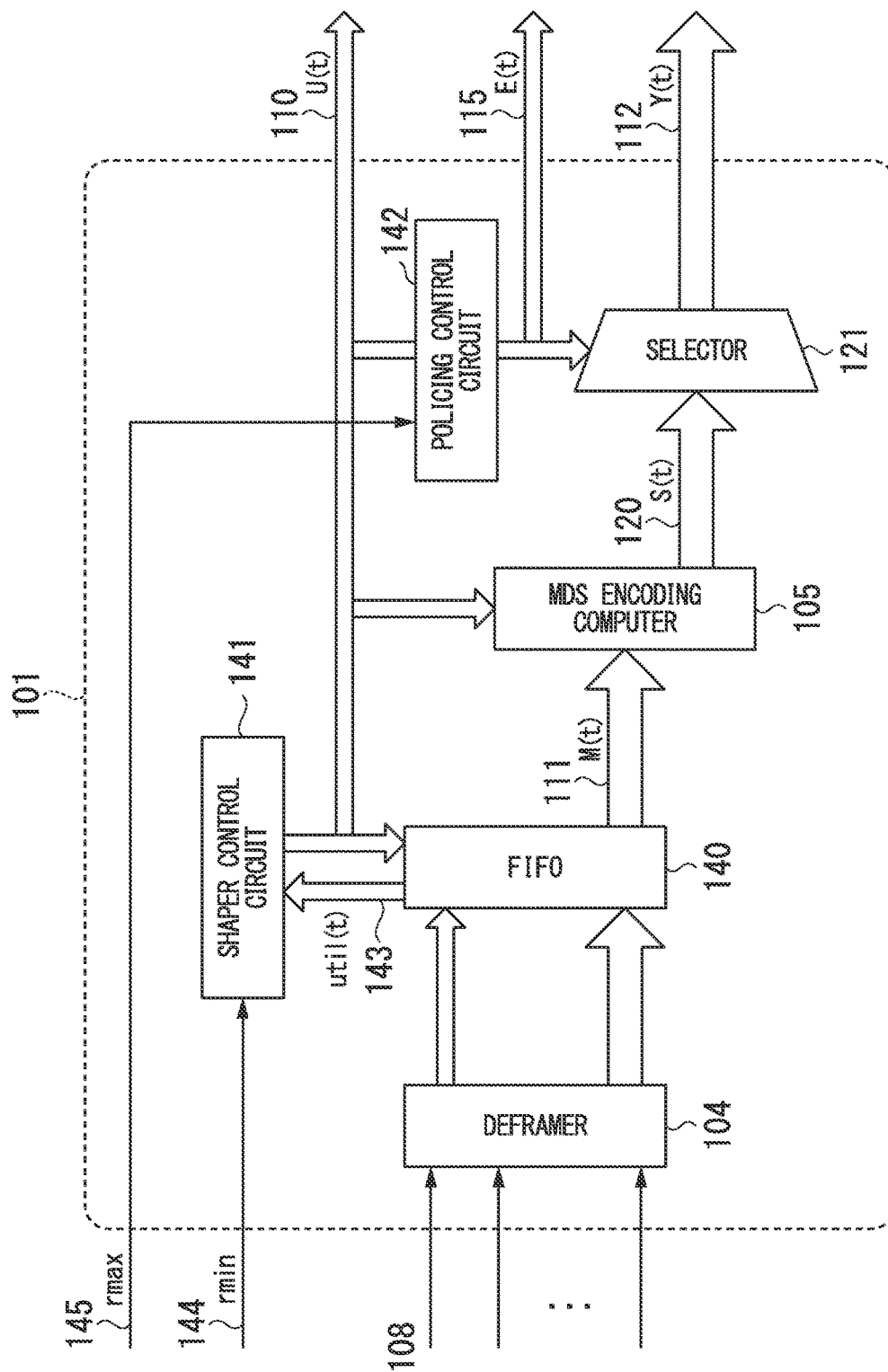
FIG. 6 shows an example of variable redundant encoding.

FIG. 6 shows a configuration of the encoder 101 when the degree of redundancy is dynamically variable.

In the encoder 101, the deframer 104 extracts data included in a valid input frame in the input parallel data 108 and inputs the extracted data to a first-in first-out (FIFO) buffer 140.

A shaper control circuit 141 limits the number of symbols to be read so that an FIFO use rate 143 does not exceed a given value, and $|U(t)| \leq R - r_{min}$ is satisfied using a lower-limit setting of the degree of redundancy, that is, a guarantee value $r_{min}$ 144 of the number of correctable erasure symbols in transmission. For example, an R-bit read signal F represented by the following formula is generated.

$$F = \{f_0, f_1, f_2, \ldots, f_{R-1} | \Sigma_{i=0}^{R-1} f_i \leq R - r_{min}, f_i \in \{0, 1\}\} \quad \text{[Expression 47]}$$

Here, when priority is set for each lane, a read signal of a lane having higher priority may be set to 1.

A policing control circuit 142 generates an erasure vector E(t) 115 indicating an error using an upper-limit setting of the degree of redundancy, that is, a limit value $r_{max}$ 145 of the number of correctable erasure symbols in transmission so as to satisfy the following formula.

$$|E(t)| = R - \min\{R, |U(t)| + r_{max}\} \quad \text{[Expression 48]}$$

The selector 121 transmits an element symbol of the parity S(t) 120, which is encoded information, as the information vector Y(t) 112 if each element bit of E(t) 115 is 0 and transmits 0 as the information vector Y(t) 112 if each element bit of E(t) 115 is 1. Thereby, the selector 121 can select symbols equal in number to the number represented by the following formula from the transmission vector Y.

$$\min(R, r_{max} + \Sigma_{i=0}^{R-1} f_i) \quad \text{[Expression 49]}$$

The decoder (not shown) performs erasure correction in relation to a non-selected symbol and a symbol erased in transmission.

It is to be noted that an element of the information vector Y(t) 112 in which an element bit of E(t) 115 is 1 may not be transmitted to the parallel media 102, part of the parallel media 102 corresponding to the element bit may be moved to a low power consumption mode, or supplied power may be stopped, or it may be physically excluded. In the physical exclusion, for example, a fiber or cable is removed or an interface (IF) card/module is removed.

The fourth embodiment is characterized in that it is possible to guarantee the minimum degree of redundancy by the effect of the lower-limit setting (rmin) 144 of the degree of redundancy and smoothing by the FIFO buffer 140, excessive degree of redundancy of the case in which an amount of transfer information is small is suppressed through the upper-limit setting rmax 145 and degeneration of information by the selector 121, and the effect of reduction of the number of used parallel media and power is provided. In accordance with the invention related to the present embodiment, it is not necessary to prepare circuits equal in number to the number of types of degree of redundancy and the entire communication paths are not disconnected when the number of defective communication paths is less than or equal to rmin.

Fifth Embodiment

Figure 7:
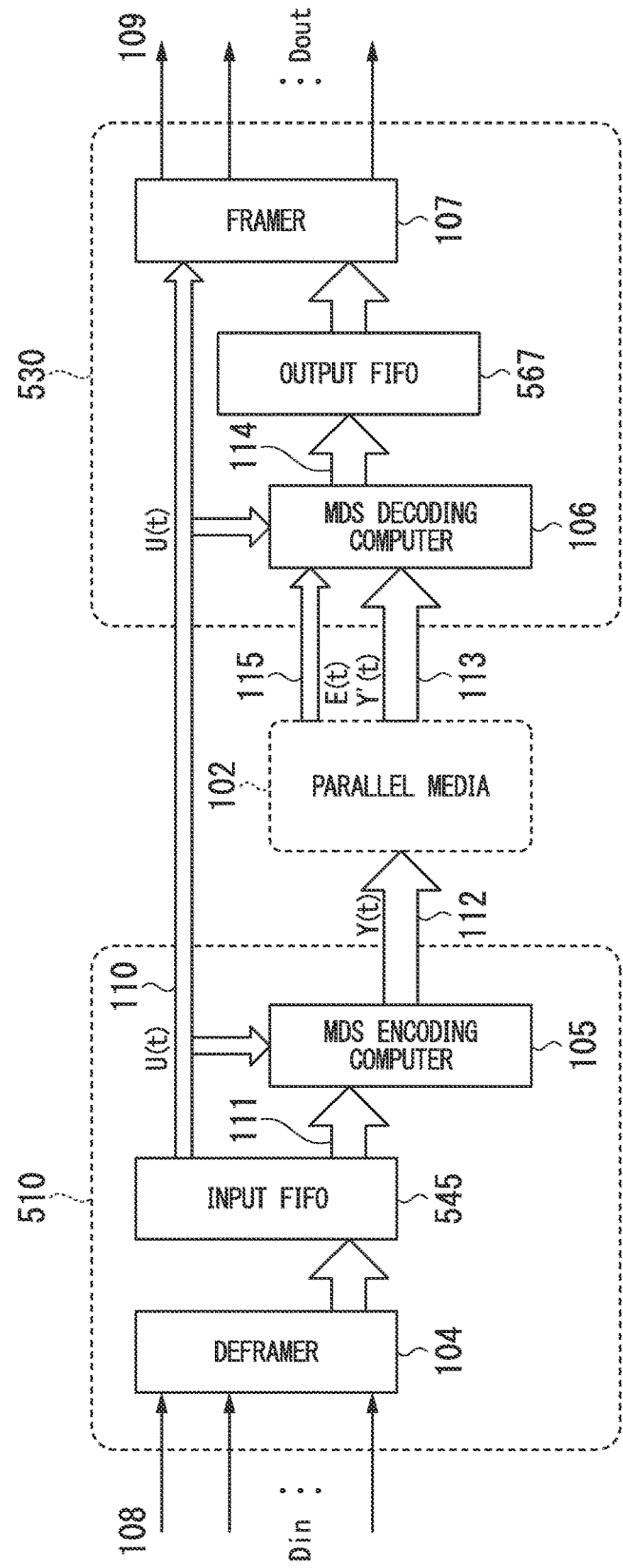
FIG. 7 is a block diagram showing an example of a parallel data encoding/decoding system in accordance with a fifth embodiment of the present invention.

FIG. 7 is a block diagram showing an example of a parallel data encoding/decoding system in accordance with the present embodiment. In the present embodiment, the encoder 101 and the decoder 103 in the system shown in FIG. 1 are replaced with an encoder 510 with FIFO and a decoder 530 with FIFO, respectively. In the present embodiment, a plurality of lanes which connect the encoder 510 with the FIFO and the decoder 530 with the FIFO form a parallel bus constituted of R logical lanes, input FIFOs 545 are inserted between a deframer 104 and an MDS encoding computer 105, and output FIFOs 567 are inserted between an MDS decoding computer 106 and a framer 107.

An input Din for the parallel bus is written by the deframer 104 to the input FIFOs 545 independently provided for elements.

$$D\text{in} = \{d_0, d_1, d_2, \ldots, d_{R-1} | d_i \in GF(2^n)\} \quad \text{[Expression 50]}$$

A control circuit of the input FIFOs 545 generates an R-bit read signal F in which each element indicates reading and reading stop of one symbol by "1" and "0", respectively.

$$F = \{f_0, f_1, f_2, \ldots, f_{R-1} | f_i \in \{0, 1\}\} \quad \text{[Expression 51]}$$

Here, when priority is set for each lane, a read signal of a lane having higher priority may be set to 1.

Then, outputs of the input FIFOs 545 are used as a vector M(t) 111 of R symbols and the read signal F is used as a state vector U(t) 110.

A subset $M_{sub}$ obtained by the MDS decoding computer 106 is written to the output FIFOs 567 independent provided for elements.

$$M_{sub} = \{m_i \in M | u_i = 1, u_i \in U\} \quad \text{[Expression 52]}$$

Then, outputs of the output FIFOs 567 are read as an output Dout for a parallel bus of R symbols.

$$D\text{out} = \{d_0, d_1, d_2, \ldots, d_{R-1} | d_i \in GF(2^n)\} \quad \text{[Expression 53]}$$

Sixth Embodiment

Figure 8:
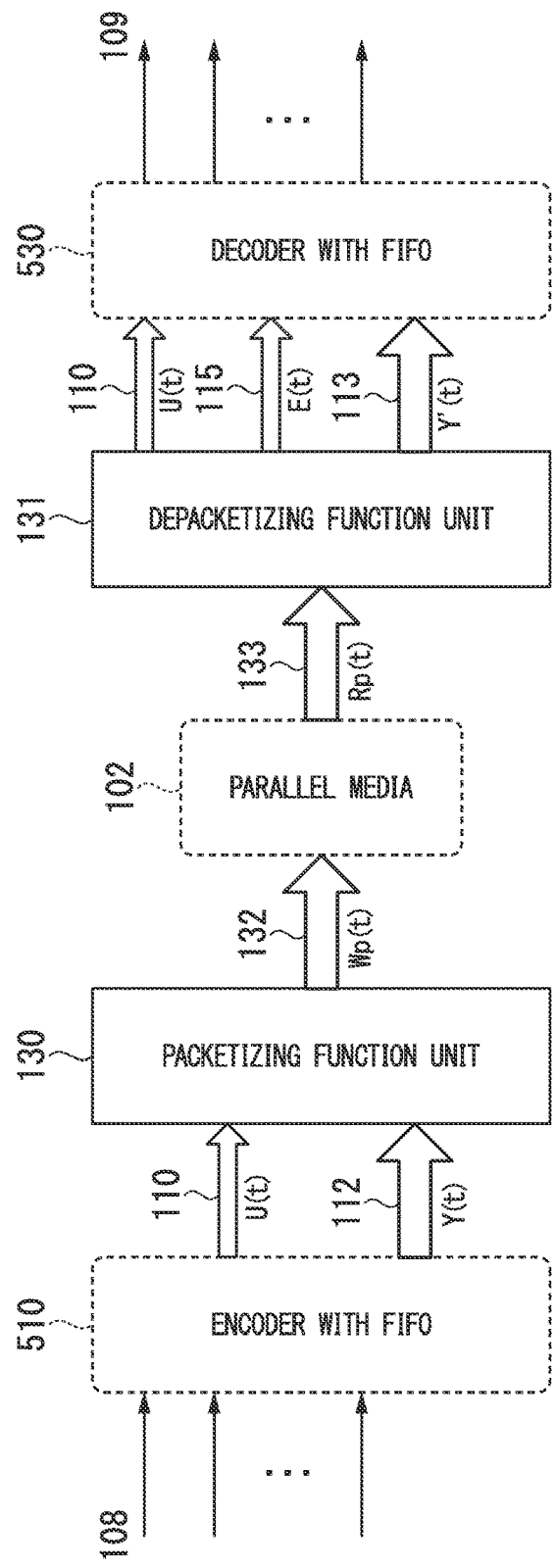
FIG. 8 is a block diagram showing an example of a parallel data encoding/decoding system in accordance with a sixth embodiment of the present invention.

FIG. 8 is a block diagram showing an example of a parallel data encoding/decoding system in accordance with the present embodiment. In the present embodiment, the encoder 101 and the decoder 103 in the system shown in FIG. 4 are replaced with the encoder 510 with the FIFO and the decoder 530 with the FIFO shown in FIG. 7, respectively. In the present embodiment, the packetizing function unit 130 and the depacketizing function unit 131 perform parallel packet transmissions using R logical lanes.

Input parallel data 108 is written to the input FIFOs 545 (see FIG. 7) independent provided for logical lanes. The input FIFOs 545 generate an R-bit read signal F in which each element indicates reading and reading stop of one symbol by "1" and "0", respectively.

$$F = \{f_0, f_1, f_2, \ldots, f_{R-1} | f_i \in \{0, 1\}\} \quad \text{[Expression 54]}$$

Here, when priority is set for each lane, a read signal of a lane having higher priority may be set to 1.

Then, outputs of the input FIFOs 545 are used as the vector M(t) 111 of R symbols and the read signal F is used as the state vector U(t) 110.

A subset $M_{sub}$ obtained by the MDS decoding computer 106 is written to the output FIFOs 567 independent provided for logical lanes.

$$M_{sub} = \{m_i \in M | u_i = 1, u_i \in U\} \quad \text{[Expression 55]}$$

Then, a packet is read from the output FIFOs 567 for each logical lane.

Seventh Embodiment

In the present embodiment, specific examples of an encoding method in the encoder 101 and a decoding method in the decoder 103 will be described.

A first method will be described.

The encoder 101 calculates parity S using a generator matrix G of an MDS code of a coding rate of 0.5 having erasure correction capability of R symbols for products of elements for an encoding vector M of R symbols and a state vector U of R bits, and transmits the state vector U along with a transmission vector Y defined by the parity S.

The decoder 103 decodes the subset $M_{sub}$ constituted of valid elements of the encoding vector M by solving Formula (E1) using a reception vector Y', the state vector U, and an erasure vector E, and performs erasure correction.

[Expression 56]

$$(M \bigcirc U)A_R + (S \bigcirc E)I = Y' \qquad \text{Formula (E1)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \bigcirc U = \{m_0 u_0, m_1 u_1, m_2 u_2, \ldots, m_{R-1} u_{R-1} | m_i \in M, u_i \in U\}$$

$$G = \{I_R | A_R\}$$

$$S = (M \bigcirc U)A_R$$

$$Y = S$$

$$E = \{e_0, e_1, e_2, \ldots, e_{R-1} | e_i \in \{0,1\}\}$$

$$M_{sub} = \{m_i \in M | u_i = 1, u_i \in U\} \qquad \text{[Expression 57]}$$

A second method will be described.

The encoder 101 calculates parity S using a generator matrix G of an MDS code of a coding rate of 0.5 having erasure correction capability of R symbols for products of elements for an encoding vector M of R symbols and a state vector U of R bits, and transmits the state vector U along with a transmission vector Y defined by the encoding vector M, the state vector U, and the parity S.

The decoder 103 decodes the subset $M_{sub}$ constituted of valid elements of the encoding vector M by solving Formula (E2) using a received reception vector Y', the received state vector U, and an erasure vector E indicating erasure and reception of each element of the transmission vector Y in a transmission/reception section using codes "1" and "0", respectively, and a matrix $B_R(U)$ constituted of a row corresponding to $u_j=1$, where $u_j \in U$, of a matrix $A_R$ and a row corresponding to $u_j=0$, where $u_j \in U$, of a unit matrix I, and performs erasure correction.

[Expression 58]

$$(Y \bigcirc E)B_R + (S \bigcirc U)I = Y'B_R \qquad \text{Formula (E2)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \bigcirc U = \{m_0 u_0, m_1 u_1, m_2 u_2, \ldots, m_{R-1} u_{R-1} | m_i \in M, u_i \in U\}$$

$$G = \{I_R | A_R\}$$

$$S = (M \bigcirc U)A_R$$

$$Y = M \bigcirc + S \bigcirc \overline{U}$$

$$E = \{e_0, e_1, e_2, \ldots, e_{R-1} | e_i \in \{0,1\}\}$$

$$M_{sub} = \{m_i \in M | u_i = 1, u_i \in U\} \qquad \text{[Expression 59]}$$

A third method will be described.

The encoder 101 calculates parity S using an encoding vector M of R symbols, a state vector U of R bits in which validity and invalidity of each element are indicated using codes "1" and "0", respectively, and a Cauchy matrix $C_{R \times R}$ of R rows and R columns constituted of elements of $GF(2^n)$ and transmits the state vector U along with a transmission vector Y defined by the parity S.

The decoder 103 decodes the subset $M_{sub}$ constituted of valid elements of the encoding vector M by solving Formula (E3) using a received reception vector Y', the received state vector U, and an erasure vector E indicating erasure and reception of each element of the transmission vector Y in a transmission/reception section using codes "1" and "0", respectively, and performs erasure correction.

[Expression 60]

$$(M \bigcirc U)C_{R \times R} + (S \bigcirc E)I = Y' \qquad \text{Formula (E3)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \bigcirc U = \{m_0 u_0, m_1 u_1, m_2 u_2, \ldots, m_{R-1} u_{R-1} | m_i \in M, u_i \in U\}$$

$$S = (M \bigcirc U)C_{R \times R}$$

$$Y = S$$

$$E = \{e_0, e_1, e_2, \ldots, e_{R-1} | e_i \in \{0,1\}\}$$

$$M_{sub} = \{m_i \in M | u_i = 1, u_i \in U\} \qquad \text{[Expression 61]}$$

A fourth method will be described.

The encoder 101 calculates parity S using an encoding vector M of R symbols, a state vector U of R bits in which validity and invalidity of each element are indicated using codes "1" and "0", respectively, and a Cauchy matrix $C_{R \times R}$ of R rows and R columns constituted of elements of $GF(2^n)$ and transmits the state vector U along with a transmission vector Y defined by the encoding vector M, the state vector U, and the parity S.

The decoder 103 decodes the subset $M_{sub}$ constituted of valid elements of the encoding vector M by solving Formula (E4) using a received reception vector Y', the received state vector U, an erasure vector E indicating erasure and reception of each element of the transmission vector Y in a transmission/reception section using codes "1" and "0", respectively, and a matrix $D_R(U)$ constituted of a row corresponding to $u_j=1$, where $u_j \in U$, of $C_{R \times R}$ and a row corresponding to $u_j=0$, where $u_j \in U$, of a unit matrix I, and performs erasure correction.

[Expression 62]

$$(Y \odot E)D_R + (S \odot U)I = Y'D_R \quad \text{Formula (E4)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$S = (M \odot U)C_{R \times R}$$

$$Y = M \odot U + S \odot \overline{U}$$

$$E = \{e_0, e_1, e_2, \ldots, e_{R-1} | e_i \in \{0,1\}\}$$

$$M_{sub} = \{m_i \in M | u_i = 1, u_i \in U\} \quad \text{[Expression 63]}$$

A fifth method will be described.

The encoder 101 calculates a coefficient vector P of a remainder polynomial of R symbols in a shortened code$_{shortened}$ RS (2R, R) of a Reed-Solomon code RS(N, K); R in a generating polynomial g(X) for products of elements of an encoding vector M of R symbols and as state vector U of R bits in which validity and invalidity of each element are indicated by codes "1" and "0", respectively, and transmits the state vector U along with a transmission vector Y defined by P.

The decoder 103 decodes the subset $M_{sub}$ constituted of the valid elements of the encoding vector M by solving Formula (E5) using a received reception vector Y', the received state vector U, an erasure vector E indicating erasure and reception of each element of the transmission vector Y in a transmission/reception section using codes "1" and "0", respectively, a Vandermonde matrix $V_R(k)$, and a Vandermonde matrix $W_R(k)$, and performs erasure correction.

[Expression 64]

$$(M \odot U)W_R(k) + (P \odot E)V_R(k) = Y'V_R(k) \quad \text{Formula (E5)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$g(X) = \Pi_{i=\{k,k+1,k+2,\ldots k+R-1\}}(X - \alpha_i)$$

$$RS(N,K); R = N-K, N = 2^n - 1$$

$$P = \{p_0, p_1, p_2, \ldots, p_{R-1}\}$$

$$Y = P$$

$$E = \{e_0, e_1, e_2, \ldots, e_{R-1} | e_i \in \{0,1\}\}$$

$$V_R(k) = \{v_{j,i} = \alpha_{i+k}^j | i,j = \{0,1,\ldots,R-1\}\}$$

$$W_R(k) = \{w_{j,i} = \alpha_{i+k}^{j+R} | i,j = \{0,1,\ldots,R-1\}\}$$

$$M_{sub} = \{m_i \in M | u_i = 1, u_i \in U\} \quad \text{[Expression 65]}$$

A sixth method will be described.

The encoder 101 calculates a coefficient vector P of a remainder polynomial of R symbols in a shortened code$_{shortened}$ RS (2R, R) of a Reed-Solomon code RS(N, K); R in a generating polynomial g(X) for products of elements of an encoding vector M of R symbols and a state vector U of R bits in which validity and invalidity of each element are indicated by codes "1" and "0", respectively, and transmits the state vector U along with a transmission vector Y defined by the encoding vector M, the state vector U, and the coefficient vector P.

The decoder 103 decodes the subset $M_{sub}$ constituted of valid elements of the encoding vector M by solving Formula (E6) using a received reception vector Y', the received state vector U, an erasure vector E indicating erasure and reception of each element of the transmission vector Y in a transmission/reception section using codes "1" and "0", respectively, and a matrix $Z_R(U)$ constituted of a matrix corresponding to $u_j=1$, where $u_j \in U$, of a Vandermonde matrix $W_R(k)$ and a row corresponding to $u_j=0$, where $u_j \in U$, of a Vandermonde matrix $V_R(k)$, and performs erasure correction.

[Expression 66]

$$(Y \odot E)Z_R + (P \odot U)V_R = Y'Z_R \quad \text{Formula (E6)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$g(X) = \Pi_{i=\{k,k+1,k+2,\ldots k+R-1\}}(X - \alpha_i)$$

$$RS(N,K); R = N-K, N = 2^n - 1$$

$$P = \{p_0, p_1, p_2, \ldots, p_{R-1}\}$$

$$Y = M \odot U + P \odot \overline{U}$$

$$E = \{e_0, e_1, e_2, \ldots, e_{R-1} | e_i \in \{0,1\}\}$$

$$W_R(k) = \{w_{j,i} = \alpha_{i+k}^{j+R} | i,j = \{0,1,\ldots,R-1\}\}$$

$$V_R(k) = \{v_{j,i} = \alpha_{i+k}^j | i,j = \{0,1,\ldots,R-1\}\}$$

$$M_{sub} = \{m_i \in M | u_i = 1, u_i \in U\} \quad \text{[Expression 67]}$$

A seventh method will be described.

The encoder 101 calculates a coefficient vector P of a remainder polynomial of R symbols in a shortened code$_{shortened}$ RS (2R, R) of a Reed-Solomon code RS(N, K); R in a generating polynomial g(X), a Vandermonde matrix $V_R(k)$, a Vandermonde matrix $W_R(k)$, and parity S for products of elements of an encoding vector M of R symbols and a state vector U of R bits in which validity and invalidity of each element are indicated using codes "1" and "0", respectively, and transmits a state vector U along with the transmission vector Y defined by the parity S.

The decoder 103 decodes the subset $M_{sub}$ constituted of valid elements of the encoding vector M by solving Formula (E7) using the received reception vector Y', the received state vector U, and an erasure vector E indicating erasure and reception of each element of the transmission vector Y in a transmission/reception section using codes "1" and "0", respectively, and performs erasure correction.

[Expression 68]

$$(M \odot U)W_R(k) + (S \odot E)I = Y' \quad \text{Formula (E7)}$$

where $$M = \{m_0, m_1, m_2, \ldots, m_{R-1} | m_i \in GF(2^n)\}$$

$U=\{u_0,u_1,u_2,\ldots,u_{R-1}|u_i\in\{0,1\}\}$ $M\odot U=\{m_0u_0,m_1u_1,m_2u_2,\ldots,m_{R-1}u_{R-1}|m_i\in M, u_i\in U\}$ $g(X)=\Pi_{i=\{k,k+1,k+2,\ldots k+R-1\}}(X-\alpha_i)$ $RS(N,K); R=N-K, N=2^n-1$ $P=\{p_0,p_1,p_2,\ldots,p_{R-1}\}$ $V_R(k)=\{v_{j,i}=\alpha_{i+k}{}^j|i,j=\{0,1,\ldots,R-1\}\}$ $W_R(k)=\{w_{j,i}=\alpha_{i+k}{}^{j+R}|i,j=\{0,1,\ldots,R-1\}\}$ $S=PV_R(k)$ $Y=S$ $E=\{e_0,e_1,e_2,\ldots,e_{R-1}|e_i\in\{0,1\}\}$ $M_{sub}=\{m_i\in M|u_i=1, u_i\in U\}$ [Expression 69]

An eighth method will be described.

The encoder 101 calculates a coefficient vector P of a remainder polynomial of R symbols in a shortened code$_{shortened}$ RS (2R, R) of a Reed-Solomon code RS(N, K); R in a generating polynomial g(X), a Vandermonde matrix $V_R(k)$, a Vandermonde matrix $W_R(k)$, and parity S for products of elements of an encoding vector M of R symbols and a state vector U of R bits in which validity and invalidity of each element are indicated using codes "1" and "0", respectively, and transmits the state vector U along with a transmission vector Y defined by the encoding vector M, the state vector U, and the parity S.

The decoder 103 decodes the subset $M_{sub}$ constituted of valid elements of the encoding vector M by solving formula (E8) using a received reception vector Y', the received state vector U, an erasure vector E indicating erasure and reception of each element of the transmission vector Y in a transmission/reception section using codes "1" and "0", respectively, and a matrix $Z_R{'}(U)$ constituted of a matrix corresponding to $u_j=1$, where $u_j\in U$, of the Vandermonde matrix $W_R(k)$ and a row corresponding to $u_j=0$, where $u_j\in U$, of a unit matrix I, and performs erasure correction.

[Expression 70]

$(Y\odot E)Z_R{'}(U)+(S\odot U)I=Y'Z_R{'}(U)$  Formula (E8)

where $M=\{m_0,m_1,m_2,\ldots,m_{R-1}|m_i\in GF(2^n)\}$ $U=\{u_0,u_1,u_2,\ldots,u_{R-1}|u_i\in\{0,1\}\}$ $M\odot U=\{m_0u_0,m_1u_1,m_2u_2,\ldots,m_{R-1}u_{R-1}|m_i\in M, u_i\in U\}$ $g(X)=\Pi_{i=\{k,k+1,k+2,\ldots k+R-1\}}(X-\alpha_i)$ $RS(N,K); R=N-K, N=2^n-1$ $P=\{p_0,p_1,p_2,\ldots,p_{R-1}\}$ $V_R(k)=\{v_{j,i}=\alpha_{i+k}{}^j|i,j=\{0,1,\ldots,R-1\}\}$ $W_R(k)=\{w_{j,i}=\alpha_{i+k}{}^{j+R}|i,j=\{0,1,\ldots,R-1\}\}$ $S=PV_R(k)$ $Y=M\odot U+S\odot\overline{U}$ $E=\{e_0,e_1,e_2,\ldots,e_{R-1}|e_i\in\{0,1\}\}$ $M_{sub}=\{m_i\in M|u_i=1, u_i\in U\}$ [Expression 71]

Eighth Embodiment

Figure 9:
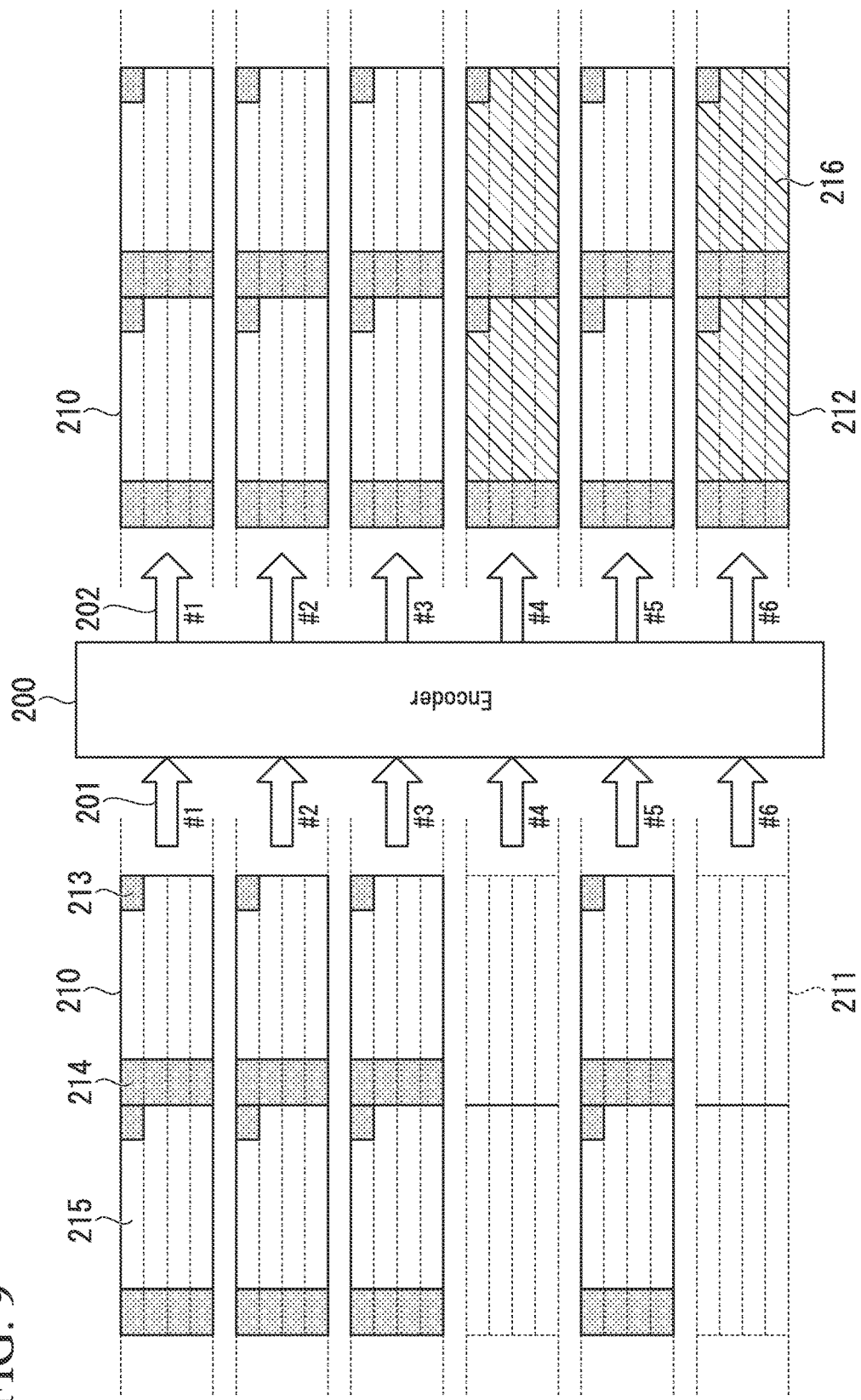
FIG. 9 shows a configuration of an encoding unit in a transmission end of OTN multi-lane.
Figure 10:
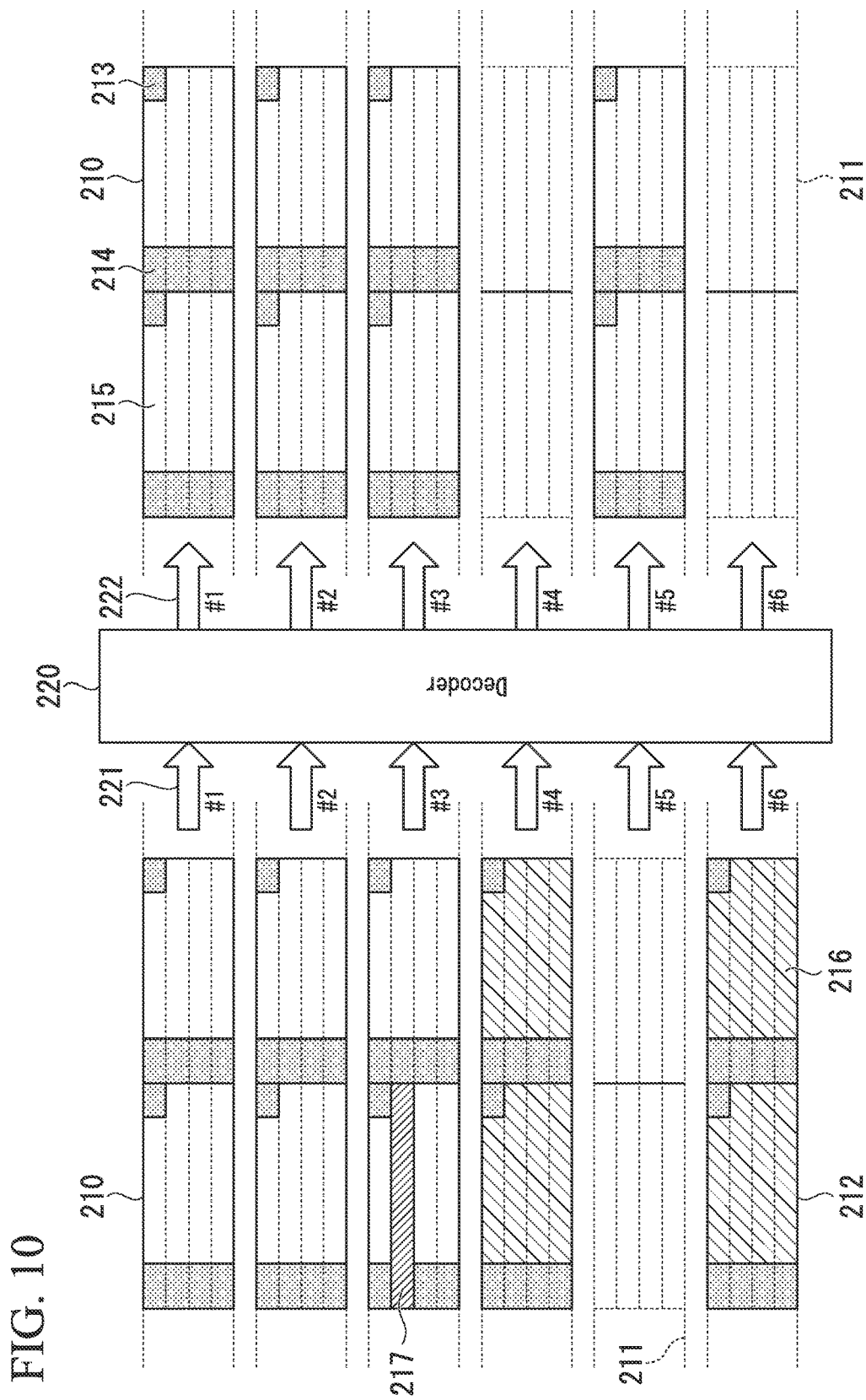
FIG. 10 shows a configuration of a decoding unit in a reception end of the OTN multi-lane.

The present embodiment shows an example in which an encoding scheme of the present invention is applied to multi-lane transmission of OTN. FIGS. 9 and 10 illustrate configurations of an encoding unit in a transmitting end of an OTN multi-lane and a decoding unit in a receiving end, respectively. Although the present embodiment shows the case in which the number of lanes is 6, the number of the lanes may be any number that is greater than or equal to 2.

In FIG. 9, an OTN-compliant encoder 200 inputs frames to be encoded from OTN inputs 201 of six lanes and outputs encoded frames from OTN outputs 202 of six lanes. An OTN frame 210 is input to each OTN input 201 or an invalid signal 211 is input thereto. The OTN frame 210 is constituted of a frame alignment signal (FAS) signal 213, FEC information 214, and a region 215. In the encoder 200, the OTN frame 210 is output from a corresponding OTN output 202 therethrough without change if the OTN frame 210 is input to the OTN input 201. In contrast, a parity frame 212 conforming to the OTN is output from an OTN output 202 corresponding to the OTN input 201 of the invalid signal 211. The parity frame 212 is constituted of an FAS signal 213, FEC information 214, and parity 216.

In FIG. 10, an OTN-compliant decoder 220 inputs encoded frames from OTN inputs 221 of six lanes and outputs original OTN frames from OTN outputs 222 of six lanes. An OTN frame 210 or a parity frame 212 is input to each OTN input 221 or an invalid signal 211 is input thereto if a normal frame is not received due to a failure or the like. In addition, if information 217 which is not corrected by using the FEC information 214 is included in a frame, the frame may be treated as the invalid signal 211. The decoder 220 decodes information of a lane which is the invalid signal 211 from the OTN frame 210 or the parity frame 212 which is received normally, reproduces each OTN input 201 at the transmitting end, and outputs each reproduced OTN input 201.

Figure 11:
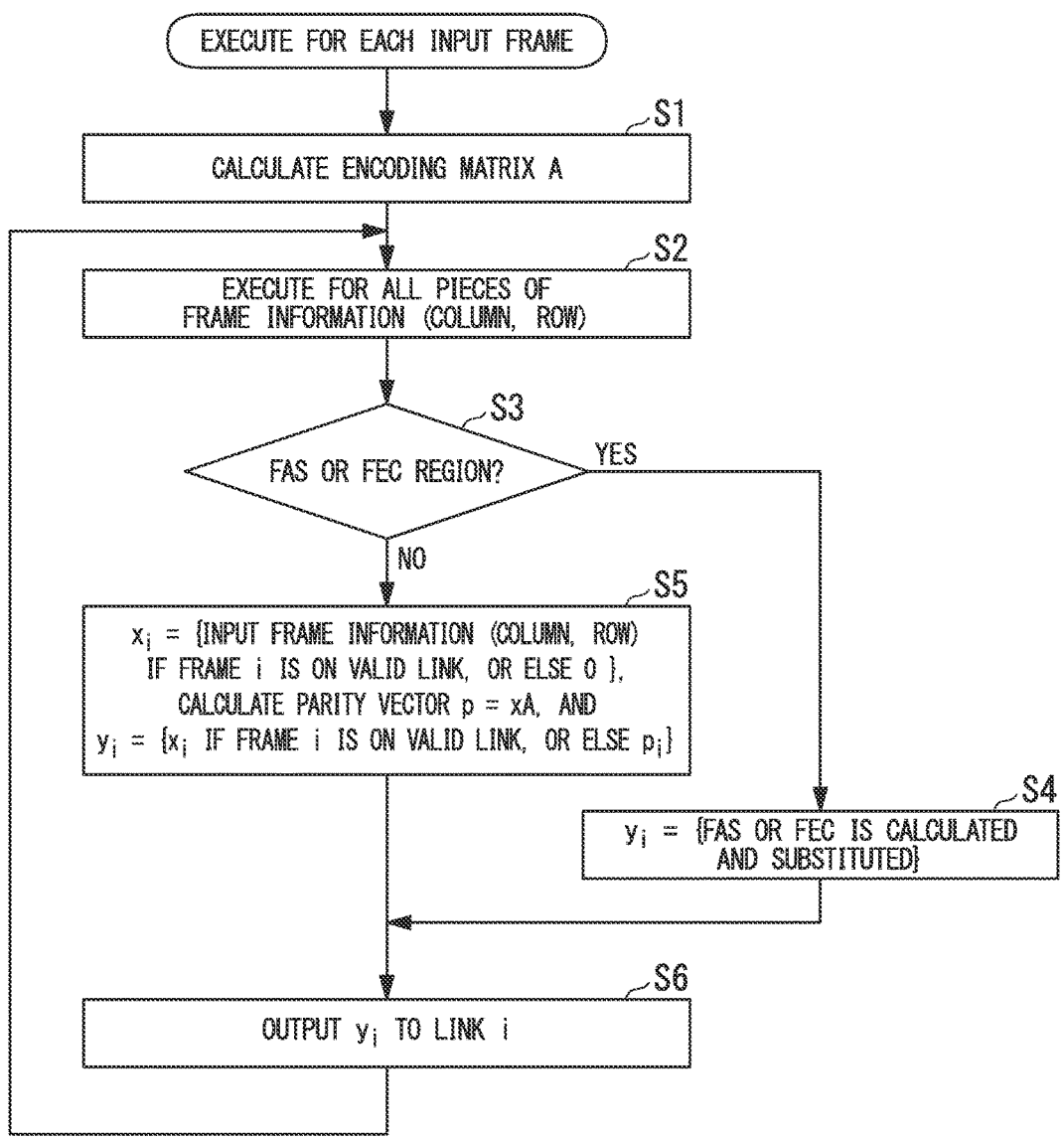
FIG. 11 is a flowchart showing a frame processing procedure in the encoder.
Figure 12:
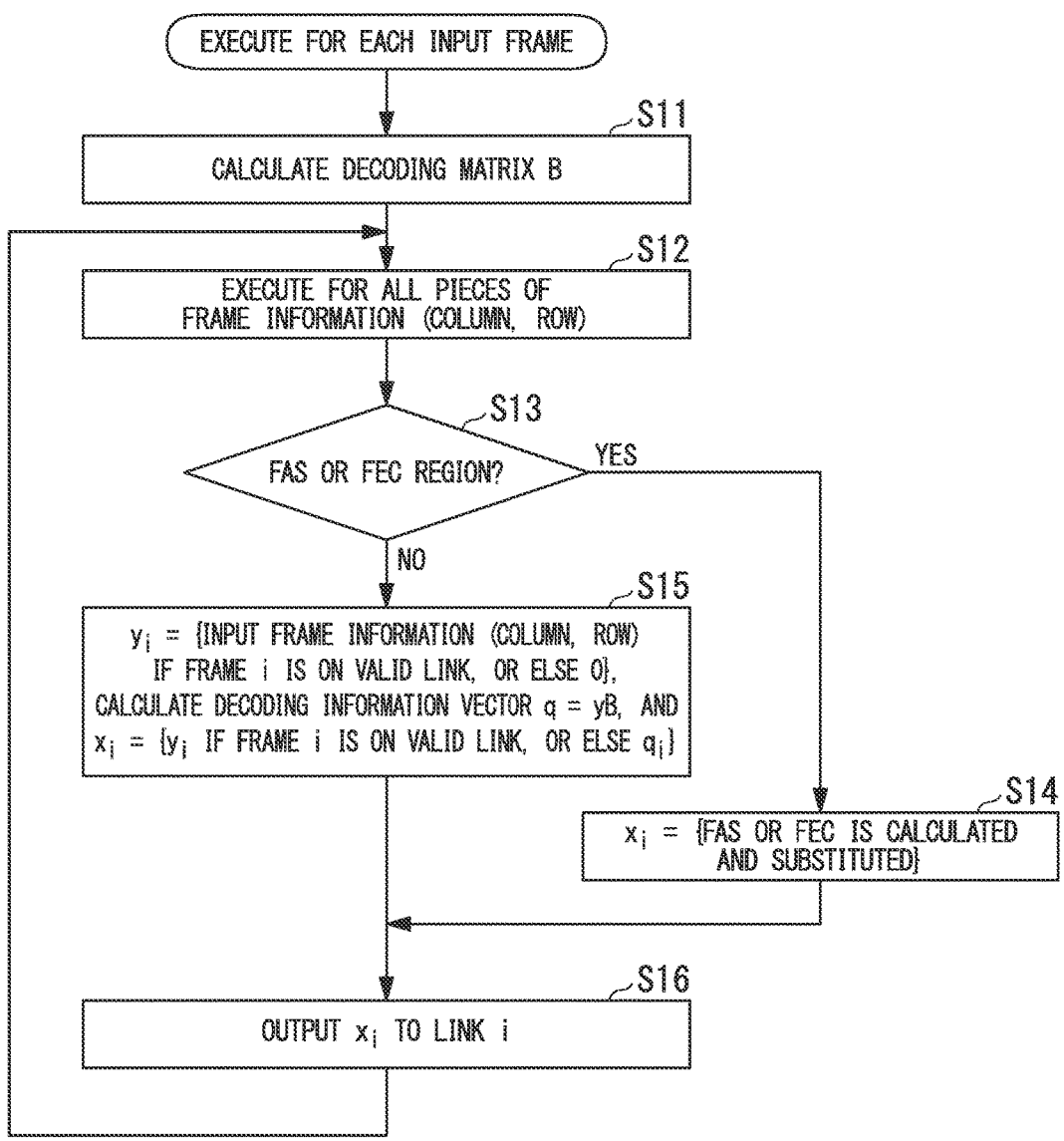
FIG. 12 is a flowchart showing a frame processing procedure in the decoder.

FIGS. 11 and 12 are flowcharts showing frame processing procedures in the encoder 200 and the decoder 220, respectively.

A frame processing procedure in the encoder 200 will be described with reference to FIG. 11. The encoder 200 generates an encoding matrix A constituting an MDS code of a coding rate of 0.5 such as a Reed-Solomon code or a Cauchy Reed-Solomon code from information of an input situation of the OTN frame 210 or the invalid signal 211 of each lane (step S1). The encoder 200 executes the following process on all pieces of frame information (column, row) in each lane (step S2). The encoder 200 determines whether a region within frame information (column, row) is the FAS signal 213 or the FEC information 214 (an FAS or FEC region) (step S3). The encoder 200 generates information in accordance with OTN standard specifications in relation to the FAS or FEC region (the determination result of step S3 is Yes) (step S4). In relation to the other region 215 of the frame information (column, row) (the determination result of step S3 is No), the encoder 200 calculates a product of a vector x constituted of frame information (column, row) of an input of a valid OTN frame 210 or 0 (in the case of the input of the invalid signal 211) and the encoding matrix A, and designates a product xA as a parity vector p (step S5). The encoder 200 sets original frame information (column, row) as a vector y for an OTN output 202 corresponding to an input of a valid OTN frame 210, and sets the parity vector p as the vector y for an OTN output 202 corresponding to an input of an invalid signal 211 (step S5). The encoder 200 outputs the vector y to a link (step S6). Thereby, the original frame information (column, row) is output to the OTN output 202 corresponding to the input of the valid OTN frame 210 and elements of the parity vector p are output to the OTN output 202 corresponding to the input of the invalid signal 211.

A frame processing procedure in the decoder 220 will be described with reference to FIG. 12. The decoder 220 generates a decoding matrix B from information of an input situation of the OTN frame 210, the parity frame 212, or the invalid signal 211 in each lane (step S11). The decoder 220 executes the following process on all pieces of frame information (column, row) of each lane (step S12). The decoder 220 determines whether a region within frame information (column, row) is an FAS signal 213 or FEC information 214 (an FAS or FEC region) (step S13). The decoder 220 generates information in accordance with OTN standard specifications in relation to the FAS or FEC region (the determination result of step S13 is Yes) (step S14). In relation to the other region (the determination result of step S13 is No), the decoder 220 calculates a product of a vector y constituted of frame information (column, row) of a valid OTN frame 210 or a parity frame 212 or 0 (in the case of the input of the invalid signal 211) and the decoding matrix B, and designates a product yB as a decoded information vector q (step S15). The decoder 220 sets the vector y as a vector x for a lane to which the valid OTN frame 210 is input, and sets the decoding information vector q as the vector x for a lane in which the invalid signal 211 is input due to a failure, rather than the valid OTN frame 210 (step S15). The decoder 220 outputs the vector x to the link (step S16). Thereby, with respect to a lane to which the valid OTN frame 210 is input, the OTN frame 210 is output without change, elements of the decoding information vector q are output to the lane in which the invalid signal 211 is input due to a failure, rather than the valid OTN frame 210, and the others are set as invalid signals 211. In this manner, the decoder 220 reproduces each OTN input 201 in the transmitting end and outputs each reproduced OTN input 201.

In this manner, the system of the present embodiment is a parallel transmission system which generates an OTU frame 210 for each lane, transmits externally input data to be transmitted to parallel transmission media, extracts the data to be transmitted from OTU frames 210 transmitted through a plurality of lanes, and externally outputs the extracted data to be transmitted. The plurality of lanes are classified into a symbol lane and a parity lane.

For the symbol lane, the encoder 200 stores divided data to be transmitted in an OPU/ODU payload and transmits an OTU frame conforming to ITU-T G.709. For the parity lane, the encoder 200 sets symbols of the same rows and the same columns of symbol lanes as valid elements, stores correspondence elements of a transmission vector obtained by encoding in a region other than the frame alignment signal (FAS) signal 213 and the FEC information 214, stores values conforming to ITU-T G.709 in the regions of the FAS signal 213 and the FEC information 214, and performs transmission.

The decoder 220 extracts the data to be transmitted included in the OPU/ODU payload for an OTU frame 210 included in a normally received symbol lane among OTU frames 210 transmitted through a plurality of lanes, and externally outputs the extracted data to be transmitted. In addition, for a symbol lane in which an error has been detected through detection of loss-of-frame (LOF), detection of an error correction limit using the FEC, error detection using bit interleaved parity (BIP), or the like, the decoder 220 restores the OPU/ODU payload included in the symbol lane in which the error has been detected through erasure correction extracts the data to be transmitted, and externally outputs the extracted data to be transmitted.

Ninth Embodiment

Figure 13:
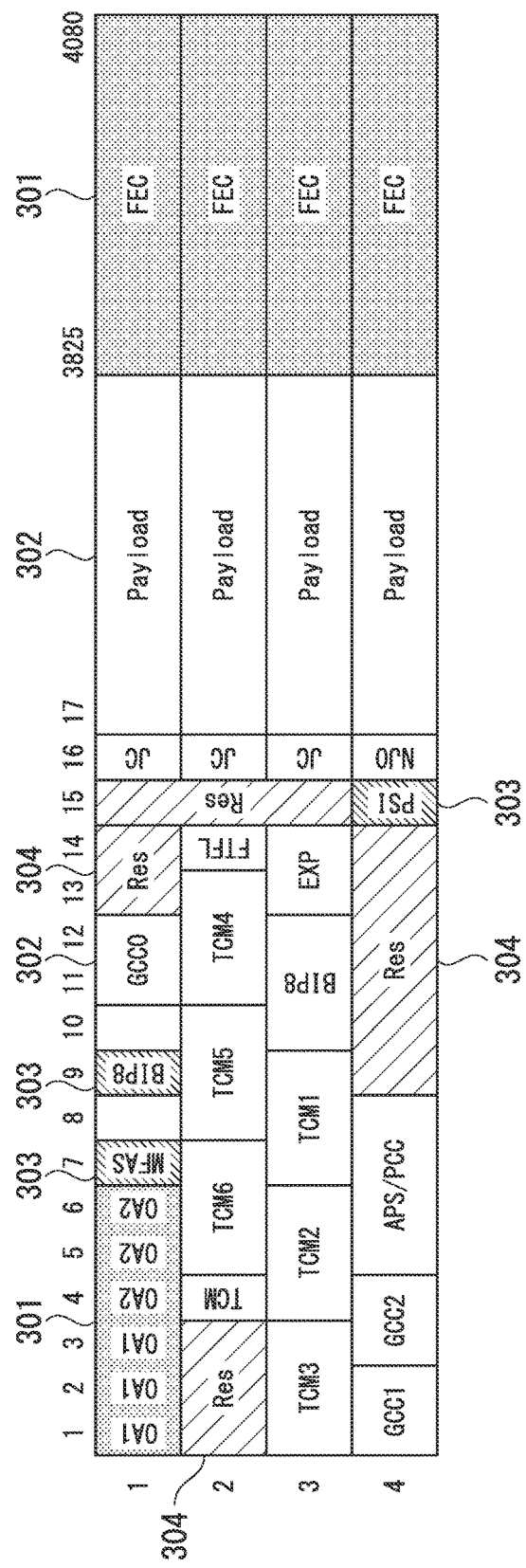
FIG. 13 shows an example of an OTN frame when a standard OTN frame is defined as a payload type.
Figure 14:
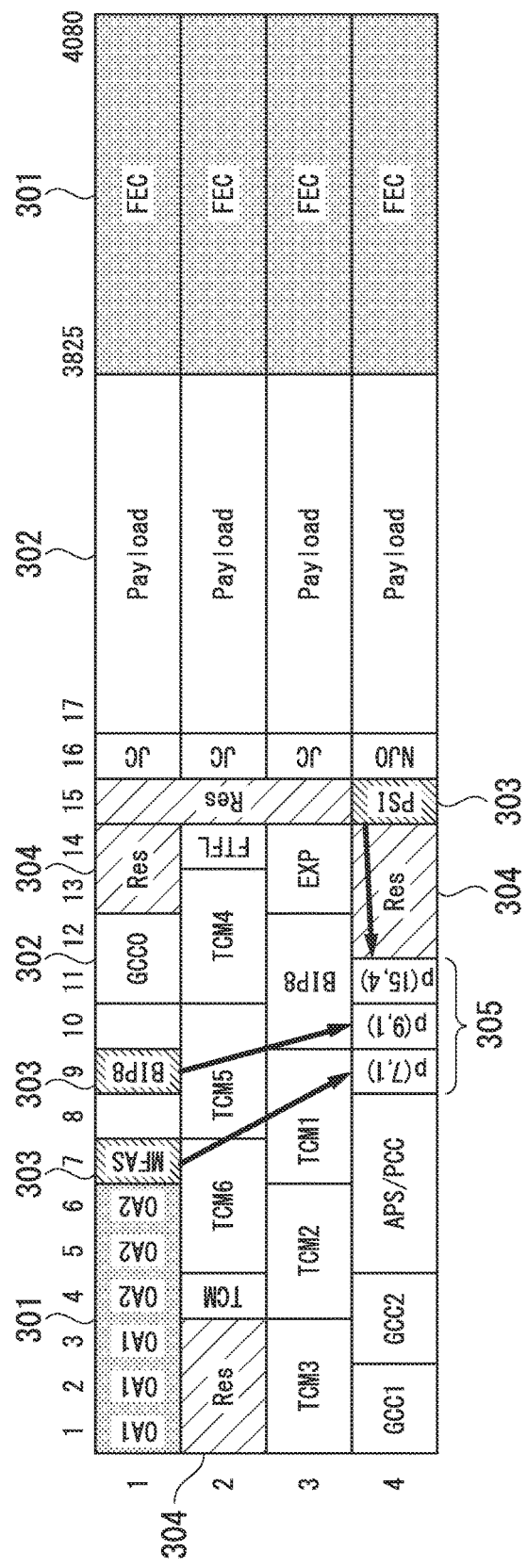
FIG. 14 shows an example of an OTN frame when a parity frame is defined as a payload type.

The present embodiment shows an example in which the encoding scheme of the present invention is applied to multi-lane transmission of the OTN when an existing parity frame is defined as a payload type. FIGS. 13 and 14 shows examples of OTN frames when a standard OTN frame and the parity frame are defined as payload types, respectively.

An OTN frame is constituted of 4080×4 bytes. Because FAS (OA1, OA2) and FEC regions 301 are essential to recognize the frame and the FAS and FEC regions 301 are regions which do not need to be protected by encoding, values conforming to the standard OTN is assumed to be set even in the parity frame. In protected regions 302, parity is generated in accordance with a procedure similar to that of the eighth embodiment and encoded information is stored in this region of the parity frame. Although protected regions 303 which are essential to identify a payload type and are essential to obtain multi-lane information using a multi-frame alignment signal (MFAS) needs to be protected through encoding, the protected regions 303 are regions in the parity frame that cannot store encoded information. In contrast, because reserved regions 304 are not essential regions for recognizing a frame, it is possible to perform protection for a valid OTN frame through encoding by storing information of a storage region 305 in which encoded information for the protected regions 303 is stored as part of the reserved regions 304.

The identification of the parity frame is performed using a payload type (PT) byte (payload structure identification (PSI) region {15, 4}, MFAS=0). Mapping information for the storage region 305 in which the encoded information for the protected regions 303 is stored may be transmitted through multi-frame transfer of the PSI region {15, 4} when MFAS≠0.

Table 1 represents mapping information for FIG. 14. It is possible to set and update storage information without using an external communication means by performing multi-frame transfer of the information of Table 1 using the MFAS.

TABLE 1

| Row number | Protected region 303 | Storage region 305 |
|---|---|---|
| 1 | (7, 1) | (9, 4) |
| 2 | (9, 1) | (10, 4) |
| 3 | (15, 4) | (11, 4) |
| 4 | #END | #END |

In this manner, in the present embodiment, a symbol lane is identified by referring to a PSI value defined in ITU-T G.709.

In relation to the protected regions 303, which are partial regions of an overhead (OH) defined in ITU-T G.709 within each parity lane, a transmission vector corresponding to the protected regions 303 is stored in the storage region 305, which is an OH region within the same parity lane, and values conforming to ITU-T G.709 are stored in the protected regions 303. In addition, when an OPU/ODU payload included in a symbol lane in which abnormality has been detected is restored, information of the storage region 305 in each parity lane is used for restoration of the protected regions 303.

The protected regions 303 include at least a multi-frame alignment signal (MFAS) and a PSI defined in ITU-T G.709. Through multi-frame transfer using the MFAS, information on the positions of the protected regions 303 and the storage region 305 within a frame is transmitted and the information on the positions within the frame is used when the OPU/ODU payload included in the symbol lane in which the abnormality has been detected is restored.

When a format different from that of the OTU frame is adopted for a lane in which the parity is transmitted, hybrid implementation in which a reception circuit and a synchronization circuit dedicated to a parity lane are used is performed because it is impossible to use the reception circuit and the synchronization circuit of the standard OTU frame. In contrast, in the present embodiment, a minimum region necessary for recognition of the OTU frame conforms to the standard OTU frame even in the parity lane. Thereby, the reception circuit and the synchronization circuit of the OTU frame can be shared and a configuration of a compact framer reception circuit is possible.

Tenth Embodiment

Figure 15:
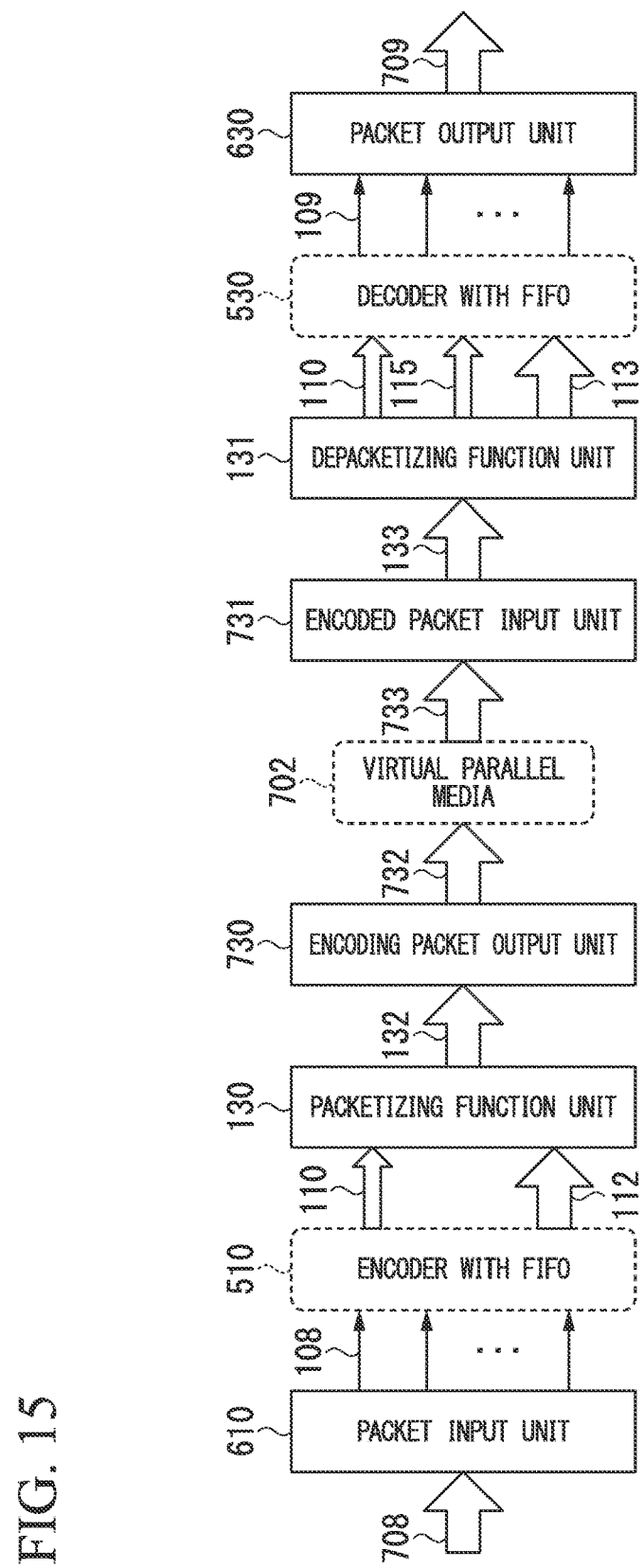
FIG. 15 is a block diagram showing a configuration of a redundant transmission system in accordance with a tenth embodiment of the present invention.

In the present embodiment, a redundant transmission system when a transmission section is connected through virtual parallel media will be described. FIG. 15 is a block diagram showing a configuration of the redundant transmission system. In FIG. 15, virtual parallel media 702 form parallel logical paths created within a physical medium through encapsulation such as a virtual local area network (VLAN), a point-to-point protocol over Ethernet (registered trademark) (PPPoE), or generic routing encapsulation (GRE).

A packet 708 to be transmitted is input to a packet input unit 610 and accumulated in an internal buffer. The packet input unit 610 divides the accumulated packet 708 to be transmitted into units each having a predetermined length (e.g., a predetermined number of bytes) or into time slots (TSs) for each given interval. Furthermore, the packet input unit 610 distributes/divides packets within the same time slot into systems equal in number to the number of parallelism of the encoder 510 with the FIFO (see the fifth and sixth embodiments) to generate input parallel data 108. The packetizing function unit 130 (see the sixth embodiment) packetizes data encoded by the encoder 510 with the FIFO to generate an input (Wp(t)) 132 for an encoded packet output unit 730. The encoded packet output unit 730 performs encapsulation including information for identifying and separating lanes and time slots for each lane and outputs an encapsulated packet 732 to the virtual parallel media 702 in order of lane number.

Based on the identification/separation information included in the encapsulated information, an encoded packet input unit 731 separates a packet 733 transmitted through the virtual parallel media 702 for each lane, aligns the separated encapsulated packets for each time slot to generate an input (Rp(t)) 133 for the depacketizing function unit 131. The depacketizing function unit 131 and the decoder 530 with the FIFO generate output parallel data 109 by performing decoding described in the sixth embodiment. A packet output unit 630 reconfigures a packet 709 to be transmitted from the output parallel data 109 and outputs the packet 709 to be transmitted.

Eleventh Embodiment

In the present embodiment, a specific example of a method related to distributing/dividing of packets within a time slot in the packet input unit 610 in FIG. 15 and a specific example of a method related to concatenation of packets in the packet output unit 630 will be described using FIGS. 16 and 17.

Figure 16:
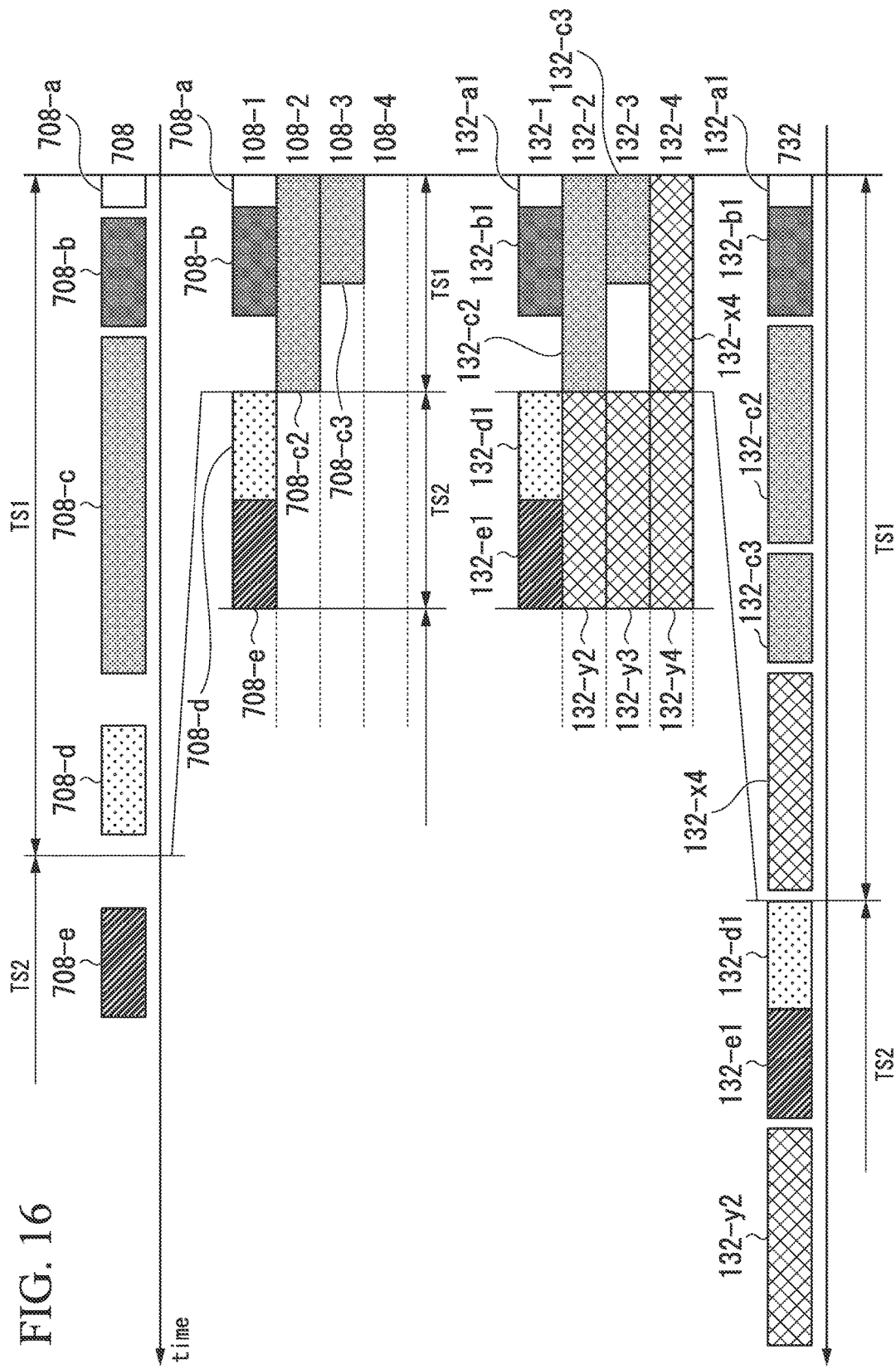
FIG. 16 shows a specific example of a method related to distributing/dividing of packets within a time slot in a packet input unit.

FIG. 16 assumes that packets 708-*a*, 708-*b*, 708-*c*, and 708-*d* to be transmitted arrive as packets 708 to be transmitted in a period of a time slot TS1 and a packet 708-*e* to be transmitted arrives in a period of a time slot TS2.

The packet input unit 610 distributes/divides packets within the same time slot into systems equal in number to the number of parallelism of the encoder 510 with the FIFO. In FIG. 16, the number of parallelism is assumed to be four. In the time slot TS1, the packet input unit 610 distributes the packets 708-*a* and 708*b* to be transmitted as input parallel data 108-1, distributes a packet 708-*c2* to be transmitted as input parallel data 108-2, and distributes a packet 708-*c3* to be transmitted as input parallel data 108-3. In the time slot TS2, the packet input unit 610 distributes the packets 708-*d* and 708*e* to be transmitted as the input parallel data 108-1.

In the time slot TS1, the packetizing function unit 130 outputs packets 132-a1 and 132-b1 as Wp(t) 132-1, outputs a packet 132-c2 as Wp(t) 132-2, outputs a packet 132-c3 as Wp(t) 132-3, and outputs a redundant packet 132-x4 as Wp(t) 132-4. In the time slot TS2, the packetizing function unit 130 outputs packets 132-d1 and 132-e1 as the Wp(t) 132-1, outputs a redundant packet 132-y2 as the Wp(t) 132-2, outputs a redundant packet 132-y3 as the Wp(t) 132-3, and outputs a redundant packet 132-y4 as the Wp(t) 132-4.

[First Distributing/Dividing Method]

In this method, the packet input unit 610 optimizes a packet distribution so that the number of lanes in which there is no packet is maximized. Like the packets 708-*a* and 708-*b* to be transmitted, a plurality of packets may be distributed to the same lane (see the input parallel data 108-1 of FIG. 16). Although this optimization is equivalent to a bin packing problem and it belongs to NP-hard, there is an efficient approximation algorithm. This algorithm, for example, is disclosed in <Albers, S. and Mitzenmacher, M. "Average-Case Analyses of First Fit and Random Fit Bin Packing", Random Structures Alg. 16, 240 to 259, 2000.> (Reference Document 1).

[Second Distributing/Dividing Method]

In this method, the packet input unit 610 distributes a packet to another time slot different from a time slot in which the packet is to be allocated so that the number of lanes in which there is no packet becomes at least minimum degree of redundancy rmin. In FIG. 16, rmin=1 is assumed. Because the number of lanes in which there is no packet becomes 0 if the packet 708-*d* to be transmitted is allocated as input parallel data 108-4 of the time slot TS1, the packet 708-*d* to be transmitted is allocated as the input parallel data 108-1 of the time slot TS2.

[Third Distributing/Dividing Method]

In this method, when a packet length of a packet is greater than a data length of one time slot of one lane, the packet input unit 610 divides the packet into a plurality of packets each having a length less than or equal to the data length of one time slot and distributes the plurality of divided packets to different lanes. In FIG. 16, the packet 708-c to be transmitted is divided into the two packets 708-c2 and 708-c3 to be transmitted.

The above-described distributing/dividing methods may be appropriately combined. In the combinations of all the distributing/dividing methods, the number of redundant packets in each time slot may be limited to maximum degree of redundancy rmax at the highest. In FIG. 16, rmax=1 is assumed. FIG. 16 shows the case in which the encoded packet output unit 730 discards the redundant packets 132-y3 and 132-y4 in accordance with this limit. Therefore, the encoded packet output unit 730 outputs the packets 132-a1, 132-b1, 132-c2, and 132-c3, and the redundant packet 132-x4 in the time slot TS1 and outputs the packets 132-d1 and 132-e1 and the redundant packet 132-y2 in the time slot TS2.

Figure 17:
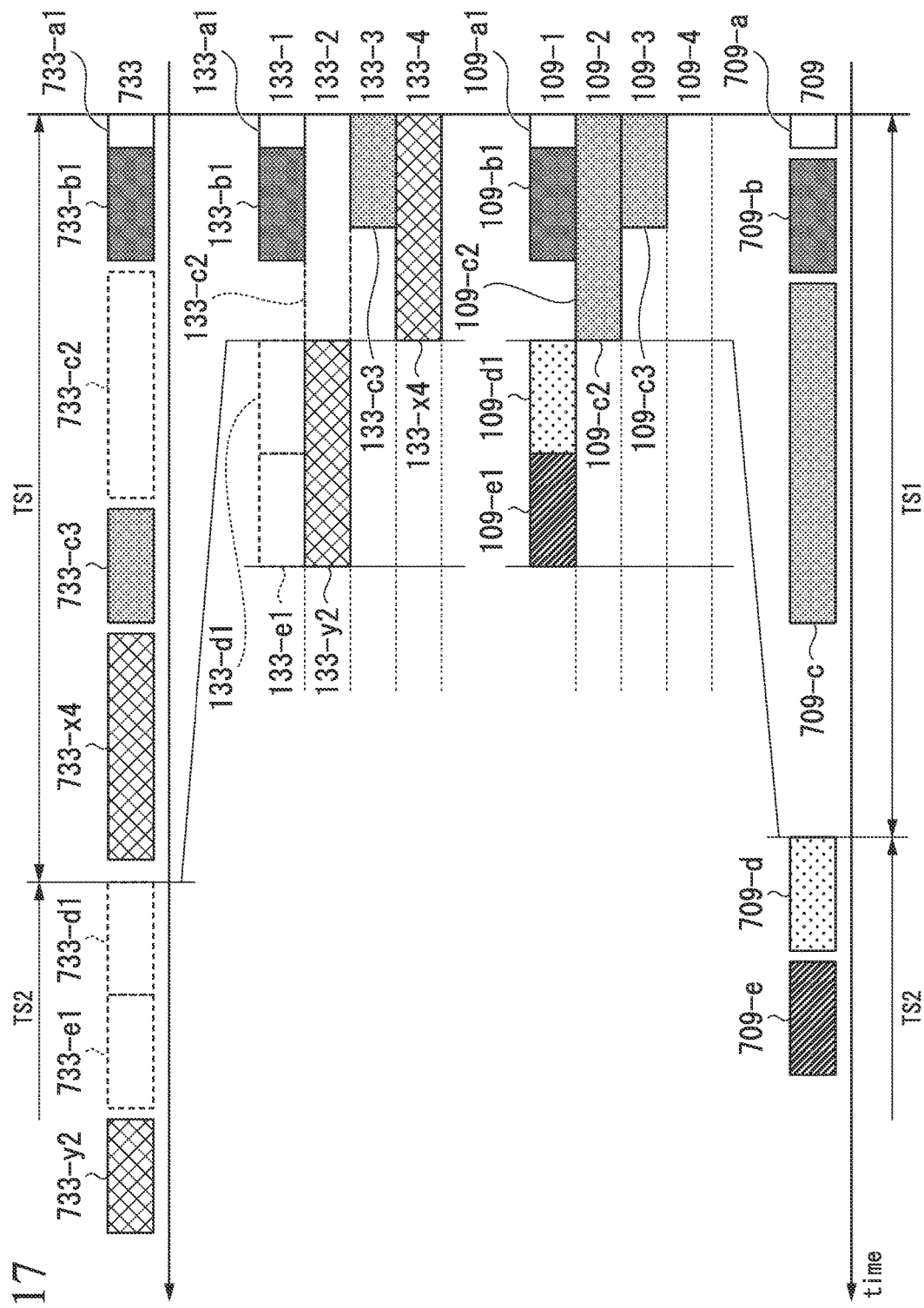
FIG. 17 shows a specific example of a method related to concatenation of packets in a packet output unit.

FIG. 17 shows a state of packet decoding. In the time slot TS1, packets 733-a1, 733-b1, and 733-c3 and a redundant packet 733-x4 are output from the virtual parallel media 702. In the time slot TS2, a redundant packet 733-y2 is output from the virtual parallel media 702. Here, packets 733-c2, 733-d1, and 733-e1 are assumed to be lost in the virtual parallel media 702.

The encoded packet input unit 731 separates each packet for each lane based on the identification/separation information included in the encapsulated information. In FIG. 17, packets 133-a1 and 133-b1 are output as Rp(t) 133-1, a packet 133-c3 is output as Rp(t) 133-3, and a redundant packet 133-x4 is output as Rp(t) 133-4. In addition, in the time slot TS2, a redundant packet 133-y2 is output as Rp(t) 133-2. It is to be noted that because the packets 733-c2, 733-d1, and 733-e1 are lost, packets 133-c2, 133-d1, and 133-e1 are not output. Because the redundant packets 133-x4 and 133-y2 are received in the time slots TS1 and TS2, respectively, restoration for one lane is possible in each time slot.

In the time slot TS1, the decoder 530 with the FIFO outputs packets 109-a1 and 109-b1 as output parallel data 109-1, outputs a packet 109-c2 as output parallel data 109-2, and outputs a packet 109-c3 as output parallel data 109-3. In the time slot TS2, the decoder 530 with the FIFO outputs packets 109-d1 and 109-e1 as the output parallel data 109-1. The packets 109-c2, 109-d1, and 109-e1 represent packets restored by the decoder 530 with the FIFO.

The packet output unit 630 concatenates and outputs the packets 109-c2 and 109-c3 divided in accordance with the third distributing/dividing method. Therefore, the packet output unit 630 outputs packets 709-a, 709-b, and 709-c in the time slot TS1, and outputs packets 709-d and 709-e in the time slot TS2.

Next, the twelfth to twentieth embodiments of the present invention will be described. In the present Description, a binary operator symbol "*" of vectors X and Y is defined as a product of elements of the vectors. For example, the vectors X and Y are denoted as shown in the following Formulas (11).

$$X=\{x_0,x_1,x_2,\ldots,x_{n-1}\}, Y=\{y_0,y_1,y_2,\ldots,y_{n-1}\} \quad (11)$$

In this case, a vector Z which is products of the elements of the vectors X and Y is represented by the following Formula (12).

$$Z=X*Y=\{x_0y_0,x_1y_1,x_2y_2,\ldots,x_{n-1}y_{n-1}\} \quad (12)$$

[Basic Principles of Twelfth to Twentieth Embodiments of the Present Invention]

Redundant packet transmission systems in accordance with the twelfth to twentieth embodiments are configured to include a transmitter which is a transmitting end and a receiver which is a receiving end. In the twelfth to twentieth embodiments, a data block is referred to as a packet. Encoding used in the redundant packet transmission systems of the twelfth to twentieth embodiments, for example, uses a (2V, V) block code belonging to a maximum distance separable code (MDS) code such as a Cauchy Reed-Solomon code (hereinafter referred to as a "CRS code"). In the (2V, V) block code, erasure correction of V symbols is possible. That is, the redundant packet transmission systems of the twelfth to twentieth embodiments perform encoding in which a data length is equal to a parity length.

It is to be noted that the CRS code, for example, is disclosed in Non-Patent Document 3.

In addition, the MDS code, for example, is disclosed in Non-Patent Document 4.

As a general feature of the MDS code (2V, V), it is possible to restore V pieces of original data using V pieces of information arbitrarily selected from 2V pieces of data and parity. This corresponds to a process in which a receiver solves V simultaneous linear equations in which V pieces of original data are unknown variables and the selected V pieces of information are known variables.

Here, when a matrix such as a CRS code in which a sub-matrix of an arbitrary parity generator matrix also constitutes an MDS code is used, the remaining V-k unknown variables are obtained by solving V-k known variables and V-k equations if k values among data serving as unknown variables can be acquired by using another means. In other words, this means that it is acceptable that even k pieces of information among the selected V pieces of information are erased.

In the information transmission, information to be transmitted corresponds to V-k unknown variables, information to be actually sent corresponds to V pieces of information selected from data and parity, and received information corresponds to known variables. Even if k pieces of information are erased in the transmission, it is possible to restore erased information by solving V-k simultaneous linear equations from the remaining received information.

The transmitters of the twelfth to twentieth embodiments have input and output buffers arranged in two dimensions (H, V) in which H (H is an integer greater than or equal to 1) pieces in a column direction and V (V is an integer greater than or equal to 2) pieces in a row direction are arranged. Each of the input and output buffers is a fixed length buffer having a buffer length L and can store L symbols. The transmitter sets packets to be transmitted (data to be transmitted) in the input buffers in order of column-row in chronological order and sets an invalid symbol (generally 0) in an input buffer of a time at which no packet has been input. The transmitter performs encoding for each symbol stream in which symbol positions from the heads of input buffers of the same column are identical. The transmitter selects V symbols from among V information symbols and V parity symbols set in the input buffers in accordance with selection information SI of whether to select data or parity, and accommodates the V symbols in symbols of the output buffers. For example, the transmitter sets a symbol which is set in an input buffer in an output buffer at the same two-dimensional position while maintaining its symbol position and then sets parity generated by the encoding in an output buffer at the same symbol position as the symbol position at which an invalid symbol is set in an input buffer. The transmitter packetizes symbols for each output buffer and sends the packetized symbols.

The receiver has reception buffers arranged in the two dimensions (H, V). Each reception buffer has the same size as the fixed length buffers of the transmitter. The receiver sets received packets in the reception buffers. Like encoding in the transmitter, decoding in the receiver is performed for each symbol stream in which symbol positions from the heads of reception buffers of the same column are identical.

As described above, the transmitters of the twelfth to twentieth embodiments write an invalid symbol (generally 0 and used as a known value) to a fixed length input buffer corresponding to a time at which a packet to be transmitted has not arrived. Then, in order to apply the above-described principle, the transmitter adds, to a transmission packet, data validity information $U_x(i)$ indicating a symbol position of valid data in each column and selection information $SI_x(i)$ indicating whether a symbol of a packet to be transmitted is set as each symbol in each column or whether a parity symbol is set as each symbol in each column and notifies the receiver of the transmission packet (i=1, 2, . . . , L).

The receiver detects a loss packet and acquires loss packet information $E_x(i)$ indicating a lost packet in each column. The receiver restores the lost packet to be transmitted by solving simultaneous linear equations of a Galois field constituted of a symbol column of a received packet, the data validity information $U_x(i)$, the selection information $SI_x(i)$, the loss packet information $E_x(i)$, and a matrix used when the transmitter performs encoding. That is, the receiver restores unknown variables (information to be transmitted) by setting the above-described unknown variables from the loss packet information $E_x(i)$ and the data validity information $U_x(i)$, setting the above-described known information from the loss packet information $E_x(i)$ and the reception packet, and solving simultaneous linear equations for each symbol column.

Hereinafter, embodiments based on the above-described basic principles will be described.

Twelfth Embodiment

First, the principle of a redundant packet transmission system of the present embodiment will be described. The transmitter in the redundant packet transmission system of the present embodiment includes input buffers BUFin(x, y) arranged in two dimensions of a column (lateral) direction (x) and a row (longitudinal) direction (y) (x is an integer greater than or equal to 1 and less than or equal to H and y is an integer greater than or equal to 1 and less than or equal to V). Each input buffer BUFin(x, y) has a fixed length L. Here, the case in which the input buffers BUFin(x, y) are two-dimensionally arranged so that a column number increases in a direction from the right to the left and a row number increases in a direction from the top to the bottom will be described.

The transmitter writes received packets to be transmitted to the input buffer BUFin(x, y) from the top to the bottom of the same column in accordance with arrival times of the packets to be transmitted, writes the received packets to be transmitted to the input buffer BUFin(x, y) from an upper end of a left adjacent column when a lower end is reached, and writes 0 to an input buffer BUFin(x, y) corresponding to a time at which a packet to be transmitted has not arrived. Through the following Formula (13), the transmitter generates parity in units of the same symbol BUFin(x, y)[k] (k={1, 2, . . . , L}) of each column using a parity generator matrix A belonging to an MDS code of a Galois field of a coding rate of 0.5, setting data $M_x(k)$, and data validity information $U_x(k)$. It is to be noted that k represents a symbol position and BUFin(x, y)[k] represents a $k^{th}$ symbol of the input buffer BUFin(x, y).

[Expression 72]

$$M_x(k) := \{m_j \mid m_j := BUFin(x, j)[k], j = \{1, 2, \ldots, V\}\} \quad (13)$$

$$U_x(k) := \left\{u_j \mid u_j := \begin{cases} 0 & \text{if } BUFin(x, j)[k] = \emptyset \\ 1 & \text{if } BUFin(x, j)[k] \neq \emptyset \end{cases}, j = \{1, 2, \ldots, V\}\right\}$$

$$S_x(k) := (M_x(k) * U_x(k))A$$

$$\text{Parity}(x, y) := \{p_i \mid p_i := S_x(i)[y], i = \{1, 2, \ldots, L\}\}$$

In Formula (13), ":=" represents that a left side is defined by a right side. $M_x(k)$ represent a $k^{th}$ symbol of rows 1 to V of a column x, and $m_j$ represents a $k^{th}$ symbol of the column x and the row j. $U_x(k)$ indicates whether the $k^{th}$ symbol of the rows 1 to V of the column x is valid, and $u_j$ is 1 if the $k^{th}$ symbol of the column x and the row j is a valid symbol (a symbol set based on a packet to be transmitted) and is 0 if the $k^{th}$ symbol of the column x and the row j is an invalid symbol. Parity $S_x(k)$ is parity generated from the $k^{th}$ symbol of the rows 1 to V of the column x. Parity(x, y) is parity of the symbol BUFin(x, y), and is parity in which values (symbols) of a $y^{th}$ row of the plurality of pieces of parity $S_x(k)$ generated for $1^{st}$ to $L^{th}$ symbols are arranged.

The transmitter further includes output buffers BUFout(x, y) two-dimensionally arranged in a column direction and a row direction as in the input buffers BUFin(x, y). The transmitter outputs information indicating setting content of an input buffer BUFin(x, y) in which there are one or more packets to be transmitted to an output buffer BUFout(x, y) of the same row and the same column to set the information and outputs and sets information of Parity(x, y) corresponding to a relevant row (y) to an output buffer BUFout(x, y) corresponding to an input buffer BUFin(x, y) in which there is no packet to be transmitted as shown in the following output buffer setting algorithm. It is to be noted that the information indicating the setting content of the input buffer BUFin(x, y) is a copy of the setting content of the input buffer BUFin(x, y) or a pointer to the setting content of the input buffer BUFin(x, y). Likewise, the information of Parity(x, y) is a copy of a value of Parity(x, y) or a pointer to the value of Parity(x, y).

[Expression 73]

```
For x: = 1 to H
    for y: = 1 to V
        if BUFin(x, y) ≠ Ø then
            BUFout(x, y): = BUFin(x, y)
        else
            BUFout(x, y): = Parity(x, y)
        end if
    end for
end for
```

The transmitter reads the setting content in a row direction starting from an output buffer BUFout(1, 1) toward the last column and transmits the read setting content as packets. The transmitter reads the setting content in the row direction from a first column of the next row when the last column (left end) is reached, and sends packets. When a packet in which a packet to be transmitted is set is sent, the transmitter adds a buffer number (x, y) of the output buffer (input buffer) and a first symbol position $k_{x,y}$ within the buffer. In addition, when a packet in which parity is set is sent, the transmitter adds a buffer number (x, y) of the output buffer and data validity information $U_x(k)$ in each row block. It is to be noted that in the present embodiment, the transmitter does not transmit selection information $SI_x(k)$ as separate information because the data validity information $U_x(k)$ has the same values as the selection information $SI_x(k)$.

The receiver sets the packet to be transmitted or the parity set in a reception packet in a reception buffer BUFrcv(x, y) having a fixed length in accordance with the buffer number (x, y) set as additional information in the reception packet. It is to be noted that the packet to be transmitted is set in the reception buffer BUFrcv(x, y) in accordance with the first symbol position $k_{x,y}$ set as the additional information.

If there is an empty region in any one of the reception buffers BUFrcv(x, y) even when a given time has elapsed, the receiver determines that a packet is lost and sets 1 in all symbols i corresponding to a buffer position (x, y) of the loss packet information $E_x(i)$. The receiver restores the loss packet through the following Formula (14). It is to be noted that k represents a symbol position, BUFrcv(x, j)[k] represents a $k^{th}$ symbol of BUFrcv(x, j), and the loss packet information $E_x(i)$ indicates whether the receiver has received a $k^{th}$ symbol of a packet corresponding to output buffers of rows 1 to L of a column x. In addition, $Y_x'(k)$ represents a $k^{th}$ symbol of data to be transmitted or parity set in a packet received by the receiver among packets generated by the transmitter from the output buffers BUFout of the rows 1 to L of the column x. A matrix D is a matrix constituted of a row corresponding to $U_x(k)[y]=1$ of the parity generator matrix A and a row corresponding to $U_x(k)[y]=0$ of a unit matrix I, and $a_{ji}$, represents an element of a column i and a row j of the parity generator matrix A.

[Expression 74]

$$(Y_x(k) * E_x(k))D(k) + (S_x(k) * U_x(k))I = Y_x'(k)D(k) \quad (14)$$

where $$Y_x(k) := M_x(k) * U_x(k) + S_x(k) * \overline{U_x(k)}$$

$$Y_x'(k) := \overline{E_x(k)} * Y_x(k)$$

$$D(k) := \left\{ d_{ji} \mid d_{ji} := \begin{cases} a_{ji} & \text{if } U_x(k)[j] = 1 \\ \delta_{ji} & U_x(k)[j] = 0 \end{cases}, i, j = \{1, 2, \ldots, V\} \right\}$$

$$\delta_{ji} := \begin{cases} 0 & \text{if } i \neq j \\ 1 & \text{if } i = j \end{cases}.$$

$$E_x(k) := \left\{ e_j \mid e_j := \begin{cases} 0 & \text{if } BUFrcv(x, j)[k] \neq \emptyset \\ 1 & \text{if } BUFrcv(x, j)[k] = \emptyset \end{cases}, j = \{1, 2, \ldots, V\} \right\}$$

Hereinafter, an example of calculation for a Galois field GF (256) for one symbol column is shown. Hereinafter, the transmitter restores a loss packet by performing similar calculation for all columns of the entire block. It is to be noted that the following shows a process in which the transmitter encodes the last seventh and eighth rows among eight rows as invalid symbols, symbols of initial first and second rows are erased during transmission due to packet loss, and the receiver decodes the erased symbols from received symbols. In addition, $U_x(k)$, $M_x(k)$, $S_x(k)$, $Y_x(k)$, $E_x(k)$, and $Y_x'(k)$ of all columns (k=1 to L) to be calculated are denoted as U, M, S, Y, E, and Y', respectively.

The transmitter generates a transmission symbol Y through the following Formulas (15).

[Expression 75]

Cauchy Matrix: (15)

$$A = \begin{bmatrix} 85 & 7d & a8 & d2 & 65 & 99 & 6d & 53 \\ cc & 7c & b0 & 54 & 69 & bc & c2 & b8 \\ 66 & 4c & 3e & 58 & 2a & ba & 5e & 61 \\ 33 & 6e & 26 & 1f & 2c & 15 & 5d & 2f \\ 97 & 0e & 37 & 13 & 81 & 16 & 84 & a0 \\ c5 & 64 & 07 & 95 & 87 & ce & 0b & 42 \\ ec & 20 & 32 & 8d & c4 & cd & 67 & 8b \\ 76 & 78 & 10 & 19 & c8 & 62 & e8 & bd \end{bmatrix},$$

$a_X = \{0, 1, \alpha^1, \ldots, \alpha^6\}$
$a_Y = \{\alpha^{127}, \alpha^{128}, \ldots, \alpha^{134}\}$
$a_{ji} = 1/\{a_X(i) + a_Y(j)\}$
$U = \{1, 1, 1, 1, 1, 1, 0, 0\}$
$M = \{11, 22, 33, 44, 55, 66, 00, 00\}$
$S = \{24, 1f, 2d, ce, 78, c9, fd, d8\}$
$Y = U * M + \overline{U} * S$
$\phantom{Y} = \{11, 22, 33, 44, 55, 66, fd, d8\}$ It is to be noted that $\alpha$ is a primitive element in a Galois extension field.

Because the symbols of two initial rows are erased during transmission, the receiver generates loss packet information E and a received symbol column Y' as shown in the following Formulas (16).

[Expression 76]

$E=\{1,1,0,0,0,0,0,0\}; \{y_0, y_1\}$ are lost.

$Y'=\{00,00,33,44,55,66,fd,d8\}$ (16)

The receiver sets the matrix D as shown in the following Formula (17) because the data validity information U represents that symbols of rows 1 to 6 are valid (1) and symbols of rows 7 and 8 are invalid (0).

[Expression 77]

$$D = \begin{bmatrix} 85 & 7d & a8 & d2 & 65 & 99 & 6d & 53 \\ cc & 7c & b0 & 54 & 69 & bc & c2 & b8 \\ 66 & 4c & 3e & 58 & 2a & ba & 5e & 61 \\ 33 & 6e & 26 & 1f & 2c & 15 & 5d & 2f \\ 97 & 0e & 37 & 13 & 81 & 16 & 84 & a0 \\ c5 & 64 & 07 & 95 & 87 & ce & 0b & 42 \\ 00 & 00 & 00 & 00 & 00 & 00 & 01 & 00 \\ 00 & 00 & 00 & 00 & 00 & 00 & 00 & 01 \end{bmatrix} \quad (17)$$

The receiver restores symbols of the lost packets to be transmitted as shown in the following Formulas (18). Here, $y_i$ is a packet of an $(i-1)^{th}$ row, and $s_i$ is $S_x(k)$ of symbols 1 to L of the $(i-1)^{th}$ row (i is an integer greater than or equal to 1 and less than or equal to V).

[Expression 78]

From Formula (14), (18)
$\{y_0, y_1, 0, 0, 0, 0, 0, 0\}D +$
$\{s_0, s_1, s_2, s_3, s_4, s_5, 0, 0\} = I = Y'D$
$\{s_0, s_1, s_2, s_3, s_4, s_5, y_0, y_1\} = Y'DF^{-1}$
$= \{24, 1f, 2d, ce, 78, c9, 11, 22\}$ $\therefore \{y_0, y_1\} = \{11, 22\}$ $$F = \begin{bmatrix} 01 & 00 & 00 & 00 & 00 & 00 & 00 & 00 \\ 00 & 01 & 00 & 00 & 00 & 00 & 00 & 00 \\ 00 & 00 & 01 & 00 & 00 & 00 & 00 & 00 \\ 00 & 00 & 00 & 01 & 00 & 00 & 00 & 00 \\ 00 & 00 & 00 & 00 & 01 & 00 & 00 & 00 \\ 00 & 00 & 00 & 00 & 00 & 01 & 00 & 00 \\ 85 & 7d & a8 & d2 & 65 & 99 & 6d & 53 \\ cc & 7c & b0 & 54 & 69 & bc & c2 & b8 \end{bmatrix}$$

$$F^{-1} = \begin{bmatrix} 01 & 00 & 00 & 00 & 00 & 00 & 00 & 00 \\ 00 & 01 & 00 & 00 & 00 & 00 & 00 & 00 \\ 00 & 00 & 01 & 00 & 00 & 00 & 00 & 00 \\ 00 & 00 & 00 & 01 & 00 & 00 & 00 & 00 \\ 00 & 00 & 00 & 00 & 01 & 00 & 00 & 00 \\ 00 & 00 & 00 & 00 & 00 & 01 & 00 & 00 \\ c0 & 5f & 6a & 89 & 66 & 2b & db & d8 \\ 29 & 85 & 93 & d2 & 5e & a0 & 81 & ab \end{bmatrix}$$

Subsequently, examples of a configuration and an operation of the redundant packet transmission system to which the principle of the present embodiment is applied will be described.

Figure 18:
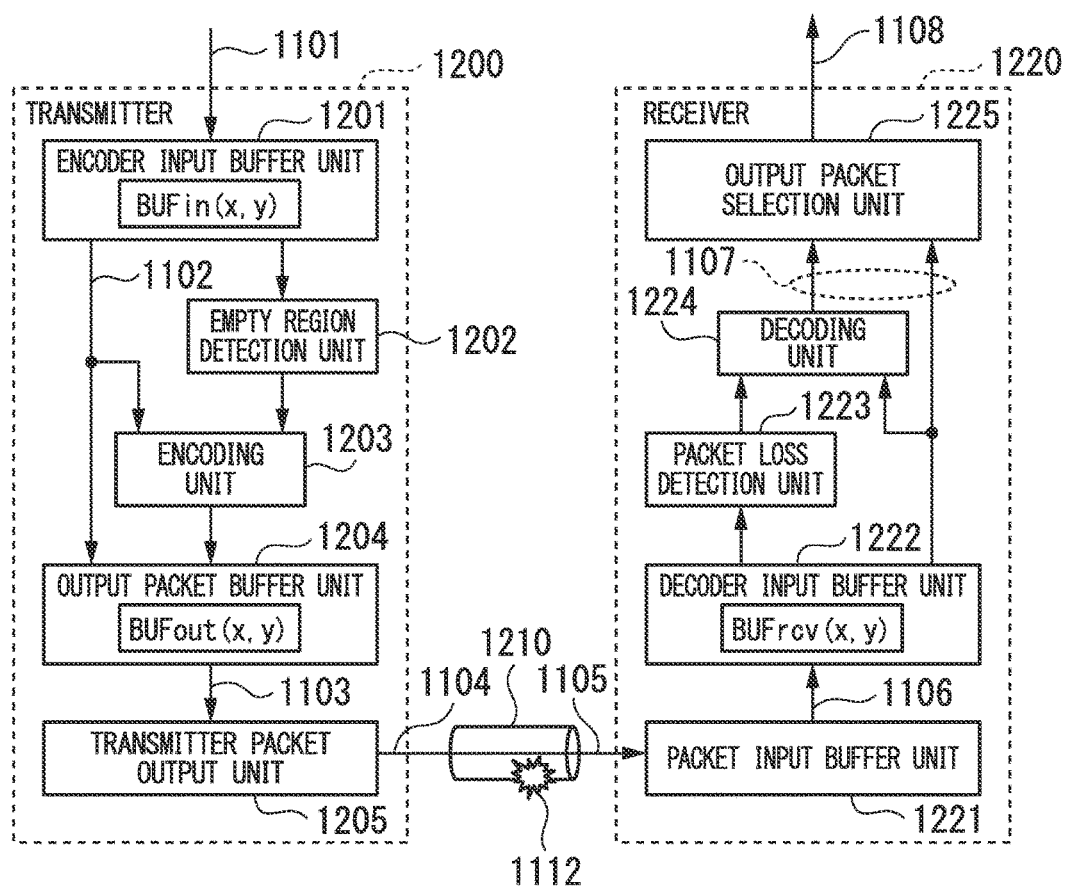
FIG. 18 shows a functional block diagram of a redundant packet transmission system in accordance with a twelfth embodiment of the present invention.

FIG. 18 shows a functional block diagram of the redundant packet transmission system in accordance with the twelfth embodiment of the present invention. As shown in FIG. 18, the redundant packet transmission system in accordance with the present embodiment is configured to include a transmitter 1200 and a receiver 1220 connected through a packet transmission path 1210.

The transmitter 1200 is configured to include an encoder input buffer unit 1201, an empty region detection unit 1202, an encoding unit 1203, an output packet buffer unit 1204, and a transmitter packet output unit 1205.

The encoder input buffer unit 1201 includes input buffers BUFin each having a length L arranged in two dimensions of H columns and V rows. An input buffer BUFin of a column x (x is an integer greater than or equal to 1 and less than or equal to H) and a row y (y is an integer greater than or equal to 1 and less than or equal to V) is denoted as an input buffer BUFin(x, y). The encoder input buffer unit 1201 iterates a process of sequentially setting packets to be transmitted within a packet input 1101 in a direction from a first row to a last row of a first column of the two-dimensionally arranged input buffers BUFin in accordance with arrival times, proceeding to an adjacent column having the column number incremented by 1 when the last row is reached, and sequentially setting the packets to be transmitted in a direction from a first row to a last row. Here, the encoder input buffer unit 1201 writes an invalid symbol such as 0 to an input buffer BUFin corresponding to a time at which no input packet has arrived. The encoder input buffer unit 1201 outputs an input buffer setting 1102 indicating setting content of the input buffers BUFin to the encoding unit 1203 and the output packet buffer unit 1204. It is to be noted that the input buffer setting 1102 may be a copy of the setting content of the input buffers BUFin or it may be a pointer to the setting content of the input buffers BUFin.

The empty region detection unit 1202 detects an empty input buffer BUFin based on whether an invalid symbol is set, and outputs a detection result to the encoding unit 1203.

The encoding unit 1203 calculates parity of an MDS code such as a Galois field Cauchy matrix of a coding rate 0.5 for each column (x) from the input buffer setting 1102. That is, a block unit to be encoded is input buffers BUFin of all rows of each column. At this time, the encoding unit 1203 sets a symbol corresponding to a buffer number determined to be empty by the empty region detection unit 1202 to 0 and calculates parity through the above-described Formulas (13) using the parity generator matrix A. Thereby, Parity(x, y) for rows equal in number to the rows of the input buffers BUFin is generated. Hereinafter, Parity(x, y) is also referred to as parity (x, y).

Like the input buffers, the output packet buffer unit 1204 includes output buffers BUFout each having a length L which are two-dimensionally arranged in H columns and V rows. An output buffer BUFout of a column x and a row y is denoted as an output buffer BUFout(x, y). The output packet buffer unit 1204 sets an output buffer BUFout(x, y) as shown in the above-described output buffer algorithm. That is, the output packet buffer unit 1204 sets, in an output buffer BUFout(x, y) of a buffer number determined not to be empty by the empty region detection unit 1202, setting content (or a pointer to the setting content) of an input buffer BUFin(x, y) of the same buffer number in the input buffer setting 1102. Furthermore, the output packet buffer unit 1204 sets parity (x, y) (or a pointer to the parity (x, y)) corresponding to a row (y) of a buffer number determined to be empty by the empty region detection unit 1202 in the output buffer BUFout(x, y) of the buffer number. The output packet buffer unit 1204 outputs an output buffer setting 1103 indicating the setting content of the output buffers BUFout (x, y) to the transmitter packet output unit 1205.

The transmitter packet output unit 1205 sequentially reads the setting content of the output buffers BUFout(x, y) set in the output buffer setting 1103 from a first column for each row. The transmitter packet output unit 1205 transmits a transmitter output 1104 constituted of packets in which the setting content read from the output buffers BUFout(x, y) (or setting content indicated by a pointer if the pointer is read) is set to the receiver 1220. At this time, if a transmission packet is a packet to be transmitted, the transmitter packet output unit 1205 adds a buffer number (x, y) of the input buffer BUFin(x, y) (or the output buffer BUFout(x, y)) in which the packet to be transmitted is stored and a first symbol position $k_{x,y}$. In addition, if a parity packet is to be sent, the transmitter packet output unit 1205 adds a buffer number (x, y) indicating an output buffer BUFout(x, y) having setting content from which the parity packet is generated and data validity information U of each column block. It is to be noted that the data validity information U is set based on output information from the empty region detection unit 1202. In addition, when a first symbol position is fixed, $k_{x,y}$ may not be set in the packet to be transmitted.

The receiver 1220 is configured to include a packet input buffer unit 1221, a decoder input buffer unit 1222, a packet loss detection unit 1223, a decoding unit 1224, and an output packet selection unit 1225.

The packet input buffer unit 1221 extracts buffer numbers (x, y) from information added to packets included in an receiver input 1105 received from the packet transmission path 1210 and inputs a reception buffer input 1106 in which packets are two-dimensionally arranged in accordance with the buffer numbers (x, y) to the decoder input buffer unit 1222. If a received packet is a packet to be transmitted, the packet input buffer unit 1221 further inputs the first symbol position $k_{x,y}$ to the decoder input buffer unit 1222.

The decoder input buffer unit 1222 includes reception buffers BUFrcv each having a length L which are two-dimensionally arranged in H columns and V rows as in the input buffers BUFin and the output buffers BUFout of the transmitter 1200. A reception buffer BUFrcv of a column x and a row y is denoted as a reception buffer BUFrcv(x, y). The decoder input buffer unit 1222 sets setting content of the reception buffer input 1106 output from the packet input buffer unit 1221 in the reception buffer BUFrcv(x, y) while maintaining a row position and a column position indicated by the buffer number (x, y). At this time, the decoder input buffer unit 1222 sets packets to be transmitted in the reception buffers BUFrcv(x, y) from the first symbol position $k_{x,y}$. When a buffer number (x, y) in which a packet to be transmitted is set is obtained from the data validity information U, the decoder input buffer unit 1222 outputs the buffer number (x, y) and the packet to be transmitted read from the reception buffers BUFrcv(x, y) to the output packet selection unit 1225. It is to be noted that whether the packet is a packet to be transmitted is obtained from the data validity information U.

If all reception buffers BUFrcv are set or if there is an empty region in the reception buffers BUFrcv(x, y) even after a given time, such as a maximum delay spread time in transmission, has elapsed, the packet loss detection unit 1223 notifies the decoding unit 1224 of a loss packet 1112 in the packet transmission path 1210. If no packet is set in a reception buffer BUFrcv, the packet loss detection unit 1223 determines that the packet corresponding to its buffer number is the loss packet 1112. The packet loss detection unit 1223 outputs the buffer number of the loss packet 1112 to the decoding unit 1224. In addition, the packet loss detection unit 1223 sets 0 in a reception buffer BUFrcv for which the loss packet 1112 is detected.

The decoding unit 1224 restores the loss packet using Formula (14) if the notification of the buffer number of the loss packet 1112 is received from the packet loss detection unit 1223, and outputs the packet to be transmitted obtained by the restoration and the buffer number corresponding to the packet to be transmitted to the output packet selection unit 1225. It is to be noted that a reception symbol column Y' is read from the reception buffer BUFrcv and set, and the loss packet information E is set based on an output from the packet loss detection unit 1223.

The output packet selection unit 1225 receives the packet to be transmitted read from the reception buffer BUFrcv and its buffer number and the packet to be transmitted restored by the decoding unit 1224 and its buffer number as outputs 1107 after decoding. The output packet selection unit 1225 sequentially outputs, as a receiver output 1108, packets to be transmitted that are two-dimensionally arranged in accordance with buffer numbers in a direction from a first row to a last row of a first column. The output packet selection unit 1225 iterates a process of proceeding to an adjacent column having the column number incremented by 1 when the last row is reached, and sequentially outputting, as the receiver output 1108, packets to be transmitted in a direction from a first row to a last row until the last column is reached.

Figure 19:
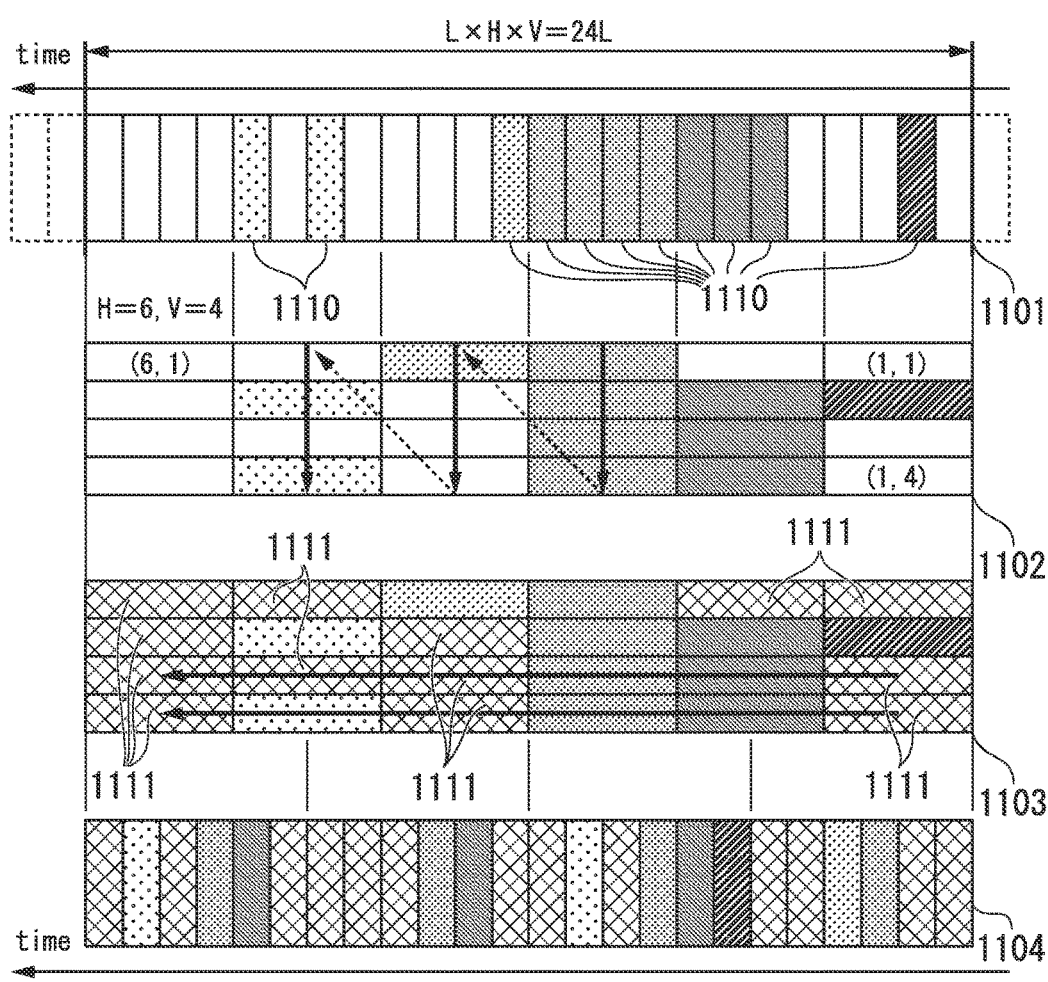
FIG. 19 is a diagram describing a packet output procedure by a transmitter in accordance with the twelfth embodiment.

FIG. 19 is a diagram describing a packet output procedure by the transmitter 1200 of the present embodiment. Here, the case in which input buffers BUFin and output buffers BUFout are two-dimensionally arranged so that the number of columns H=6, the number of rows V=4, a column number increases in a direction from the right to the left, and a row number increases in a direction from the top to the bottom will be described.

The encoder input buffer unit 1201 sets packets 1110 to be transmitted in the input buffers BUFin in order from a first row to a fourth row of a first column in accordance with arrival times of the packets 1110 to be transmitted included in the packet input 1101. The encoder input buffer unit 1201 iterates a process of proceeding to the next column when the packets 1110 to be transmitted are set in all rows for one column of the input buffers BUFin and setting symbols of the packets 1110 to be transmitted in order from a first row to a fourth row until a last column is reached. In this manner, the encoder input buffer input 1201 sets the packets 1110 to be transmitted from the upper end to the lower end in accordance with the arrival times and sets the packets 1110 to be transmitted from the upper end to the lower end of a left adjacent column when the lower end is reached. The encoder input buffer unit 1201 writes 0 to an input buffer BUFin corresponding to a time at which a packet 1110 to be transmitted has not arrived. The encoder input buffer unit 1201 outputs the input buffer setting 1102 indicating setting content of an input buffer BUFin, a buffer number (x, y), and a first symbol position $k_{x,y}$ within the buffer.

The output packet buffer unit 1204 copies the setting content of the input buffer BUFin(x, y) in which the packet 1110 to be transmitted is present in the input buffer setting 1102 to the output buffer BUFout(x, y) of the same column (x) and the same row (y). Alternatively, a pointer to the setting content of the input buffer BUFin(x, y) may be set.

The encoding unit 1203 calculates parity for each column (x) from the input buffer setting 1102. The encoding unit 1203 sets, in the output buffer BUFout(x, y) of a buffer position at which the packet to be transmitted is not set, parity 1111 corresponding to a row (y) of the buffer position.

For example, the packet 1110 to be transmitted is set in only the second row in the first column of the input buffer setting 1102 shown in FIG. 19, and no packet to be transmitted is set in the first, third, and fourth rows. The encoding unit 1203 generates Parity(1, 1) to Parity(1, 4) from the first column of the input buffer setting 1102 and sets Parity(1, 1), Parity(1, 3), and Parity(1, 4), as the parity 1111, in output buffers BUFout(1, 1), BUFout(1, 3), and BUFout(1, 4) at buffer positions at which no packet to be transmitted is set.

Because the packet to be transmitted is output without change in the present method, even a receiver that does not conform to the present embodiment is capable of receiving only the packet to be transmitted although the receiver is not provided with an erasure correction function.

When an input of an output buffer setting 1103 indicating setting content of output buffers BUFout from the output packet buffer unit 1204 is received, the transmitter packet output unit 1205 generates packets from the setting content of the output buffers BUFout in order from a first column to a sixth column of a first row. When the packets for all columns are generated, the transmitter packet output unit 1205 iterates a process of proceeding to the next row and generating packets from the setting content of the output buffers BUFout from the first column to the sixth column in order. In this manner, the transmitter packet output unit 1205 generates packets in a row direction from the upper right, generates packets in the row direction from the head (right end) of the next row below when the left end is reached, and sends the transmitter output 1104 in order of generation.

That is, the transmitter packet output unit 1205 transmits the transmitter output 1104 by performing packet interleaving on the generated packets.

It is to be noted that the transmitter packet output unit 1205 adds a buffer number (x, y) in which each packet is set to each packet and further adds data validity information U to a packet generated from the parity 1111. It is to be noted that because the present embodiment transmits all pieces of parity, the receiver can determine that selection information $SI_x(k)$ includes values indicating that all the pieces of parity are selected, and thus the transmitter transmits packets without adding the selection information.

Figure 20:
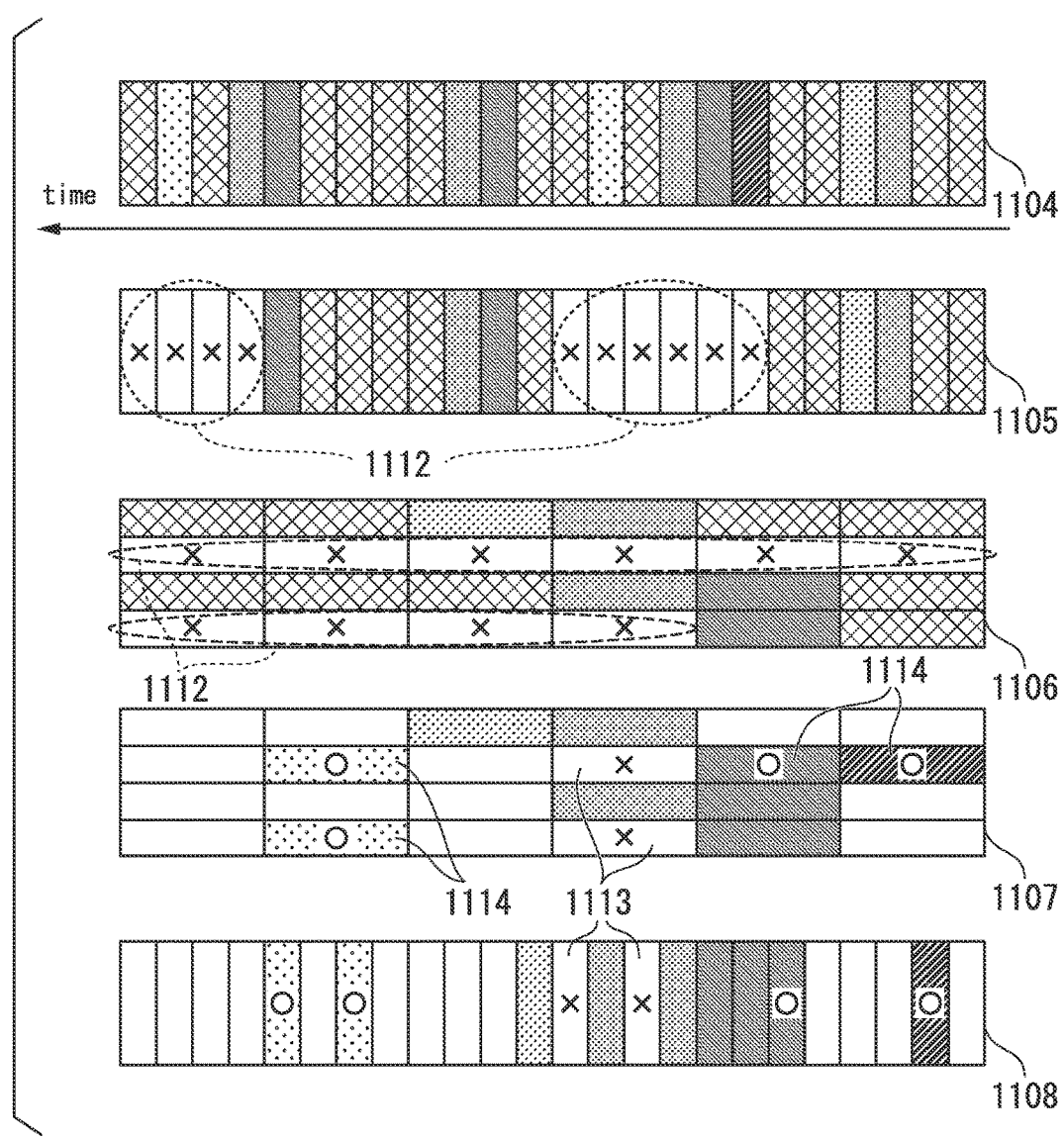
FIG. 20 is a diagram describing a packet decoding procedure by a receiver in accordance with the twelfth embodiment.

FIG. 20 is a diagram describing a packet decoding procedure by the receiver 1220 of the present embodiment. Here, the reception buffers BUFrcv are two-dimensionally arranged so that the number of columns H=6, the number of rows V=4, a column number increases in a direction from the right to the left, and a row number increases in a direction from the top to the bottom.

Loss packets 1112 are generated in the transmitter output 1104 sent in FIG. 19 during transmission in the packet transmission path 1210, and the receiver 1220 receives the receiver input 1105. The packet input buffer unit 1221 of the receiver 1220 outputs the reception buffer input 1106 in which packets of the receiver input 1105 are arranged in accordance with buffer numbers indicated by additional information to the decoder input buffer unit 1222.

The decoder input buffer unit 1222 of the receiver 1220 sets reception packets included in the reception buffer input 1106 in reception buffers BUFrcv(x, y) of the buffer numbers (x, y) added to the reception packets.

The decoding unit 1224 restores a loss packet 1112 for the same symbols of each column using Formula (14). In the present embodiment, erasure correction is possible when packets (a packet to be transmitted and a parity packet) of arbitrary combinations greater than or equal in number to the packets to be transmitted are received in each column. A restored packet to be transmitted is a corrected erasure packet 1114 marked as ○ in FIG. 20. In contrast, if the number of reception packets in one column is less than the number of packets to be transmitted in this column, erasure correction is impossible. A packet to be transmitted for which erasure correction has failed is an uncorrected erasure packet 1113 marked as x in FIG. 20.

The output packet selection unit 1225 receives an input of the outputs 1107 after decoding, outputs packets to be transmitted in a column direction from the upper right buffer number as the receiver output 1108, and outputs a packet to be transmitted having a buffer number of the head of the next left column as the receiver output 1108 when the lower end is reached. At this time, the output packet selection unit 1225 does not output the receiver output 1108 at a transmission timing corresponding to a buffer number in which no packet to be transmitted is included in the outputs 1107 after decoding.

Thirteenth Embodiment

Although the transmitter of the twelfth embodiment sets the setting content of the input buffer BUFin in the output buffer BUFout of the same row and the same column, the present embodiment sets all pieces of parity (x, y) in the output buffers BUFout. A configuration of a redundant packet transmission system of the present embodiment is similar to the configuration of the redundant packet transmission system shown in FIG. 18. Hereinafter, differences from the twelfth embodiment will be mainly described.

As in the twelfth embodiment, the encoder input buffer unit 1201 of the transmitter 1200 sets a packet 1110 to be transmitted or an invalid symbol in an input buffer BUFin, and the empty region detection unit 1202 detects an empty input buffer BUFin. As in the twelfth embodiment, the encoding unit 1203 calculates parity of an MDS code such as a Cauchy matrix of a Galois field of a coding rate of 0.5 for each column (x) from the input buffer setting 1102.

In the present embodiment, the output packet buffer unit 1204 sets an output buffer BUFout as shown in the following output buffer setting algorithm.

[Expression 79]

```
for x: = 1 to H
    for y: = 1 to V
        BUFout(x, y): = Parity(x, y)
    end for
end for
```

That is, the encoding unit 1203 copies Parity(x, y) corresponding to the relevant row (y) to all output buffers BUFout(x, y) or sets a pointer to Parity(x, y) therein.

In this method, communication with high confidentiality is possible because a packet to be transmitted is pseudo-encrypted.

As in the twelfth embodiment, the transmitter packet output unit 1205 reads the setting content of the output buffers BUFout set in the output buffer setting 1103 for each row in order from the first column. The transmitter packet output unit 1205 transmits packets in which the read setting content (or setting content indicated by a pointer when the pointer is read) is set to the receiver 1220. Here, in the present embodiment, all packets to be transmitted are parity packets. The transmitter packet output unit 1205 adds a buffer number (x, y) indicating an output buffer BUFout having setting content from which a packet is generated and data validity information U of each column block to the packet.

The packet input buffer unit 1221 of the receiver 1220 extracts a buffer number (x, y) from information added to each packet of the receiver input 1105 and inputs the reception buffer input 1106 in which packets are two-dimensionally arranged in accordance with buffer numbers (x, y) to the decoder input buffer unit 1222. The decoder input buffer unit 1222 sets a parity portion of a received packet in a reception buffer BUFrcv(x, y) in accordance with the buffer number (x, y) added to the packet. The packet loss detection unit 1223 notifies the decoding unit 1224 of the loss packet 1112 if all reception buffers BUFrcv are set or if there is an empty region in the reception buffers BUFrcv(x, y) even after a given time has elapsed. Except that the receiver input 1105 includes only parity packets, the process of the receiver 1220 described so far is similar to that of the twelfth embodiment.

As shown in Formula (19), the decoding unit 1224 restores a loss packet by solving simultaneous linear equations of a Galois field constituted of a symbol column Y' set in the reception buffers BUFrcv, data validity information U, loss packet information E, and a parity generator matrix A, and outputs the restored loss packet to the output packet selection unit 1225.

[Expression 80]

$$(M_x(k) * U_x(k))A + (S_x(k) * E_x(k))I = Y'_x(k) \quad (19)$$

where $Y_x(k) := S_x(k)$ $Y'_x(k) := E_x(k) * Y_x(k)$ $E_x(k) :=$ $$\left\{ e_j \mid e_j := \begin{cases} 0 & \text{if } BUFrcv(x, j)[k] = \emptyset \\ 1 & \text{if } BUFrcv(x, j)[k] = \emptyset \end{cases}, j = \{1, 2, ..., V\} \right\}$$

In the present embodiment, as in the twelfth embodiment, erasure correction for each column is possible if reception packets greater than or equal in number to the packets to be transmitted are received for each column of the input buffers.

An example of calculation for a Galois field GF (256) for one symbol column is shown below. Hereinafter, the transmitter restores a loss packet by performing similar calculation for all columns of the entire block. It is to be noted that the following shows a process in which the transmitter encodes the last seventh and eighth rows among eight rows as invalid symbols, symbols of initial two rows are erased during transmission due to packet loss, and the receiver decodes the erased symbols from reception symbols. In addition, $U_x(k)$, $M_x(k)$, $S_x(k)$ $Y_x(k)$, $E_x(k)$, and $Y_x'(k)$ of all columns (k=1 to L) to be calculated are denoted as U, M, S, Y, E, and Y', respectively.

The transmitter 1200 generates a transmission symbol Y through the following Formulas (20).

[Expression 81]

Cauchy Matrix: (20)

$$A = \begin{bmatrix} 85 & 7d & a8 & d2 & 65 & 99 & 6d & 53 \\ cc & 7c & b0 & 54 & 69 & bc & c2 & b8 \\ 66 & 4c & 3e & 58 & 2a & ba & 5e & 61 \\ 33 & 6e & 26 & 1f & 2c & 15 & 5d & 2f \\ 97 & 0e & 37 & 13 & 81 & 16 & 84 & a0 \\ c5 & 64 & 07 & 95 & 87 & ce & 0b & 42 \\ ec & 20 & 32 & 8d & c4 & cd & 67 & 8b \\ 76 & 78 & 10 & 19 & c8 & 62 & e8 & bd \end{bmatrix}$$

$U = \{1, 1, 1, 1, 1, 1, 0, 0\}$ $M = \{11, 22, 33, 44, 55, 66, 00, 00\}$ $Y = S$ $= \{24, 1f, 2d, ce, 78, c9, fd, d8\}$

Because two initial symbols are erased during transmission, the receiver generates loss packet information E and a reception symbol column Y' as shown in the following Formulas (21).

[Expression 82]

$E = \{1,1,0,0,0,0,0,0\}; \{y_0 y_1\}$ are lost.

$Y' = \{00,00,2d,ce,78,c9,fd,d8\}$ (21)

The receiver restores symbols of a lost packet to be transmitted as shown in the following Formulas (22). Here, $m_j$ is an $(i-1)^{th}$ packet to be transmitted.

[Expression 83]

From Formula (19), (22)

$\{m_0, m_1, m_2, m_3, m_4, m_5, 0, 0\}A +$ $\{s_0, s_1, 0, 0, 0, 0, 0, 0\}I = Y'$ $\{m_0, m_1, m_2, m_3, m_4, m_5, s_0, s_1,\} = Y'B^{-1}$ $= \{11, 22, 33, 44, 55, 66, 24, 1f\}$ $\therefore \{m_0, m_1, m_2, m_3, m_4, m_5\} = \{11, 22, 33, 44, 55, 66\}$ where, $$B = \begin{bmatrix} 85 & 7d & a8 & d2 & 65 & 99 & 6d & 53 \\ cc & 7c & b0 & 54 & 69 & bc & c2 & b8 \\ 66 & 4c & 3e & 58 & 2a & ba & 5e & 61 \\ 33 & 6e & 26 & 1f & 2c & 15 & 5d & 2f \\ 97 & 0e & 37 & 13 & 81 & 16 & 84 & a0 \\ c5 & 64 & 07 & 95 & 87 & ce & 0b & 42 \\ 01 & 00 & 00 & 00 & 00 & 00 & 00 & 00 \\ 00 & 01 & 00 & 00 & 00 & 00 & 00 & 00 \end{bmatrix}$$

$$B^{-1} = \begin{bmatrix} 00 & 00 & 00 & 00 & 00 & 00 & 01 & 00 \\ 00 & 00 & 00 & 00 & 00 & 00 & 00 & 01 \\ 7e & fe & 60 & 2c & 1b & 74 & 86 & 9b \\ fd & b0 & 72 & e7 & 0f & 36 & d9 & ae \\ 04 & 61 & ac & ed & d3 & b0 & 10 & 31 \\ 38 & 0c & bb & 45 & d5 & 27 & 53 & ad \\ 07 & 59 & 18 & 99 & e9 & 5b & 9e & 9a \\ 64 & 0e & e0 & 20 & 6b & 7b & b9 & 98 \end{bmatrix}$$

The decoding unit 1224 outputs a packet to be transmitted obtained through decoding and a buffer number corresponding to the packet to be transmitted to the output packet selection unit 1225. The output packet selection unit 1225 receives the packet to be transmitted decoded by the decoding unit 1224 and the buffer number as the outputs 1107 after the decoding. As in the twelfth embodiment, the output packet selection unit 1225 sequentially outputs packets to be transmitted which are two-dimensionally arranged in accordance with the buffer numbers as the receiver output 1108 in a direction from a first row to a last row of a first column, proceeds to an adjacent column having the column number incremented by 1 when the last row is reached, and sequentially outputs packets to be transmitted as the receiver output 1108 in a direction from a first row to a last row. The output packet selection unit 1225 does not output the receiver output 1108 at a transmission timing corresponding to a buffer number in which a packet to be transmitted is not included in the outputs 1107 after decoding.

Fourteenth Embodiment: Short Packet

In the present embodiment, the transmitter receives a packet 1110 to be transmitted which is shorter than a buffer length L of the input buffers BUFin of the encoder input buffer unit 1201. A configuration of the redundant packet transmission system of the present embodiment is similar to the configuration of the redundant packet transmission system shown in FIG. 18. Hereinafter, differences from the twelfth and thirteenth embodiments will be mainly described.

Figure 21:
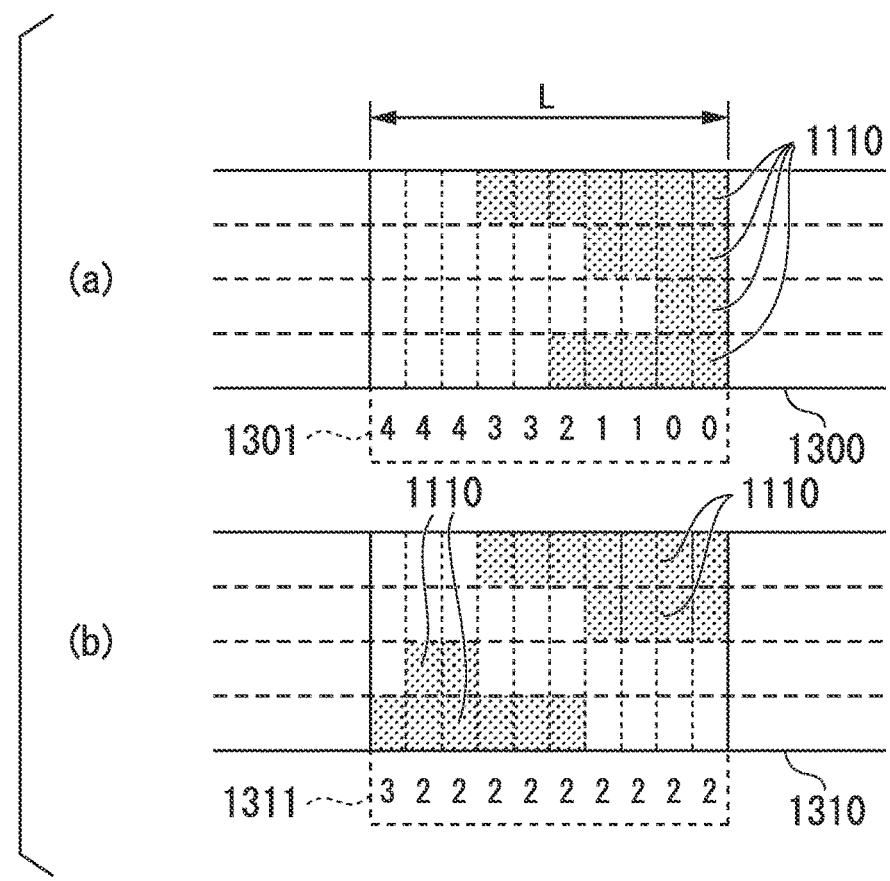
FIG. 21 is a diagram showing an example of accommodating a packet to be transmitted in an input buffer in accordance with a fourteenth embodiment.

FIG. 21 shows an example in which the packet 1110 to be transmitted shorter than the buffer length L is accommodated (set) in the input buffers BUFin provided in the encoder input buffer unit 1201.

FIG. 21(a) shows the case in which packets 1110 to be transmitted are accommodated in input buffers BUFin of a certain column from the first symbol column, wherein the packets 1110 to be transmitted are set in all rows of this column. The input buffers BUFin of this accommodated state are denoted as an encoder input buffer column 1300 before optimization. The number of invalid symbols 1301 of each symbol column of the encoder input buffer column 1300 before optimization becomes a smaller value when the position is closer to the head of the buffers.

FIG. 21(b) shows a setting example of input buffers BUFin after optimization. The encoder input buffer unit 1201 becomes as shown in FIG. 21(b) when optimization is performed on the encoder input buffer column 1300 before optimization so that the number of invalid symbols of each symbol column is as uniform as possible. The input buffers BUFin of this accommodated state are designated as an encoder input buffer column 1310 after optimization.

The transmitter 1200 performs encoding similar to those of the twelfth and thirteenth embodiments for each symbol column using the encoder input buffer column 1310 after optimization. The number of invalid symbols 1311 of each symbol column after the optimization of each symbol column is the number of symbols for which the erasure correction is possible. Thus, when consideration is given in units of packet, a minimum value of the number of invalid symbols 1301 before optimization is 0, that is, the loss of any one packet is not allowed. In contrast, the minimum value of the number of invalid symbols 1311 after optimization is 2, that is, even if any two packets are lost, the receiver 1220 can restore four original packets.

Although the optimization of accommodation of packets in units of columns is equivalent to a bin packing problem and it belongs to NP-hard, there is an efficient approximation algorithm. This algorithm, for example, is disclosed in Reference Document 1.

One algorithm for guaranteeing the minimum number of degrees of redundancy $r_{min}$ when packets are sequentially accommodated is shown below. The number of redundancies is the number of rows in which parity is set per column.

[Expression 84]

1: len = packet length of packet to be transmitted
2: for i = V down_to 1 + $r_{min}$
3:     search for continuous region of len or more in which
    i ≤ number of invalid symbols 1311 is satisfied
4:     if there is continuous region
5:         accommodate packet to be transmitted in the region,
        update number of invalid symbols, and end
6:     end_if
7: end_for
8: accommodate from first symbol of new column, update number
of invalid symbols, and end As described above, the encoder input buffer unit 1201 adjusts a setting position of data to be transmitted in each of the input buffers BUFin so as to reduce the maximum number of valid symbols included in V symbols of the same column in which the symbol positions from the heads of rows in the input buffers BUFin are equal to each other.

It is to be noted that although the packets 1110 to be transmitted are set in the input buffers BUFin in order of transmission in the above description, the packets 1110 to be transmitted may be set regardless of the order of transmission as long as they can be set in empty regions of the input buffers BUFin.

Fifteenth Embodiment

In the present embodiment, the transmitter receives a packet to be transmitted having an arbitrary length. A configuration of the redundant packet transmission system of the present embodiment is similar to the configuration of the redundant packet transmission system shown in FIG. 18. Hereinafter, differences from the twelfth embodiment will be mainly described.

Figure 22:
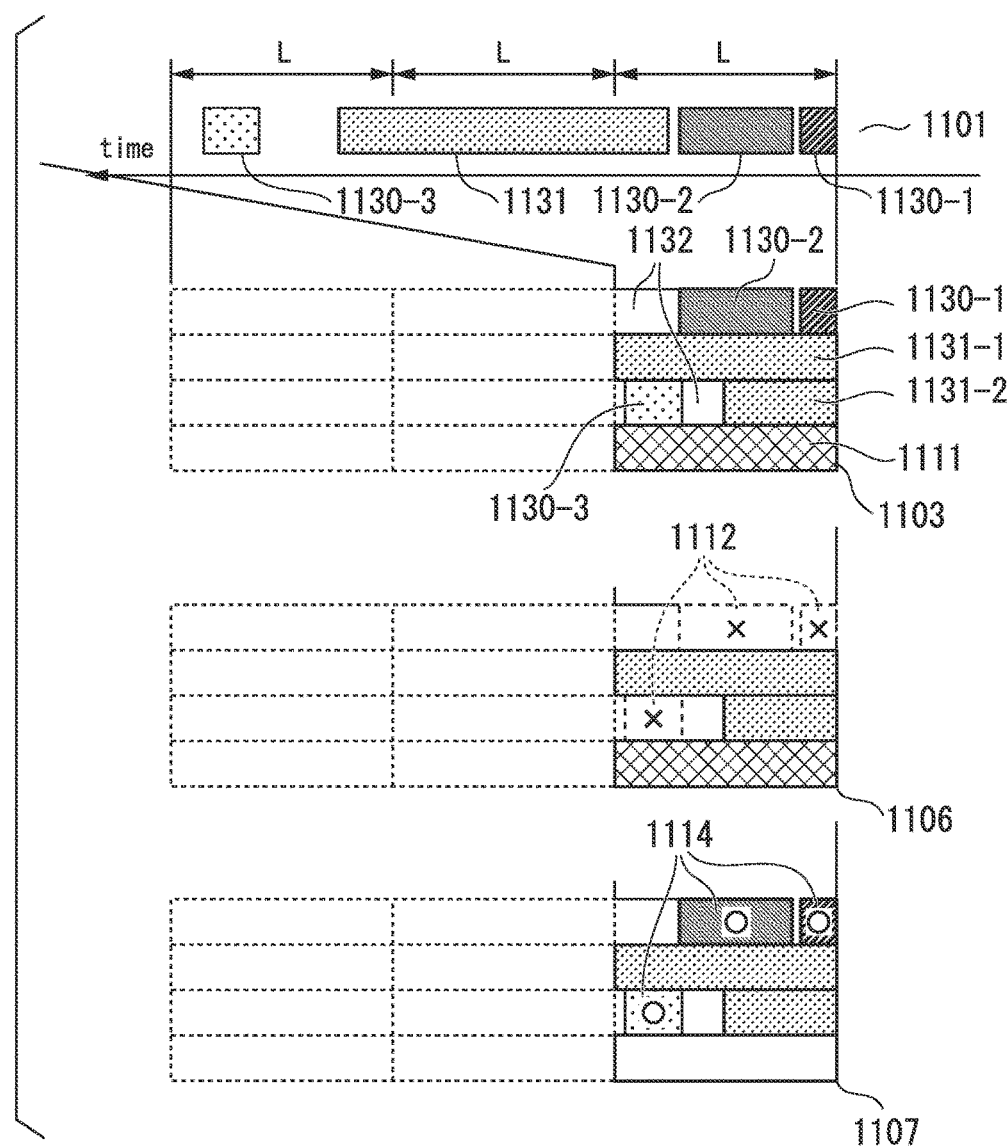
FIG. 22 is a diagram describing an operation of a redundant packet transmission system when a packet to be transmitted has an arbitrary length in accordance with a fifteenth embodiment.

FIG. 22 is a diagram describing an operation of the redundant packet transmission system when a packet to be transmitted has an arbitrary length. The packet input 1101 for the transmitter 1200 includes packets 1130-1, 1130-2, and 1130-3 to be transmitted having a packet length that does not exceed the buffer length L of the input buffers BUFin and a packet 1131 to be transmitted having a packet length exceeding the buffer length L.

FIG. 22 shows an example of the output buffer setting 1103 when a packet to be transmitted having an arbitrary length is accommodated (set) in the input buffers BUFin provided in the encoder input buffer unit 1201. As shown in FIG. 22, the encoder input buffer unit 1201 may set a plurality of packets 1130-1 and 1130-2 to be transmitted in one input buffer BUFin of the buffer length L so that a total packet length does not exceed L. In this method, the improvement of transmission efficiency is expected.

In addition, when the packet length exceeds the buffer length L, the encoder input buffer unit 1201 sets fragment packets 1131-1 and 1131-2 obtained by fragmenting the packet to be transmitted 1131 in a plurality of input buffers BUFin. This method makes it possible to accommodate a packet to be transmitted having an arbitrary length.

It is to be noted that the encoder input buffer unit 1201 performs padding on a portion of a symbol in which the packet to be transmitted is not set in each input buffer BUFin using padding information 1132 of 0. Because the number of redundancies is the number of rows of invalid symbols (0) at the same symbol position of the same column, the symbol position of a packet to be transmitted may be prevented from overlapping that of another row as much as possible at the time of padding.

The transmitter packet output unit 1205 adds a buffer number (x, y) indicating a position in the output buffers and a symbol position from the head in each buffer to each packet to be transmitted as the transmitter output 1104, and sends the packet. In addition, the buffer number (x, y) and the symbol position from the head in each buffer are also added to a packet of parity 1111 and the packet is sent.

If there is a loss packet 1112 in the decoder input buffer unit 1222 of the receiver 1220, the decoding unit 1224 restores the loss packet by solving Formula (14) or Formula (19) for each symbol of each row and generates an erasure correction packet 1114 that is a packet of which the erasure is corrected through restoration.

Sixteenth Embodiment

In the present embodiment, the minimum number of redundancies and the maximum number of redundancies are set. The configuration of a redundant packet transmission system of the present embodiment is similar to the configuration of the redundant packet transmission system shown in FIG. 18. Hereinafter, differences from the twelfth embodiment will be mainly described.

Figure 23:
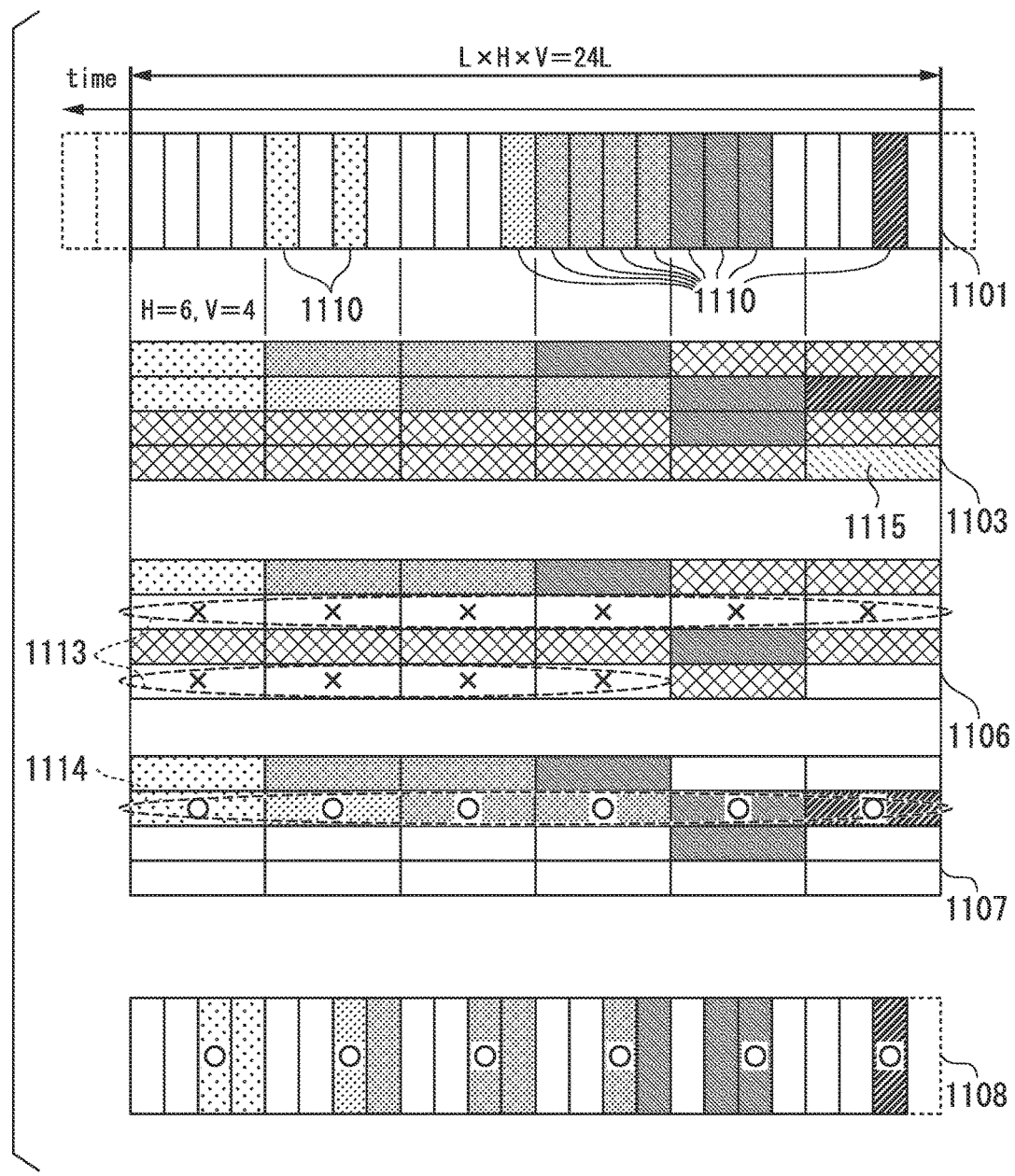
FIG. 23 is a diagram describing an operation of a redundant packet transmission system when the minimum number $r_{min}$ of redundancies and the maximum number $r_{max}$ of redundancies are set in accordance with a sixteenth embodiment.

FIG. 23 is a diagram describing an operation of the redundant packet transmission system when the minimum number of redundancies $r_{min}$ and the maximum number of redundancies $r_{max}$ are set ($0 < r_{min} \le r_{max} < V$). The minimum number of redundancies $r_{min}$ represents the minimum number of rows of parity per column, and single burst error tolerance of $r_{min}$ packets in each column is guaranteed. The maximum number of redundancies $r_{max}$ represents the maximum number of rows of parity per column and is used to avoid excessive redundancy when a packet rate is low. FIG. 23 shows the case of $r_{min} = r_{max} = 2$.

A basic operation in which the encoder input buffer unit 1201 iterates a process of sequentially setting packets 1110 to be transmitted within a packet input 1101 in a direction from a first row to a last row of a first column of two-dimensionally arranged input buffers BUFin in accordance with arrival times, proceeding to an adjacent column having the column number incremented by 1 when the last row is reached, and sequentially setting packets 1110 to be transmitted in a direction from a first row to a last row is similar to that of the twelfth embodiment. The encoding unit 1203 calculates parity greater than or equal to $r_{min}$ and less than or equal to $r_{max}$ for each column and sets the calculated parity in the output buffers BUFout. The output packet buffer unit 1204 writes a packet 1110 to be transmitted to the first output buffer BUFout of the next column if the number of output buffers BUFout to which parity is to be written is insufficient because it is less than or equal to $r_{min}$ in a column in which the packets 1110 to be transmitted are currently being written to the input buffers BUFin.

The transmitter packet output unit 1205 sequentially packetizes setting content of the output buffer setting 1103 from a first column of a first row, sequentially performs packetization from a first column of the next row below when one row has been processed, and sends packets in order of generation as the transmitter output 1104. However, the transmitter packet output unit 1205 does not send a greater number of pieces of parity 1115 than $r_{max}$ pieces of parity per column. In this manner, the transmitter packet output unit 1205 transmits packets of the output buffers BUFout of each column so that the number of the packets does not exceed the number of packets to be transmitted in each column+$r_{max}$. Here, because $r_{min} = 2$, if the number of loss packets 1112 in the reception buffer input 1106 per column is less than or equal to 2, the packet to be transmitted can be restored, and the packet to be transmitted that has been restored as the erasure correction packet 114 is input to the output packet selection unit 1225 as the outputs 1107 after the decoding. The output packet selection unit 1225 outputs the receiver output 1108 as in the twelfth embodiment.

By performing the process as described above, the output packet buffer unit 1204 adjusts a setting position of data to be transmitted in each of the output buffers BUFout so that the number of invalid symbols among V symbols in which the symbol positions from the heads of the rows in the output buffers BUFout of the same column are equal to each other is greater than or equal to the minimum number of redundancies.

In addition, by performing the process as described above, the transmitter packet output unit 1205 transmits packets generated in each column of the output buffers BUFout, wherein the number of the generated packets does not exceed a sum of the number of valid symbols included in V symbols in which the symbol positions from the heads of the rows in the input buffers BUFin of the same column are equal to each other and an upper limit of the maximum number of redundancies.

Seventeenth Embodiment

In the present embodiment, the minimum number of redundancies $r_{min}$ is determined in accordance with an input packet. The configuration of the redundant packet transmission system of the present embodiment is similar to the configuration of the redundant packet transmission system shown in FIG. 18. Hereinafter, differences from the twelfth and thirteenth embodiments will be mainly described.

The encoder input buffer unit 1201 acquires a designated value of the number of redundancies included in (or added to) each packet 1110 to be transmitted. Alternatively, the encoder input buffer unit 1201 holds a correspondence table between header information and the number of redundancies, and acquires the number of redundancies set in the packet 1110 to be transmitted from the correspondence table. When a maximum value of the number of redundancies acquired for the packet 1110 to be transmitted present in a column C of the input buffers BUFin is denoted by MAX($r_{min}[C]$), the encoder input buffer unit 1201 rearranges the packets 1110 to be transmitted set in the input buffers BUFin so that the number of empty buffers of the column C≥MAX($r_{min}[C]$).

Figure 24:
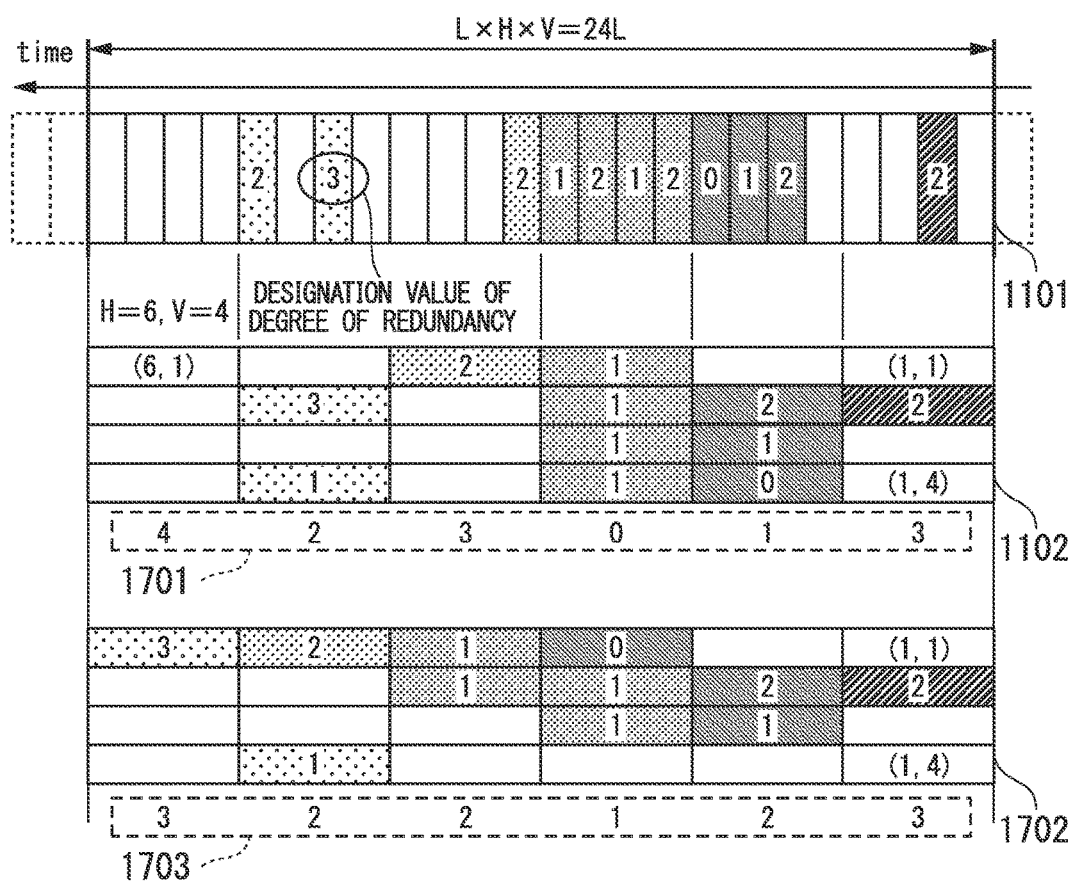
FIG. 24 is a diagram describing an operation of a transmitter when the minimum number $r_{min}$ of redundancies is determined based on an input packet in accordance with a seventeenth embodiment.

FIG. 24 is a diagram describing an operation of the transmitter 1200 when the minimum number of redundancies $r_{min}$ is determined in accordance with an input packet.

FIG. 24 shows an example of an operation of rearranging the packet input 1101 in consideration of the designated value of the number of redundancies of each packet 1110 to be transmitted. As in the twelfth embodiment, if the packets 1110 to be transmitted are set in the input buffers BUFin without considering the designated value of the number of redundancies of the packet 1110 to be transmitted, as shown in the input buffer setting 1102, the number of empty buffers 1701 of each column may be less than the designated value of the number of redundancies of the packet 1110 to be transmitted set for each column (e.g., a second column).

Therefore, the encoder input buffer unit 1201 of the present embodiment outputs input buffer setting 1702 obtained by rearranging the input buffer setting 1102 in consideration of the designated values of the number of redundancies of the input packets. The encoder input buffer unit 1201 rearranges packets in order from a first column by sequentially iterating a process of moving a packet 1110 to be transmitted set in a column to the next column so that the number of empty buffers of the column is greater than or equal to MAX($r_{min}[C]$) if the number of the empty buffers of the column is less than MAX($r_{min}[C]$). The number of empty buffers 1703 of each column rearranged in consideration of the designated value of the number of redundancies of the input packet becomes greater than or equal to MAX($r_{min}[C]$). An operation after the encoder input buffer unit 1201 outputs the input buffer setting 1702 is similar to those of the twelfth and thirteenth embodiments after the encoder input buffer unit 1201 outputs the input buffer setting 1102.

With the present embodiment, a user application can select the degree of redundancy for each packet in accordance with importance of information, and thus it is possible to suppress unnecessary redundant packet transfer.

Eighteenth Embodiment

In the present embodiment, a redundant packet transmission system performs retransmission control. The configuration of the redundant packet transmission system is similar to the configuration of the redundant packet transmission system shown in FIG. 18. Hereinafter, differences from the twelfth embodiment will be mainly described.

Figure 25:
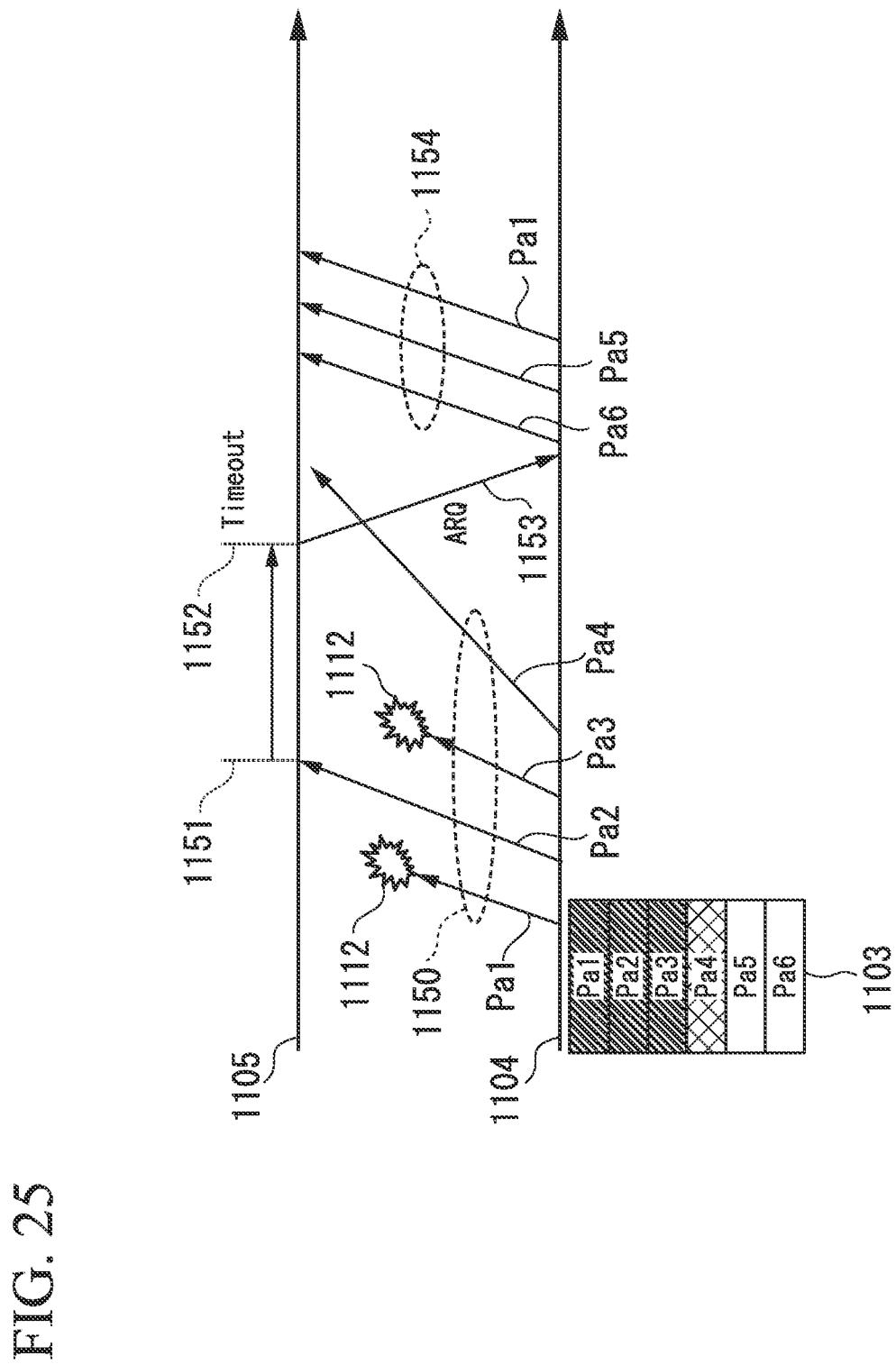
FIG. 25 is a sequence diagram of retransmission control of a redundant packet transmission system in accordance with an eighteenth embodiment.

FIG. 25 is a sequence diagram of retransmission control of the redundant packet transmission system of the present embodiment. FIG. 25 shows the case in which the number of rows V of the input buffers BUFin and the output buffers BUFout=6, the minimum number of redundancies $r_{min}$=the maximum number of redundancies $r_{max}$=1, and packets Pa1, Pa2, and Pa3 to be transmitted are set as packets 1110 to be transmitted from first to third rows of a certain column of the output buffer setting 1103. In addition, a plurality of pieces of parity Pa4, Pa5, and Pa6 calculated by the encoding unit 1203 are set in fourth to sixth rows of the output buffer setting of the column. The transmitter packet output unit 1205 outputs the packets Pa1, Pa2, and Pa3 to be transmitted and parity packets, wherein the number of which is determined based on $r_{min}$ and $r_{max}$, as transmission packets 1150. Here, a packet in which the parity Pa4 is set is sent. Hereinafter, packets in which the plurality of pieces of parity Pa4, Pa5, and Pa6 are set are referred to as parity packets Pa4, Pa5, and Pa6, respectively.

The decoding unit 1224 of the receiver 1220 may start decoding when the number of reception packets in each column reaches the number of packets to be transmitted in the column, that is, when packets with which the packets to be transmitted in the column can be decoded are received through the receiver input 1105. Thereby, it is possible to shorten the delay of decoding. In this case, the decoding unit 1224 sets a value ("1") indicating erasure in an element (bit) of loss packet information E corresponding to a packet which has not been received in the column and performs a decoding process.

A retransmission request unit (not shown) of the receiver 1220 transmits a retransmission request (automatic repeat request (ARQ)) packet 1153 to the transmitter 1200 if the number of received packets in each column in the receiver input 1105 from an arrival time 1151 of a first packet to a timeout time 1152 is less than the number of the packets to be transmitted in each column. The retransmission request packet 1153 represents a packet that has been successfully received by the receiver 1220, and for example, it is possible to use a buffer number read from the received packet.

It is to be noted that the retransmission request unit (not shown) acquires the number of packets to be transmitted in the column from data validity information U added to the parity packet Pa4 based on an output of the empty region detection unit 1202. In addition, the period from the arrival time 1151 of the first packet to the timeout time 1152 corresponds to a retransmission timer in TCP.

It is to be noted that the retransmission timer, for example, is disclosed in V. Paxson et al. "Computing TCP'S Retransmission Timer", November 2000 ("http://tools.ietf.org/html/rfc2988") (Reference Document 2).

When a receiving unit (not shown) of the transmitter 1200 receives the retransmission request packet 1153, the transmitter packet output unit 1205 retransmits (the number of packets to be transmitted the number of arriving packets+ $r_{min}$) retransmission request response packets 1154 in order of priority of the parity packets Pa5 and Pa6 which are not transmitted, the packets Pa1 and Pa3 to be transmitted which do not arrive, and the parity packet Pa4 which does not arrive for a column corresponding to the buffer number of the arriving packet indicated by the retransmission request packet 1153.

The decoding unit 1224 of the receiver 1220 decodes a packet to be transmitted using the packet Pa2 arriving before transmission of the retransmission request packet 1153 and the retransmitted retransmission request response packets 1154 (the packets Pa5, Pa6, and Pa1). Thereby, it is possible to cope with the occurrence of a loss packet 1112 which cannot be corrected by decoding.

It is to be noted that the decoding unit 1224 may use the packet Pa4, which has arrived after the retransmission request packet 1153 is sent, for decoding. In addition, the retransmission process may be performed a plurality of times until decoding is completed.

Nineteenth Embodiment

In the present embodiment, redundant packet transmission is performed using a plurality of paths. Although the configuration of a redundant packet transmission system of the present embodiment is similar to the configuration of the redundant packet transmission system shown in FIG. 18, the transmitter 1200 and the receiver 1220 are connected through parallel transmission paths which are a plurality of packet transmission paths 1210. Hereinafter, differences from the twelfth embodiment will be mainly described.

Figure 26:
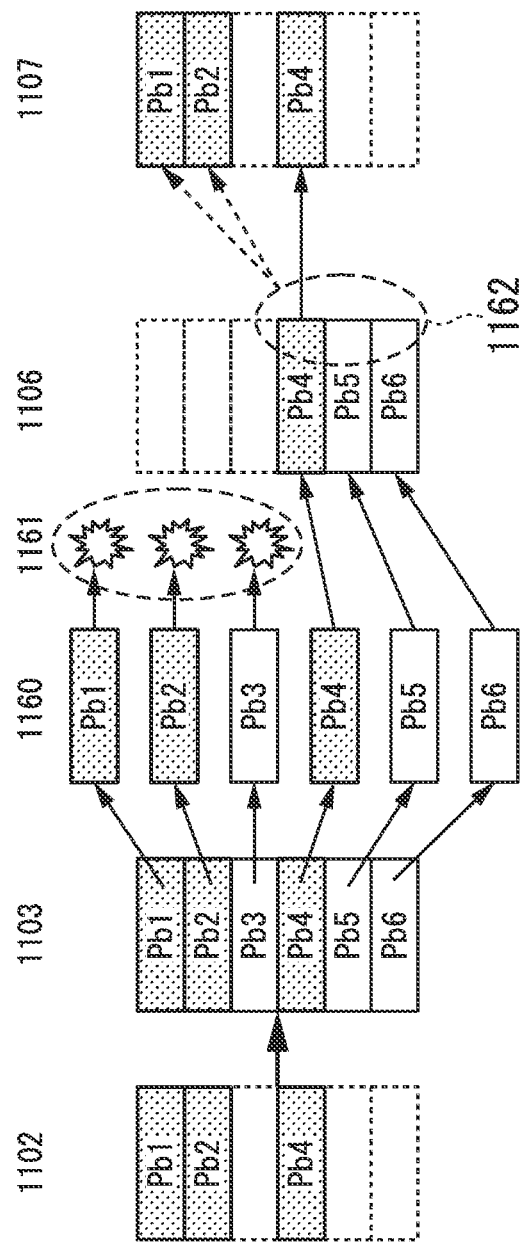
FIG. 26 is a diagram describing redundant packet transmission using a plurality of paths in accordance with a nineteenth embodiment.

FIG. 26 is a diagram describing redundant packet transmission using a plurality of paths. Packets Pb1, Pb2, and Pb4 to be transmitted are set in first, second, and fourth rows of input buffer setting 1102 of a certain column, respectively. In this case, the packets Pb1, Pb2, and Pb4 to be transmitted are set in first, second, and fourth rows of output buffer setting 1103 of the column, and a plurality of pieces of parity Pb3, Pb5, and Pb6 are set in third, fifth, and sixth rows. The transmitter packet output unit 1205 generates transmission packets in which Pb1 to Pb6 of setting content of rows of the output buffer setting 1103 of the column are set. The transmitter packet output unit 1205 sends each transmission packet to a path allocated for each row among parallel transmission paths 1160 between the transmitter 1200 and the receiver 1220. Thereby, tolerance to a path failure is improved.

Even when there are loss packets 1161 lost in the transmission paths due to path failures, the receiver 1220 can restore the original packets Pb1, Pb2, and Pb3 to be transmitted from arbitrary transmission packets equal in number to the packets to be transmitted. The example of FIG. 26 shows the case in which transmission packets in which the Pb1 to Pb3 are set are the loss packets 1161 and transmission packets in which the Pb4 to Pb6 are set are received in the receiver 1220. The process in the receiver 1220 is similar to those of the above-described twelfth to eighteenth embodiments, and the transmission packets in which the Pb4 to Pb6 are set are set in the reception buffer input 1106. Because the number of the packets to be transmitted is 3, the decoding unit 1224 of the receiver 1220 can perform erasure correction on the packets Pb1 and Pb2 to be transmitted from received packets as indicated by reference sign 1162.

It is to be noted that when the minimum number of redundancies $r_{min}$ is set, erasure correction of packets to be transmitted is guaranteed for failures of $r_{min}$ paths.

It is to be noted that as in the thirteenth embodiment, the transmitter 1200 may generate all transmission packets from parity. In this case, although the receiver 1220 needs to perform decoding computation of all packets to be transmitted, tolerance to path eavesdropping is high because it is impossible to decode any packet unless eavesdropping on paths equal in number to the packets to be transmitted is performed and therefore it is equivalent to performing of secret sharing.

It is to be noted that secret sharing, for example, is disclosed in "Secret sharing system", Nippon Telegraph and Telephone Corporation, 2012 (http://event.ecl.ntt.co.jp/forum2012/info/exhibition/pdf/C-44.pdf) (Reference Document 3).

In addition, although the case in which a path allocated for each row is fixed allocation is shown, a path may be dynamically changed.

Twentieth Embodiment

A redundant packet transmission system of the present embodiment performs multiplexing, demultiplexing, and relaying.

Figure 27:
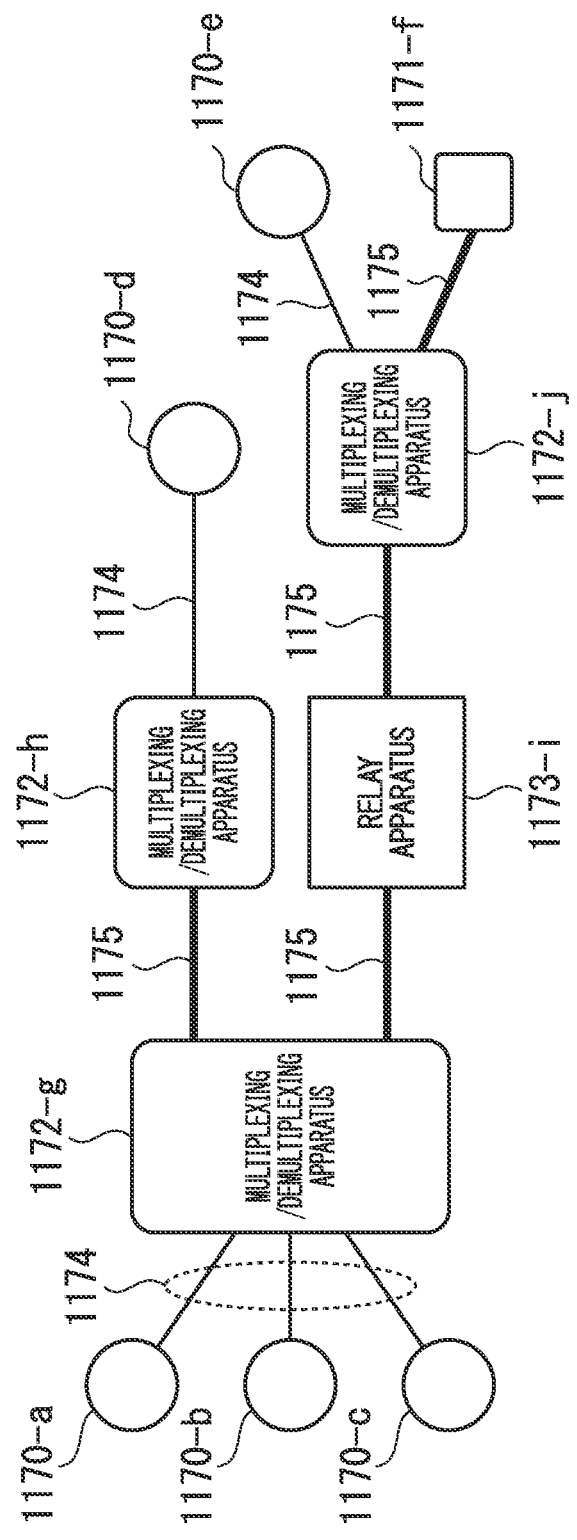
FIG. 27 is a diagram showing a connection configuration of a redundant packet transmission system in accordance with a twentieth embodiment.

FIG. 27 shows a connection configuration of the redundant packet transmission system in accordance with the present embodiment. The redundant packet transmission system shown in FIG. 27 includes non-redundancy-compliant terminals 1170-a, 1170-b, 1170-c, 1170-d, and 1170-e, a redundancy-compliant terminal 1171-f, multiplexing/demultiplexing apparatuses 1172-g, 1172-h, and 1172-j, and a relay apparatus 1173-i. The multiplexing/demultiplexing apparatus 1172-g is connected to the non-redundancy-compliant terminals 1170-a, 1170-b, and 1170-c by non-redundancy lines 1174, and connected to the multiplexing/demultiplexing apparatus 1172-h and the relay apparatus 1173-i by redundancy lines 1175. In addition, the multiplexing/demultiplexing apparatus 1172-j is connected to the non-redundancy-compliant terminal 1170-e by the non-redundancy line 1174, and connected to the redundancy-compliant terminal 1171-f and the relay apparatus 1173-i by the redundancy lines 1175. The multiplexing/demultiplexing apparatus 1172h is connected to the non-redundancy-compliant terminal 1170d by the non-redundancy line 1174. It is to be noted that the redundancy line 1175 is a line for transmitting/receiving a packet that is compliant with redundant packet transmission of at least any one of the above-described twelfth to nineteenth embodiments, and the non-redundancy line 1174 is a line for transmitting/receiving a packet that is not compliant with any redundant packet transmission.

The multiplexing/demultiplexing apparatus 1172-g separates packets received from the non-redundancy-compliant terminals 1170-a, 1170-b, and 1170-c connected by the non-redundancy lines 1174 for the redundancy lines 1175 in accordance with destinations of the packets or duplicates the packets for the redundancy lines 1175. The multiplexing/demultiplexing apparatus 1172-g performs a process similar to those of the transmitters 1200 of the twelfth to nineteenth embodiments described above for each redundancy line 1175 and sends the generated packets to the redundancy lines 1175 to which the multiplexing/demultiplexing apparatus 1172-h and the relay apparatus 1173-i are connected.

Likewise, the multiplexing/demultiplexing apparatus 1172-j separates packets received from the non-redundancy-compliant terminal 1170-e connected by the non-redundancy line 1174 for the redundancy lines 1175 in accordance with destinations of the packets or duplicates the packets for the redundancy lines 1175. The multiplexing/demultiplexing apparatus 1172-j performs a process similar to those of the transmitters 1200 of the twelfth to nineteenth embodiments described above for the redundancy lines 1175 and sends generated packets to the corresponding redundancy lines 1175 to which the relay apparatus 1173-i and the redundancy-compliant terminal 1171-f are connected.

In contrast, after erasure correction is performed by performing a process similar to those of the receivers 1220 of the above-described twelfth to nineteenth embodiments on reception packets from the redundancy lines 1175, the multiplexing/demultiplexing apparatus 1172-g separates or duplicates and sends the packets to the non-redundancy lines 1174 to which the non-redundancy-compliant terminals 1170-a, 1170-b, and 1170-c are connected. In addition, after erasure correction is performed by performing a process similar to those of the receivers 1220 of the above-described twelfth to nineteenth embodiments on the reception packet from the redundancy line 1175 to which the relay apparatus 1173-i is connected, the multiplexing/demultiplexing apparatus 1172-j separates or duplicates and sends packets to the non-redundancy line 1174 to which the non-redundancy-compliant terminal 1170-e is connected and the redundancy line 1175 to which the redundancy-compliant terminal 1171-f is connected.

In this manner, the redundancy and the restoration of the loss packet are performed in transmission between network nodes which aggregate non-redundancy packets from end points. This method enables the accommodation of any non-redundancy-compliant terminals.

In addition, after erasure correction is performed by performing a process similar to those of the receivers 1220 of the above-described twelfth to nineteenth embodiments on the reception packet from the redundancy line 1175, the relaying apparatus 1173-i outputs a packet to the other redundancy line 1175. In this manner, the restoration of the loss packet is performed in a network node positioned in the middle of a transfer path of a redundant packet. This method improves end-to-end erasure correction capability.

[Supplementary Notes]

It is to be noted that the functional units of the transmitters 1200 and the receivers 1220 in the above-described twelfth to twentieth embodiments are realized through dedicated hardware, or their functions may be realized by recording a program for realizing the functional units on a computer-readable recording medium and causing a computer system to read and execute the program recorded on the recording medium. It is to be noted that the "computer system" used here includes an operating system (OS) and hardware such as peripheral devices. In addition, the "computer system" is assumed to include a World Wide Web (WWW) system which is provided with a homepage providing environment (or displaying environment). In addition, the "computer-readable recording medium" refers to a storage apparatus, including a portable medium such as a flexible disk, a magneto-optical disc, a read only memory (ROM), or a compact disc (CD)-ROM, and a hard disk embedded in the computer system. Furthermore, the "computer-readable recording medium" is assumed to include a medium that holds a program for a constant period of time, such as a volatile memory (e.g., random access memory (RAM)) inside a computer system serving as a server or a client when the program is transmitted via a network such as the Internet or a communication circuit such as a telephone circuit.

In addition, the above program may be transmitted from a computer system storing the program in a storage apparatus or the like to another computer system via a transmission medium or transmission waves in the transmission medium. Here, the "transmission medium" for transmitting the program refers to a medium having a function of transmitting information, such as a network (communication network) like the Internet or a communication circuit (communication line) like a telephone circuit. In addition, the above program may be a program for realizing part of the above-described functions. Furthermore, the above-described program may be a program, i.e., a so-called differential file (differential program), capable of realizing the above-described functions in combination with a program already recorded on the computer system.

It is to be noted that the above twelfth to twentieth embodiments describes examples in which the input buffers BUFin are used from the top to the bottom and from the left to the right because it is optimum to use the input buffers BUFin so as to conform to the order of original input packets as close as possible. However, as long as the direction is fixed, the order may be changed from the bottom to the top and from the right to the left, or the top/bottom and the left/right may be transposed.

In addition, although the above twelfth to twentieth embodiments describe examples in which buffer lengths of the input buffers BUFin, the output buffers BUFout, and the reception buffers BUFrcv are fixed lengths, the buffer lengths may be variable lengths.

In addition, the transmitter 1200 may separately transmit the data validity information and the parity packet to the receiver 1220.

In the above twelfth to twentieth embodiments, when an encoding engine for realizing the encoding unit 1203 and a decoding engine for realizing the decoding unit 1224 are implemented by independent modules such as hardware, a coprocessor, or a graphics processing unit (GPU), the copy of the setting content of the buffers is assumed. That is, the setting content is copied from an input buffer BUFin to an output buffer BUFout. However, when all the functional units are realized by software, the transmitter 1200 may operate under the assumption that a pointer to the setting content of the input buffer BUFin is passed and the setting content is not copied to the output buffer BUFout. For example, for the input packet information, a pointer (a buffer number, an address, or the like) to the setting content of a packet to be transmitted within the input buffer BUFin and a first symbol position within the buffer are set in the output buffer BUFout. In addition, for the parity information, a pointer to a buffer inside the encoding unit 1203 and the first symbol position within the buffer may be set in the output buffer BUFout.

In addition, the maximum number of redundancies $r_{max}$, which indicates the maximum number of parity packets per column and is used to avoid excessive redundancy when a packet rate is low, for example, is set in accordance with an application and/or an operational rule based on a service level agreement (SLA).

Advantageous Effects

As described above, the twelfth to twentieth embodiments of the present invention is characterized in that the embodiments focus on the singularity of an MDS code which is an encoding scheme of a coding rate of 0.5 with which data to be transmitted can be decoded using data of half a combination of the data to be transmitted and a plurality of pieces of parity equal in number thereto, and the transmitter generates the plurality of pieces of parity by encoding the data to be transmitted through the MDS code. When the encoding is performed, the transmitter performs padding using an invalid symbol (0) on data corresponding to a packet which does not arrive so as to suppress the encoding delay due to fluctuation in arrivals of data to be transmitted in the transmitter. At this time, the transmitter can perform padding so that overlapping of symbol positions of data to be transmitted between rows is reduced as in the fifteenth embodiment in order not to drop the degree of redundancy at the time of the encoding. The transmitter performs packet interleaving on packets in which at least one of encoded data and parity is set and transmits the packets. The receiver restores the data to be transmitted from the data or parity included in the packets received from the transmitter.

In the conventional FEC, encoding is not performed until all FEC blocks are filled with valid information, and thus a maximum delay time is inversely proportional to a transfer rate in the case of a variable rate and the maximum delay time is not guaranteed in relation to a burst input unless a timeout mechanism is separately used.

However, in accordance with the above-described twelfth to twentieth embodiments, it is possible to always perform encoding at given time intervals even for the variable rate or a packet input of burst arrival by inserting an invalid symbol into an input buffer having a fixed length in relation to a time at which there is no input data/packet. Thus, packet erasure correction by packet redundancy or erasure correction for a path failure in packet transmission through a plurality of paths is possible without causing the excessive delay.

In addition, in the conventional FEC, a memory for accommodating encoding/decoding matrices for each type of degree of redundancy and a computation circuit are necessary because the encoding/decoding matrices needs to be changed in order to change the degree of redundancy.

However, in accordance with the above-described twelfth to twentieth embodiments, the degree of redundancy is determined by a ratio of an empty region in each column, and thus the encoding/decoding matrices, the encoding circuit, and the decoding circuit are necessary in only one type. In addition, it is possible to change the degree of redundancy without performing special control from an external application such as a setting of the degree of redundancy for the encoding circuit. That is, if the packet rate for the packet input 1101 decreases, the ratio of the empty region increases, and thus the number of redundancies increases. In contrast, if the packet rate increases, the ratio of the empty region is reduced, and thus the number of redundancies decreases. In other words, this means that the setting of the redundancy in the packet transmission can be performed autonomously if the application simply changes the transmission packet rate.

It is to be noted that the binary operator symbol of the first to eleventh embodiments and the symbol * of the twelfth to twentieth embodiments have the same meaning.

In addition, the symbol F of the first to eleventh embodiments indicates a read signal of an FIFO and the symbol F of the twelfth to twentieth embodiments indicates a matrix.

In addition, in the first to eleventh embodiments, a suffix R or R×R indicating the number of lanes is explicitly indicated for matrices A, B, C, D, and the like. On the other hand, although suffix notations for matrices A, B, D, F, and the like are not indicated (omitted) in the twelfth to twentieth embodiments, the twelfth to twentieth embodiments are similar to the first to eleventh embodiments. As in the first to eleventh embodiments, the suffix may be explicitly indicated in the twelfth to twentieth embodiments, and the suffix may be omitted in the first to eleventh embodiments as in the twelfth to twentieth embodiments.

In addition, the above-described embodiments can be combined where possible.

Although the embodiments of the present invention have been described in detail with reference to the drawings, specific configurations are not limited to the embodiments, and a design and the like that do not depart from the gist of the present invention may also be included.

INDUSTRIAL APPLICABILITY

The present invention makes it possible to dynamically set the degree of redundancy for data erasure due to damage of a medium and/or an uncorrected error when a connection is established between a data encoding end and a data decoding end using a plurality of physical or logical media, thereby making it possible to correct the erasure even at the time of a degeneration operation and to reduce necessary physical media by employing a band that is not subjected to information transmission in redundancy.

DESCRIPTION OF REFERENCE SIGNS

101 Encoder
102 Parallel media
103 Decoder
104 Deframer
105 MDS encoding computer
106 MDS decoding computer
107 Framer
108 Input parallel data
109 Output parallel data
110 State vector U(t) (use situation of input parallel lane)
111 Vector M(t) (valid input parallel data)
112 Transmission information Y(t) (transmission information for parallel media)
113 Reception information vector Y' (t) (reception information from parallel media)
114 Vector $M_{sub}(t)$ (reproduced parallel data)
115 Erasure vector E(t) (uncorrected error information)
120 Parity S(t) (output of MDS encoding computer)
121 Selector
122 MDS decoding computer
130 Packetizing function unit
131 Depacketizing function unit
132 Wp(t) (output of packetizing function unit)
133 Rp(t) (input of depacketizing function unit)
134 Packet
135 Error detection/correction code
140 FIFO buffer
141 Shaper control circuit
142 Policing control circuit
143 FIFO use rate
144 Guaranteed value rmin (lower limit of degree of redundancy)
145 Limit value rmax (upper limit of degree of redundancy)
1101 Packet input
1102 Input buffer setting
1103 Output buffer setting
1104 Transmitter output
1105 Receiver input
1106 Reception buffer input
1107 Outputs after decoding
1108 Receiver output
1110 Packet to be transmitted
1111 Parity
1112 Loss packet
1113 Uncorrected erasure packet
1114 Corrected erasure packet
1115 Parity which is not sent
1130-1, 1130-2, 1130-3 Packet to be transmitted having packet length which does not exceed buffer length L
1131 Packet to be transmitted having packet length which exceeds buffer length L
1131-1, 1131-2 Fragment packet
1132 Padding information
1150 Transmission packet
1151 Packet arrival time
1152 Timeout time
1153 Retransmission request packet
1154 Retransmission request response packet
1160 Parallel transmission path
1161 Loss packet
1162 Erasure correction
1170-a, 1170-b, 1170-c, 1170-d, 1170-e Non-redundancy-compliant terminal
1171-f Redundancy-compliant terminal
1172-g, 1172-h, 1172-j Multiplexing/demultiplexing apparatus
1173-i Relay apparatus
1174 Non-redundancy line
1175 Redundancy line
1200 Transmitter
1201 Encoder input buffer unit
1202 Empty region detection unit
1203 Encoding unit
1204 Output packet buffer unit
1205 Transmitter packet output unit
1210 Packet transmission path
1220 Receiver
1221 Packet input buffer unit (receiving unit)
1222 Decoder input buffer unit
1223 Packet loss detection unit
1224 Decoding unit
1225 Output packet selection unit
1300 Encoder input buffer column before optimization
1301 Number of invalid symbols of each symbol column before optimization
1310 Encoder input buffer column after optimization
1311 Number of invalid symbols of each symbol column after optimization
1701 Number of empty buffers of each column
1702 Input buffer setting rearranged in consideration of designated value of number of redundancies of input packet
1703 Number of empty buffers of each column rearranged in consideration of designated value of number of redundancies of input packet

The invention claimed is:

1. A parallel data encoding/decoding system which performs parallel data transmission from an encoder to a decoder using a plurality of lanes, the number of the plurality of lanes being R, R being an integer that is larger than or equal to 2,
wherein the encoder generates a code vector M having R elements, each element of the code vector M is a symbol to be transmitted in parallel using the plurality of lanes, the code vector M being denoted M={$m_0, m_1, m_2, \ldots m_{R-1} | m_i \in GF(2^n)$}, $m_0, m_1, m_2, \ldots m_{R-1}$ being the elements of the code vector M, $GF(2^n)$ being an n-order extension field of a Galois field, the number of the elements being equal to the number of the plurality of lanes, and the state vector U having R elements, each element in the state vector U is a code indicating to the decoder whether each of the corresponding elements of the code vector M is valid or invalid, the state vector U being denoted as U=($u_0, u_1, u_2, \ldots u_{R-1} | u_i \in \{0, 1\}$), $u_0, u_1, u_2, \ldots u_{R-1}$ being the elements of the state vector U,
calculates products {$m_0u_0, m_1u_1, m_2u_2, \ldots, m_{R-1}u_{R-1} | m_i \in M, u_i \in U$} of the elements of the code vector M and the elements of the state vector U,
generates a transmission vector Y by encoding the calculated products using a maximum distance separable (2R, R) block code with which erasure of R symbols is capable of being corrected,
transmits the transmission vector Y through the plurality of lanes, and
transmits the state vector U through the plurality of lanes or a path separate from the plurality of lanes, the encoder comprises an MDS encoding computer that performs the encoding of the calculated products using the maximum distance separable (MDS) block code, and the decoder decodes a subset $M_{sub}$ of the code vector M, the subset $M_{sub}$ being constituted of a valid element of the code vector M, using a received reception vector Y', the received state vector U, and an erasure vector E indicating whether each element of the transmission vector Y has been erased in a transmission/reception section.

2. The parallel data encoding/decoding system according to claim 1, wherein the encoder and the decoder are connected by R lanes, R being an integer that is larger than or equal to 2, the encoder calculates parity S for the products of the elements of the code vector M of R symbols and the state vector U of R bits in which validity and invalidity of each element are indicated by codes "1" and "0", respectively, and transmits the state vector U along with the transmission vector Y defined by the parity S using a generator matrix G of a maximum-distance-separable (MDS) code of a coding rate of 0.5 having erasure correction capability of R symbols, and the decoder decodes the subset $M_{sub}$ constituted of the valid element of the code vector M by solving Formula (C1) using the received reception vector Y', the received state vector U, and the erasure vector E indicating erasure and reception of each element of the transmission vector Y in the transmission/reception section by codes "1" and "0", respectively, and performs erasure correction

[Expression 85]

$$(M \odot U)A_R + (S \odot E)I = Y' \quad \text{Formula (C1)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$G = \{I_R | A_R\}$$

$$S = (M \odot U)A_R$$

$$Y = S$$

$$E = \{e_0, e_1, e_2, \ldots, e_{R-1} | e_i \in \{0,1\}\}$$

$$M_{sub} = \{m_i \in M | u_i = 1, u_i \in U\} \quad \text{[Expression 86]}$$

I is a unit matrix and $GF(2^n)$ is an n-order extension field of a Galois field.

3. The parallel data encoding/decoding system according to claim 1, wherein the encoder and the decoder are connected by R lanes, R being an integer that is larger than or equal to 2, the encoder calculates parity S for the products of the elements of the code vector M of R symbols and the state vector U of R bits in which validity and invalidity of each element are indicated by codes "1" and "0", respectively, using a generator matrix G of an MDS code of a coding rate of 0.5 having erasure correction capability of R symbols and transmits the state vector U along with the transmission vector Y defined by the code vector M, the state vector U, and the parity S, and the decoder decodes the subset $M_{sub}$ constituted of the valid element of the code vector M by solving Formula (C2) using the received reception vector Y', the received state vector U, the erasure vector E indicating erasure and reception of each element of the transmission vector Y in the transmission/reception section by codes "1" and "0", respectively, and a matrix $B_R(U)$ constituted of a row corresponding to $u_j=1$, where $u_j \in U$, of a matrix $A_R$ and a row corresponding to $u_j=0$, where $u_j \in U$, of a unit matrix I, and performs erasure correction

[Expression 87]

$$(Y \odot E)B_R + (S \odot U)I = Y'B_R \quad \text{Formula (C2)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$M \odot U = \{m_0 u_0, m_1 u_1, m_2 u_2, \ldots, m_{R-1} u_{R-1} | m_i \in M, u_i \in U\}$$

$$G = \{I_R | A_R\}$$

$$S = (M \odot U)A_R$$

$$Y = M \odot U + S \odot \overline{U}$$

$$E = \{e_0, e_1, e_2, \ldots, e_{R-1} | e_i \in \{0,1\}\}$$

$$M_{sub} = \{m_i \in M | u_i = 1, u_i \in U\} \quad \text{[Expression 88]}$$

$GF(2^n)$ is an n-order extension field of a Galois field.

4. The parallel data encoding/decoding system according to claim 1, wherein the encoder and the decoder are connected by R lanes, R being an integer that is larger than or equal to 2, the encoder calculates parity S using the code vector M of R symbols, the state vector U of R bits in which validity and invalidity of each element are indicated by codes "1" and "0", respectively, and a Cauchy matrix $C_{R \times R}$ of R rows and R columns constituted of elements of $GF(2^n)$ and transmits the state vector U along with the transmission vector Y defined by the parity S, and the decoder decodes the subset $M_{sub}$ constituted of the valid element of the code vector M by solving Formula (C3) using the received reception vector Y', the received state vector U, and the erasure vector E indicating erasure and reception of each element of the transmission vector Y in the transmission/reception section by codes "1" and "0", respectively, and performs erasure correction

[Expression 89]

$$(M \odot U)C_{R \times R} + (S \odot E)I = Y \quad \text{Formula (C3)}$$

where $$M = \{m_0, m_1, m_2, \ldots, m_{R-1} | m_i \in GF(2^n)\}$$

$$U = \{u_0, u_1, u_2, \ldots, u_{R-1} | u_i \in \{0,1\}\}$$

$$S = (M \odot U)C_{R \times R}$$

$Y=S$ $E=\{e_0,e_1,e_2,\ldots,e_{R-1}|e_i\in\{0,1\}\}$ $M_{sub}=\{m_i\in M|u_i=1,u_i\in U\}$  [Expression 90]

I is a unit matrix and $GF(2^n)$ is an n-order extension field of a Galois field.

5. The parallel data encoding/decoding system according to claim 1,
wherein the encoder and the decoder are connected by R lanes, R being an integer that is larger than or equal to 2,
the encoder calculates parity S using the code vector M of R symbols, the state vector U of R bits in which validity and invalidity of each element are indicated by codes "1" and "0", respectively, and a Cauchy matrix $C_{R\times R}$ of R rows and R columns constituted of elements of $GF(2^n)$ and transmits the state vector U along with a transmission vector Y defined by the code vector M, the state vector U, and the parity S, and
the decoder decodes the subset $M_{sub}$ constituted of the valid element of the code vector M by solving Formula (C4) using the received reception vector Y', the received state vector U, the erasure vector E indicating erasure and reception of the elements of the transmission vector Y in the transmission/reception section by codes "1" and "0", respectively, and a matrix $D_R(U)$ constituted of a row corresponding to $u_i=1$, where $u_i\in U$, of $C_{R\times R}$ and a row corresponding to $u_j=0$, where $u_j\in U$, of a unit matrix I, and performs erasure correction

[Expression 91]

$(Y\bigcirc E)D_R+S\bigcirc U)I=Y'D_R$  Formula (C4)

where $M=\{m_0,m_1,m_2,\ldots,m_{R-1}|m_i\in GF(2^n)\}$ $U=\{u_0,u_1,u_2,\ldots,u_{R-1}|u_i\in\{0,1\}\}$ $S=(M\bigcirc U)C_{R\times R}$ $Y=M\bigcirc U+S\bigcirc\overline{U}$ $E=\{e_0,e_1,e_2,\ldots,e_{R-1}|e_i\in\{0,1\}\}$ $M_{sub}=\{m_i\in M|u_i=1,u_i\in U\}$  [Expression 11]

$GF(2^n)$ is an n-order extension field of a Galois field.

6. The parallel data encoding/decoding system according to claim 1,
wherein the encoder and the decoder are connected by R lanes, R being an integer that is larger than or equal to 2,
the encoder calculates a coefficient vector P of a remainder polynomial of R symbols in a shortened $code_{shortened}$ RS(2R, R) of a Reed-Solomon code RS(N, K); R in a generating polynomial g(X) for the products of the elements of the code vector M of R symbols and the state vector U of R bits in which validity and invalidity of each element are indicated by codes "1" and "0", respectively, and transmits the state vector U along with the transmission vector Y defined by P, and
the decoder decodes the subset $M_{sub}$ constituted of the valid element of the code vector M by solving Formula (C5) using the received reception vector Y', the received state vector U, the erasure vector E indicating erasure and reception of each element of the transmission vector Y in the transmission/reception section by codes "1" and "0", respectively, a Vandermonde matrix $V_R(k)$, and a Vandermonde matrix $W_R(k)$, and performs erasure correction

[Expression 93]

$(M\bigcirc U)W_R(k)+(P\bigcirc E)V_R(k)=Y'V_R(k)$  Formula (C5)

where $M=\{m_0,m_1,m_2,\ldots,m_{R-1}|m_i\in GF(2^n)\}$ $U=\{u_0,u_1,u_2,\ldots,u_{R-1}|u_i\in\{0,1\}\}$ $M\bigcirc U=\{m_0u_0,m_1u_1,m_2u_2,\ldots,m_{R-1}u_{R-1}|m_i\in M, u_i\in U\}$ $g(X)=\Pi_{i=\{k,k+1,k+2,\ldots k+R-1\}}(X-\alpha_i)$ $RS(N,K); R=N-K, N=2^n-1$ $P=\{p_0,p_1,p_2,\ldots,p_{R-1}\}$ $Y=P$ $E=\{e_0,e_1,e_2,\ldots,e_{R-1}|e_i\in\{0,1\}\}$ $V_R(k)=\{v_{j,i}=\alpha_{i+k}^j|i,j=\{0,1,\ldots,R-1\}\}$ $W_R(k)=\{w_{j,i}=\alpha_{i+k}^{j+R}|i,j=\{0,1,\ldots,R-1\}\}$ $M_{sub}=\{m_i\in M|u_i=1,u_i\in U\}$  [Expression 13]

$GF(2^n)$ is an n-order extension field of a Galois field, k is an integer greater than or equal to 0, and $\alpha$ are non-zero elements of $GF(2^n)$.

7. The parallel data encoding/decoding system according to claim 1,
wherein the encoder and the decoder are connected by R lanes, R being an integer that is larger than or equal to 2,
the encoder calculates a coefficient vector P of a remainder polynomial of R symbols in a shortened $code_{shortened}$ RS(2R, R) of a Reed-Solomon code RS(N, K); R in a generating polynomial g(X) for the products of the elements of the code vector M of R symbols and the state vector U of R bits in which validity and invalidity of each element are indicated by codes "1" and "0", respectively, and transmits the state vector U along with the transmission vector Y defined by the code vector M, the state vector U, and the coefficient vector P, and
the decoder decodes the subset $M_{sub}$ constituted of the valid element of the code vector M by solving Formula (C6) using the received reception vector Y', the received state vector U, the erasure vector E indicating erasure and reception of each element of the transmission vector Y in the transmission/reception section by codes "1" and "0", respectively, and a matrix $Z_R(U)$ constituted of a matrix corresponding to $u_j=1$, where $u_j\in U$, of a Vandermonde matrix $W_R(k)$ and a row corresponding to $u_j=0$, where $u_j\in U$, of a Vandermonde matrix $V_R(k)$, and performs erasure correction[
]

[Expression 95]

$(Y\bigcirc E)Z_R+(P\bigcirc U)V_R=Y'Z_R$  Formula (C6)

where $M=\{m_0,m_1,m_2,\ldots,m_{R-1}|m_i\in GF(2^n)\}$ $U=\{u_0, u_1, u_2, \ldots, u_{R-1} | u_i \in \{0,1\}\}$ $M \odot U = \{m_0 u_0, m_1 u_1, m_2 u_2, \ldots, m_{R-1} u_{R-1} | m_i \in M, u_i \in U\}$ $g(X) = \Pi_{i=\{k, k+1, k+2, \ldots k+R-1\}}(X - \alpha_i)$ $RS(N, K); R = N-K, N = 2^n - 1$ $P = \{p_0, p_1, p_2, \ldots, p_{R-1}\}$ $Y = M \odot U + P \odot \overline{U}$ $E = \{e_0, e_1, e_2, \ldots, e_{R-1} | e_i \in \{0,1\}\}$ $W_R(k) = \{w_{j,i} = \alpha_{i+k}^{j+R} | i, j = \{0, 1, \ldots, R-1\}\}$ $V_R(k) = \{v_{j,i} = \alpha_{i+k}^{j} | i, j = \{0, 1, \ldots, R-1\}\}$ $M_{sub} = \{m_i \in M | u_i = 1, u_i \in U\}$  [Expression 15]

GF($2^n$) is an n-order extension field of a Galois field, k is an integer greater than or equal to 0, and α are non-zero elements of GF($2^n$).

8. The parallel data encoding/decoding system according to claim 1,
wherein the plurality of lanes form a parallel bus constituted of R logical lanes,
the encoder writes an input Din for the parallel bus to input FIFOs independently provided for elements,
the encoder generates a read signal F of R-bits in which each element indicates reading and reading stop of one symbol by "1" and "0", respectively, designates outputs of the input FIFOs as the code vector M, designates the read signal F as the state vector U, and transmits the state vector U along with the transmission vector Y, and
the decoder writes the subset $M_{sub}$ obtained by calculation to output FIFOs independently provided for elements and reads an output Dout for the parallel bus from the output FIFOs.

9. The parallel data encoding/decoding system according to claim 1,
wherein the encoder and the decoder perform parallel packet transmission using R logical lanes,
the encoder performs writing to input FIFOs independently provided for the logical lanes,
the encoder generates a read signal F of R-bits in which each element indicates reading and reading stop of one symbol by "1" and "0", respectively, designates outputs of the input FIFOs as the code vector M, designates the read signal F as the state vector U, and transmits the state vector U along with the transmission vector Y, and
the decoder writes the subset $M_{sub}$ obtained by calculation to output FIFOs independently provided for the logical lanes and reads packets for the logical lanes from the output FIFOs.

10. The parallel data encoding/decoding system according to claim 8,
wherein the encoder sets a minimum value rmin and a maximum value rmax of degree of redundancy which satisfies 0≤rmin≤rmax≤R,
the encoder generates the read signal F in accordance with Formula (C111), selects a symbol, the number of which is indicated by Formula (C112), from the transmission vector Y, transmits only the selected symbol to a corresponding logical transmission lane, and determines a non-selected symbol as erasure, and the decoder performs erasure correction in relation to the non-selected symbol and an erasure symbol in transmission

[Expression 101]

$F = \{f_0, f_1, f_2, \ldots, f_{R-1} | \Sigma_{i=0}^{R-1} f_i \leq R - r_{min}, f_i \in \{0,1\}\}$  Formula (C111)

$\min(R, r_{max} + \Sigma_{i=0}^{R-1} f_i)$  Formula (C112).

11. The parallel data encoding/decoding system according to claim 10,
wherein the encoder and the decoder cause a physical transmission lane corresponding to a logical transmission lane of the non-selected symbol to transition to a low power consumption mode,
the encoder and the decoder stop supply power for the physical transmission lane, or
the encoder and the decoder physically exclude the physical transmission lane.

12. The parallel data encoding/decoding system according to claim 8,
wherein the encoder adds an error correction code or an error detection code to a time series block of elements of the transmission vector Y for each logical transmission lane and transmits the time series block to the logical transmission lanes, and
for each logical transmission lane, the decoder designates a reception block as an element of the reception vector Y' without change if an error is not detected from the time series block, designates a reception block after correction as the element of the reception vector Y' if a correctable error is detected from the time series block, and determines the reception block as loss and performs erasure correction if an uncorrected error is detected from the time series block.

13. The parallel data encoding/decoding system according to claim 1,
wherein the parallel data encoding/decoding system is a parallel transmission system which generates Optical Transport Network (OTU) frames for the lanes, transmits externally input data to be transmitted to parallel transmission media, extracts the data to be transmitted from the OTU frames transmitted through the plurality of lanes, and externally output the extracted data to be transmitted,
the plurality of lanes are classified into a symbol lane and a parity lane,
for the symbol lane, the encoder stores divided data to be transmitted in an Optical Payload Unit/Optical Data Unit (OPU/ODU) payload and transmits an OTU frame conforming to ITU-T G.709, and, for the parity lane, the encoder designates symbols of the same row and the same column of each symbol lane as valid elements, stores a corresponding element of the transmission vector obtained through the encoding in a region other than Frame Alignment Signal (FAS) and forward error correction (FEC), stores values conforming to ITU-T G.709 in regions of the FAS and FEC, and performs transmission, and
for an OTU frame included in a symbol lane in which reception has been performed normally among the OTU frames transmitted through the plurality of lanes, the decoder extracts the data to be transmitted included in the OPU/ODU payload and externally outputs the extracted data to be transmitted, and, for a symbol lane in which abnormality is detected by detection of Loss-Of-Frame (LOF), detection of an error correction limit by the FEC, or error detection by Bit Interleaved Parity (BIP), the decoder restores the OPU/ODU payload included in the symbol lane in which the abnormality is detected through erasure correction, extracts the data to be transmitted, and externally outputs the extracted data to be transmitted.

14. The parallel data encoding/decoding system according to claim 13, wherein the symbol lane is identified by referring to a value of a Payload Structure Identifier (PSI) defined in ITU-T G.709.

15. The parallel data encoding/decoding system according to claim 13,
    wherein in relation to a region A of part of an Over Head (OH) region defined in ITU-T G.709 within each parity lane, the encoder stores a transmission vector corresponding to the region A in an OH region B within the same parity lane and stores a value conforming to ITU-T G.709 in the region A, and
    the decoder uses information of the OH region B in each parity lane for restoration of the region A when restoring the OPU/ODU payload included in the symbol lane in which the abnormality is detected.

16. The parallel data encoding/decoding system according to claim 15,
    wherein the region A includes at least a Multi-Frame Alignment Signal (MFAS) and a Payload Structure Identifier (PSI) defined in ITU-T G.709,
    the encoder transmits information of positions of the region A and the OH region B in a frame through multi-frame transfer using the MFAS, and
    the decoder uses the information of the positions in the frame when the OPU/ODU payload included in the symbol lane in which the abnormality is detected is restored.

17. The parallel data encoding/decoding system according to claim 9, further comprising:
    a packet input unit which divides a packet to be transmitted into portions each having a predetermined length or divides the packet to be transmitted into time slots for every fixed time, further distributes/divides the packet to be transmitted within the same time slot into systems equal in number to parallel inputs of the encoder, and inputs distributed/divided packets to the encoder;
    an encoded packet output unit which performs encapsulation on an output of the encoder so that a lane and a time slot are identified and separated for each logical lane and outputs an encapsulated packet to one or more transmission media;
    an encoded packet input unit which separates the encapsulated packet transmitted through the transmission media for each logical lane based on encapsulation information, aligns the separated encapsulated packet for each time slot in each lane, and inputs the separated/aligned encapsulated packet to the decoder; and
    a packet output unit which reconfigures the packet to be transmitted from an output of the decoder and outputs the packet to be transmitted.

18. The parallel data encoding/decoding system according to claim 17, wherein the packet input unit optimizes distribution of the packet input to the encoder so as to maximize the number of logical lanes on which there is no packet.

19. The parallel data encoding/decoding system according to claim 17, wherein, if a packet length of the packet to be transmitted is greater than a data length of one time slot, the packet input unit divides the packet to be transmitted into packets each having a length less than or equal to the data length of the one time slot, and distributes the divided packets to the plurality of lanes.

20. The parallel data encoding/decoding system according to claim 17,
    wherein the packet input unit allocates the packet to another time slot different from a time slot in which the packet is to be allocated so that the number of lanes in which there is no packet is at least minimum redundancy rmin, and
    the encoded packet output unit limits the number of redundant packets among packets output from the encoder to at most maximum redundancy rmax.

* * * * *